(12) United States Patent
Nakagawa

(10) Patent No.: US 7,235,476 B2
(45) Date of Patent: Jun. 26, 2007

(54) SEMICONDUCTOR DEVICE AND MANUFACTURING METHOD OF THE SAME

(75) Inventor: Shinichi Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 233 days.

(21) Appl. No.: 11/061,900

(22) Filed: Feb. 22, 2005

(65) Prior Publication Data
US 2006/0099798 A1    May 11, 2006

(30) Foreign Application Priority Data
Nov. 8, 2004    (JP)    ............................. 2004-323414

(51) Int. Cl.
*H01L 21/4763*    (2006.01)
*H01L 21/336*    (2006.01)
*H01L 21/3205*    (2006.01)
*H01L 21/44*    (2006.01)

(52) U.S. Cl. ...................... 438/622; 438/257; 438/614; 438/593

(58) Field of Classification Search ................ 438/622, 438/614, 593, 605, 257, 625
See application file for complete search history.

(56) References Cited

U.S. PATENT DOCUMENTS 6,133,096 A    10/2000    Hung-Der-Su et al.

2006/0099798 A1 *    5/2006    Nakagawa .................. 438/622

FOREIGN PATENT DOCUMENTS

JP    6-97457    4/1994

OTHER PUBLICATIONS

Office Action dated May 24, 2006 issued in corresponding Korean Application No. 10-2005-0018550.

* cited by examiner

*Primary Examiner*—Chuong Anh Luu
(74) *Attorney, Agent, or Firm*—Westerman, Hattori, Daniels & Adrian, LLP.

(57) ABSTRACT

Disclosed is a method of manufacturing a semiconductor device, including the steps of: forming on a second insulating film a first resist pattern having a first window; employing the first resist pattern as an etching mask to form first openings exposed from contact regions CR; forming, on a second conductive film, a second resist pattern having first resist portions; employing the second resist pattern as an etching mask to form first and second conductors, a floating gate and a control gate; forming a third resist pattern in regions I, II and III; and employing the third resist pattern as an etching mask to remove the portions of the second conductors under second windows.

12 Claims, 98 Drawing Sheets

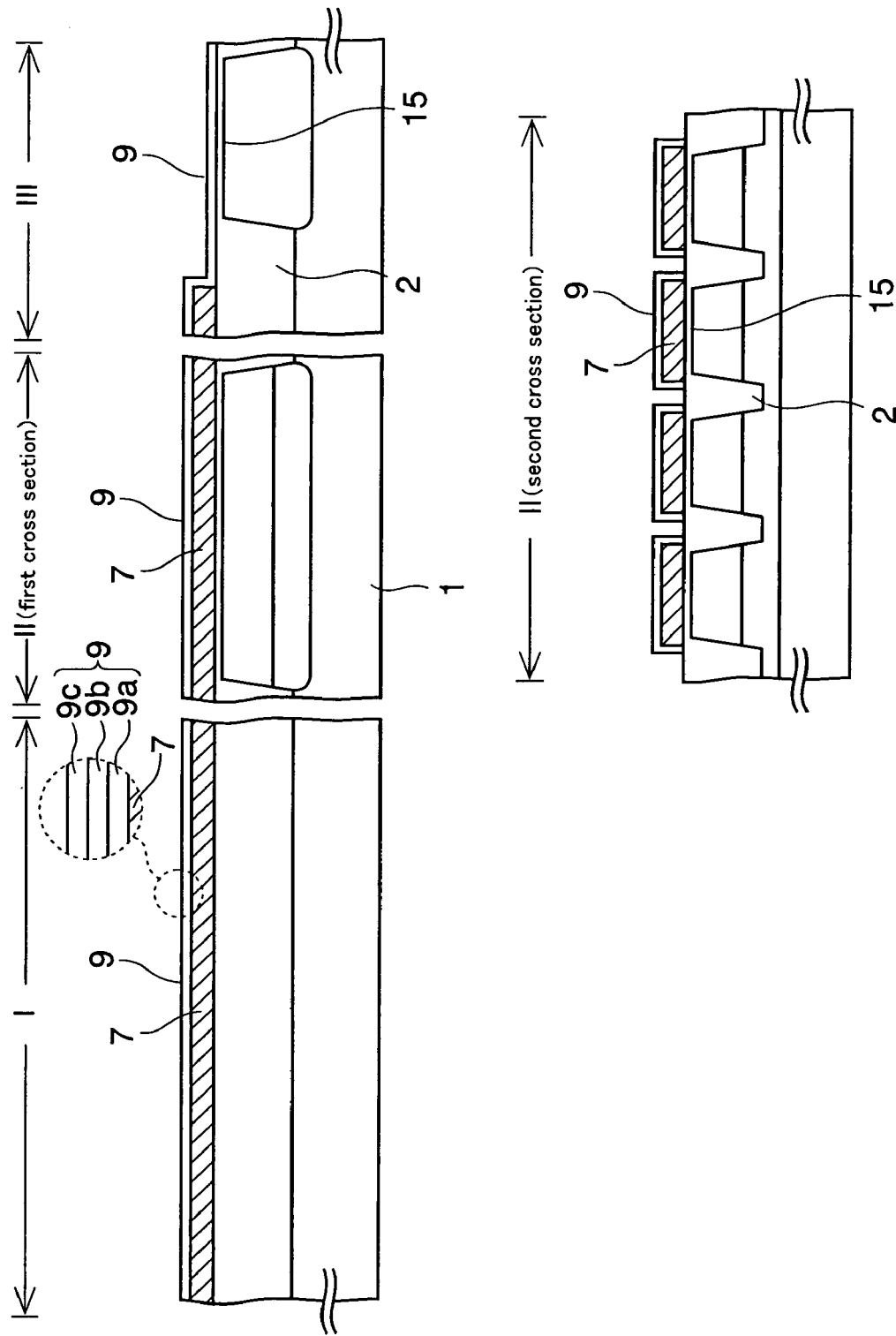

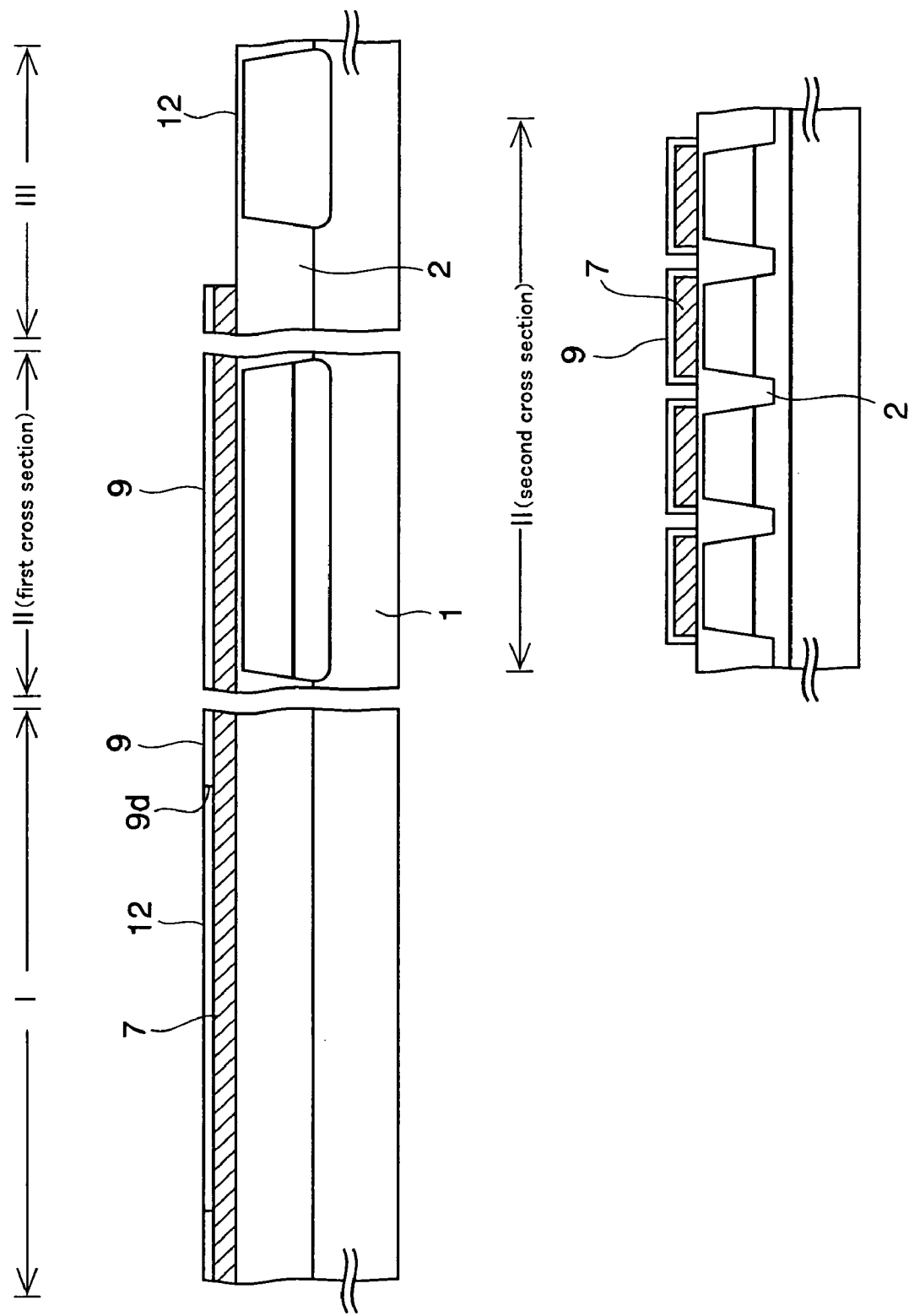

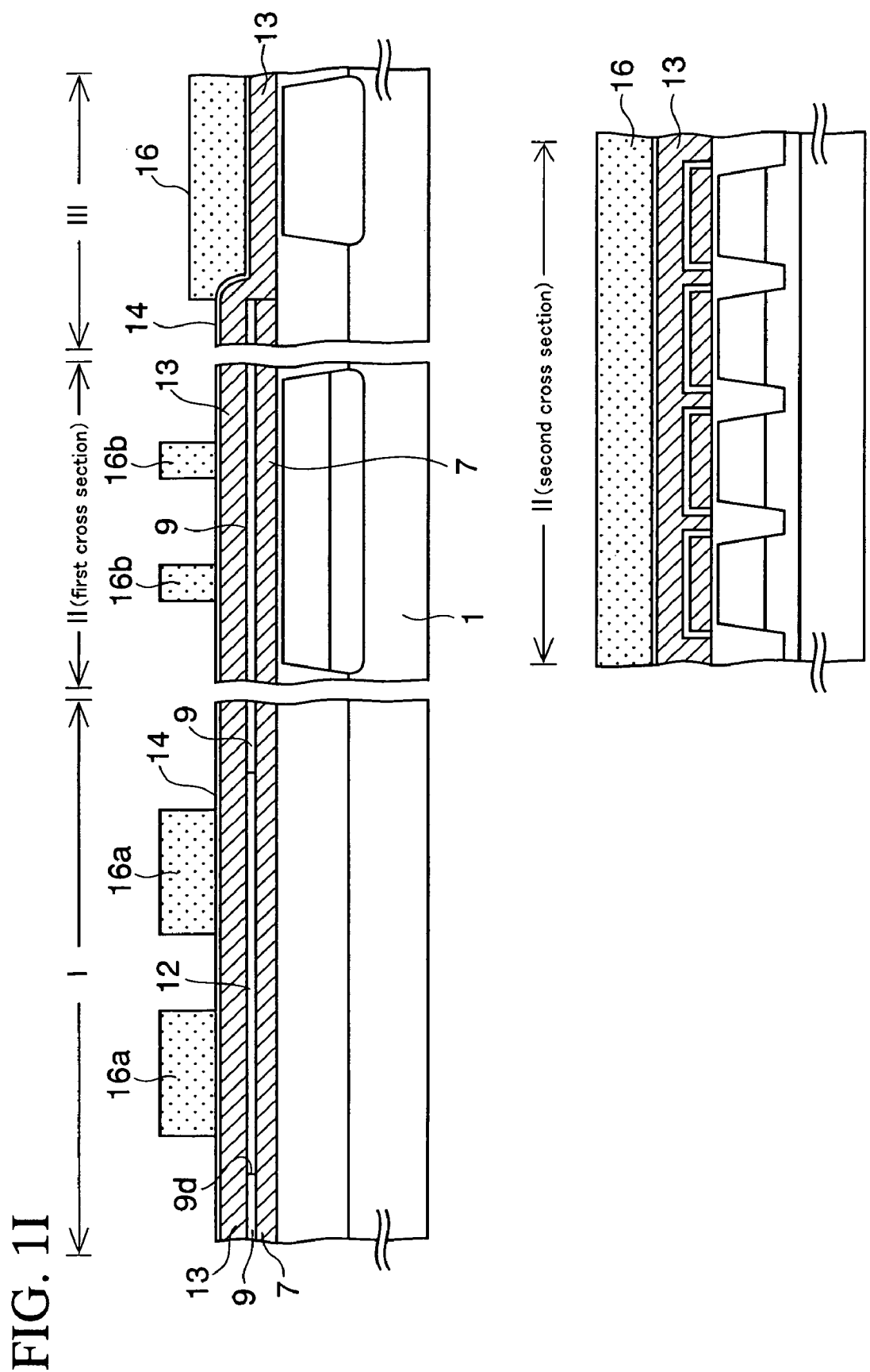

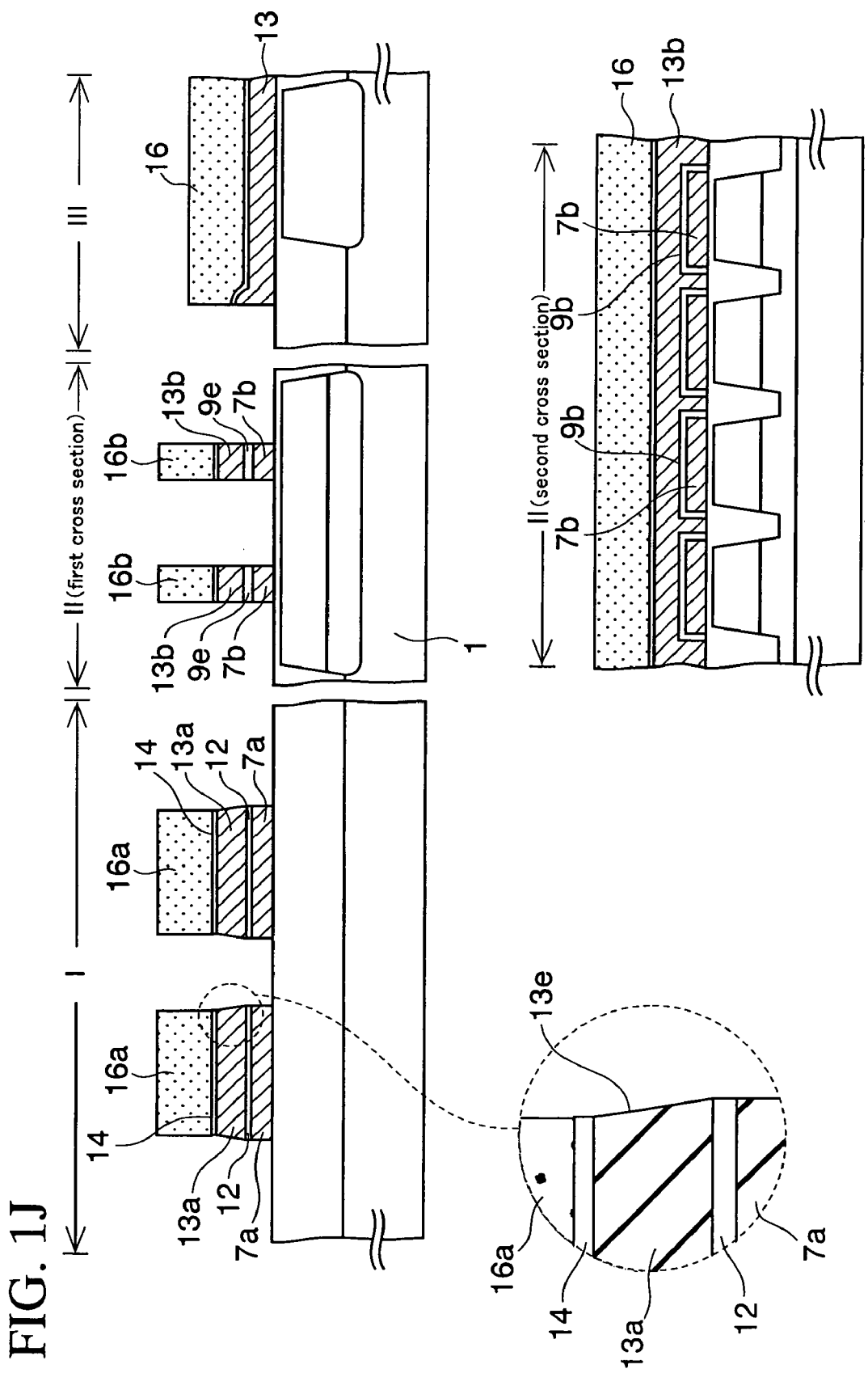

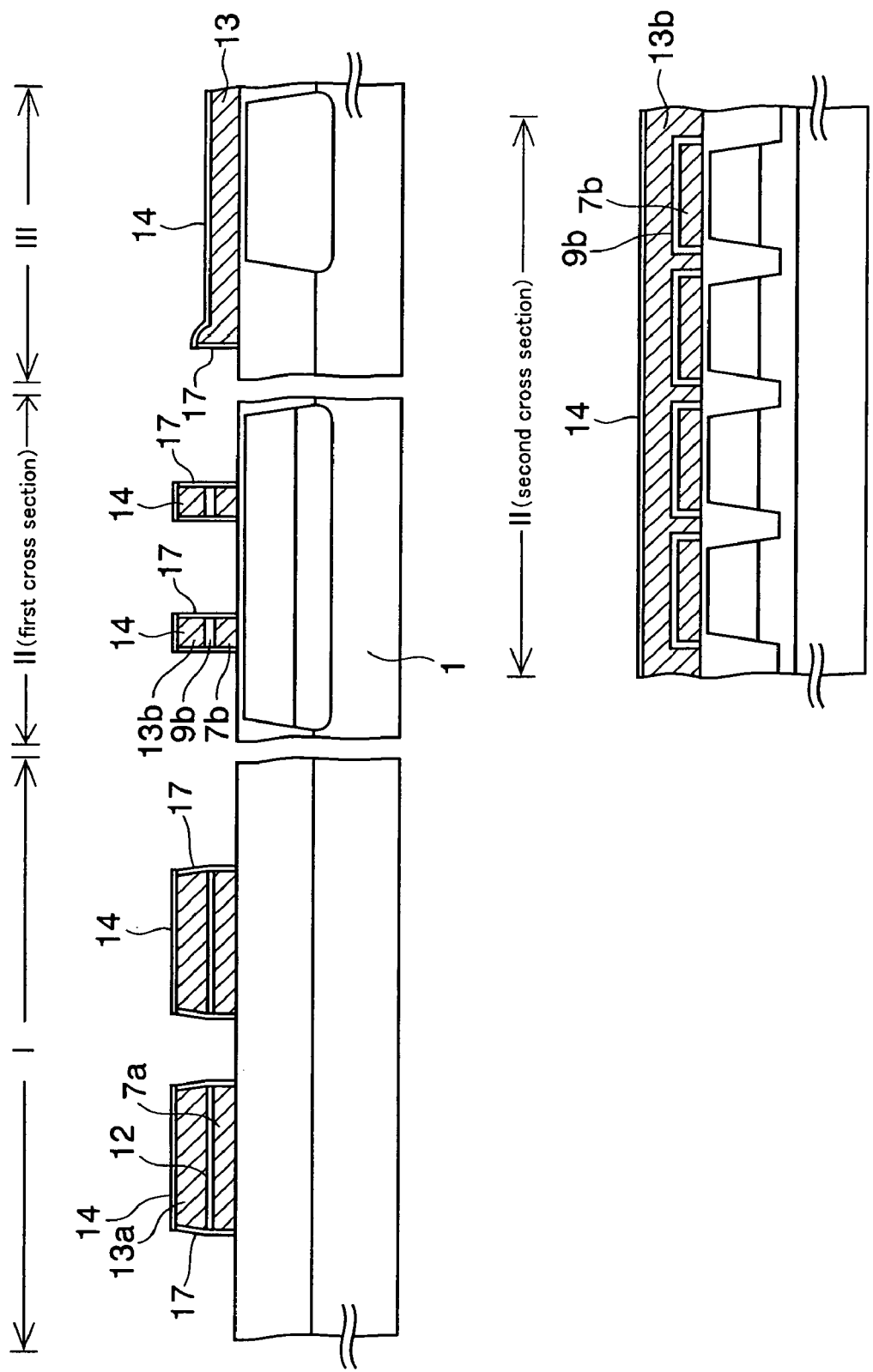

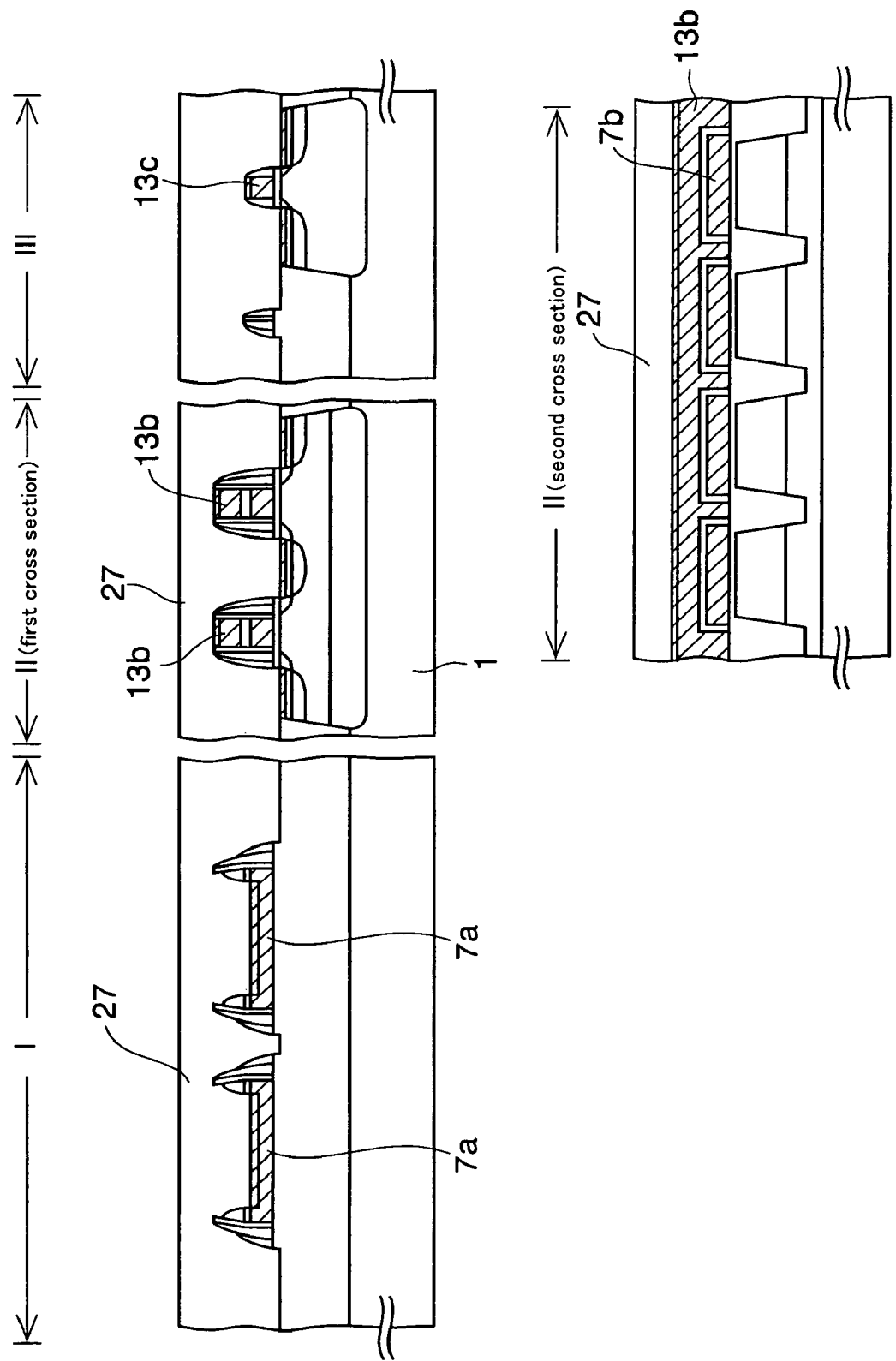

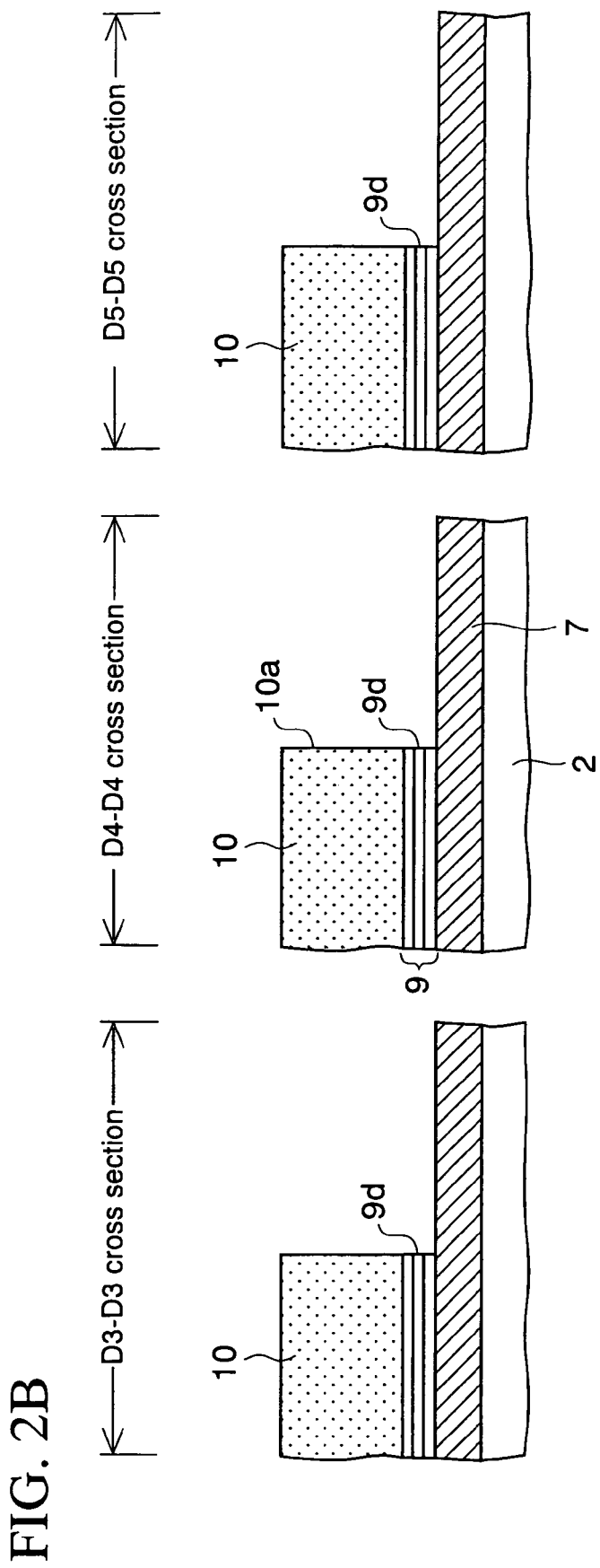

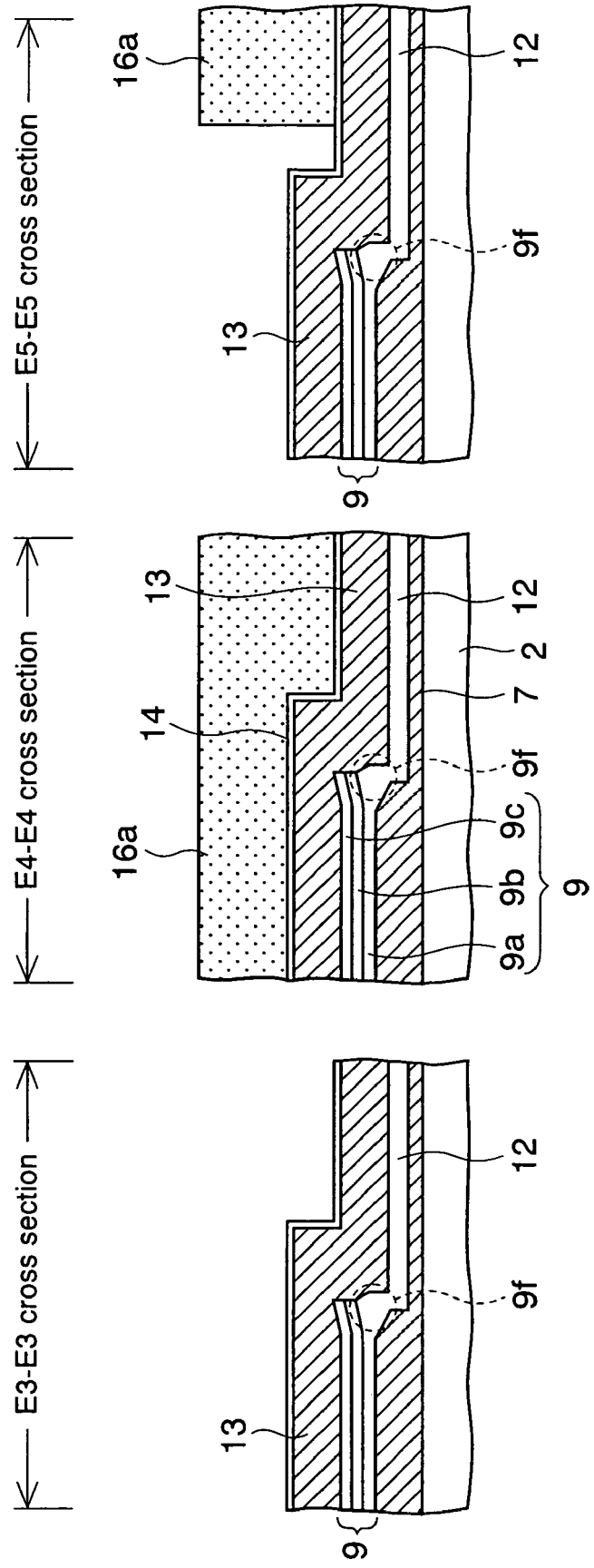

|← I3-I3 cross section →|

|← J3-J3 cross section →|

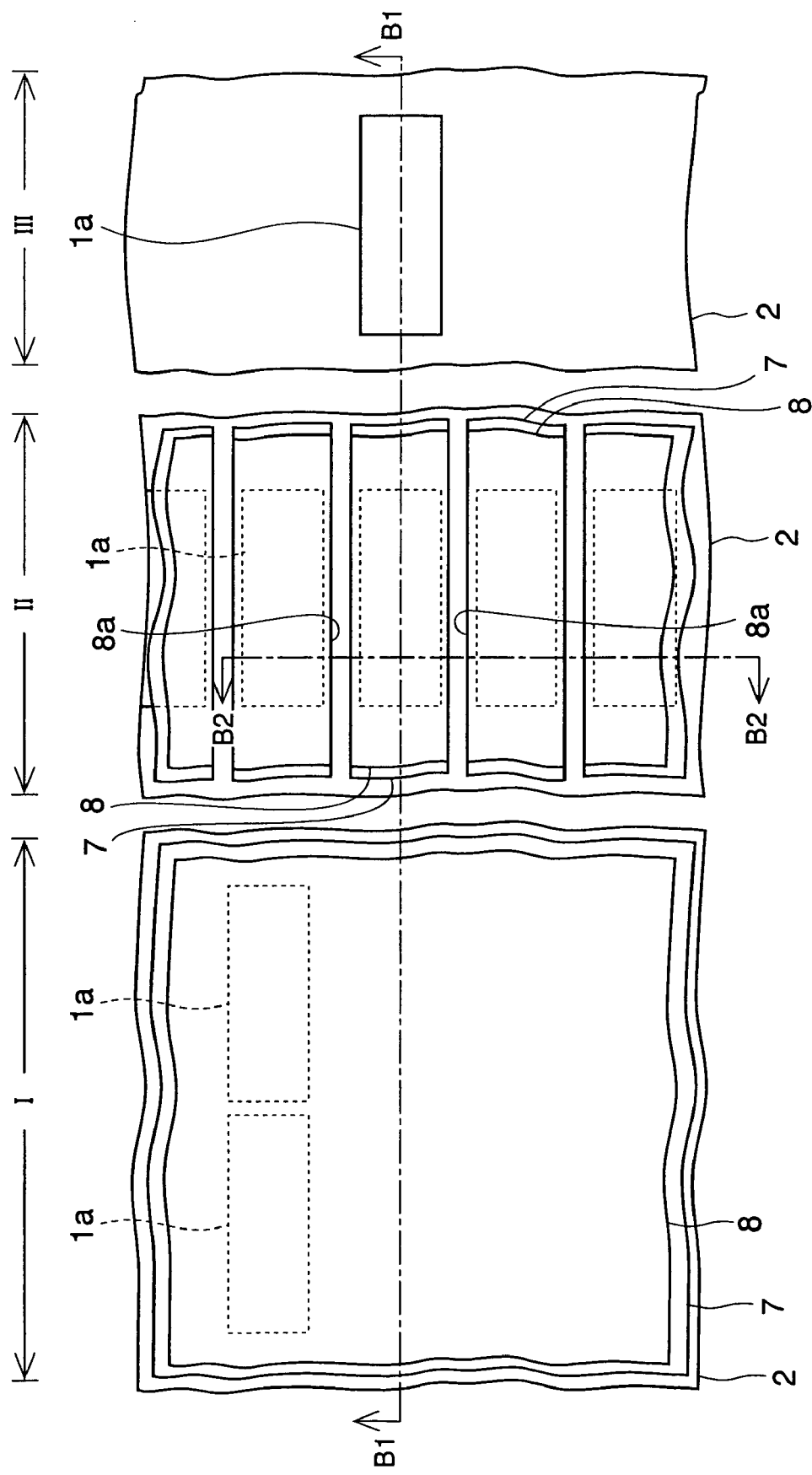

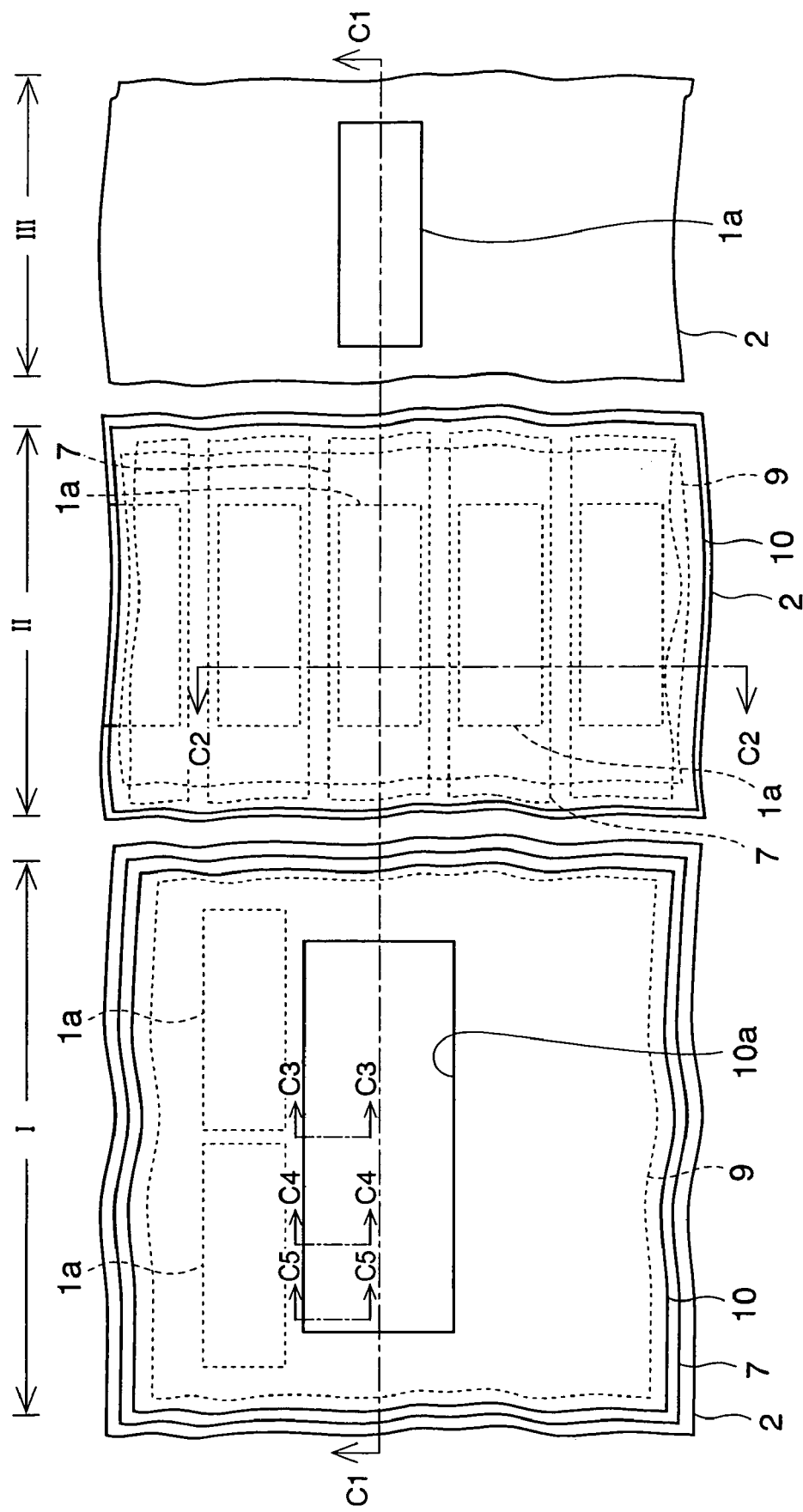

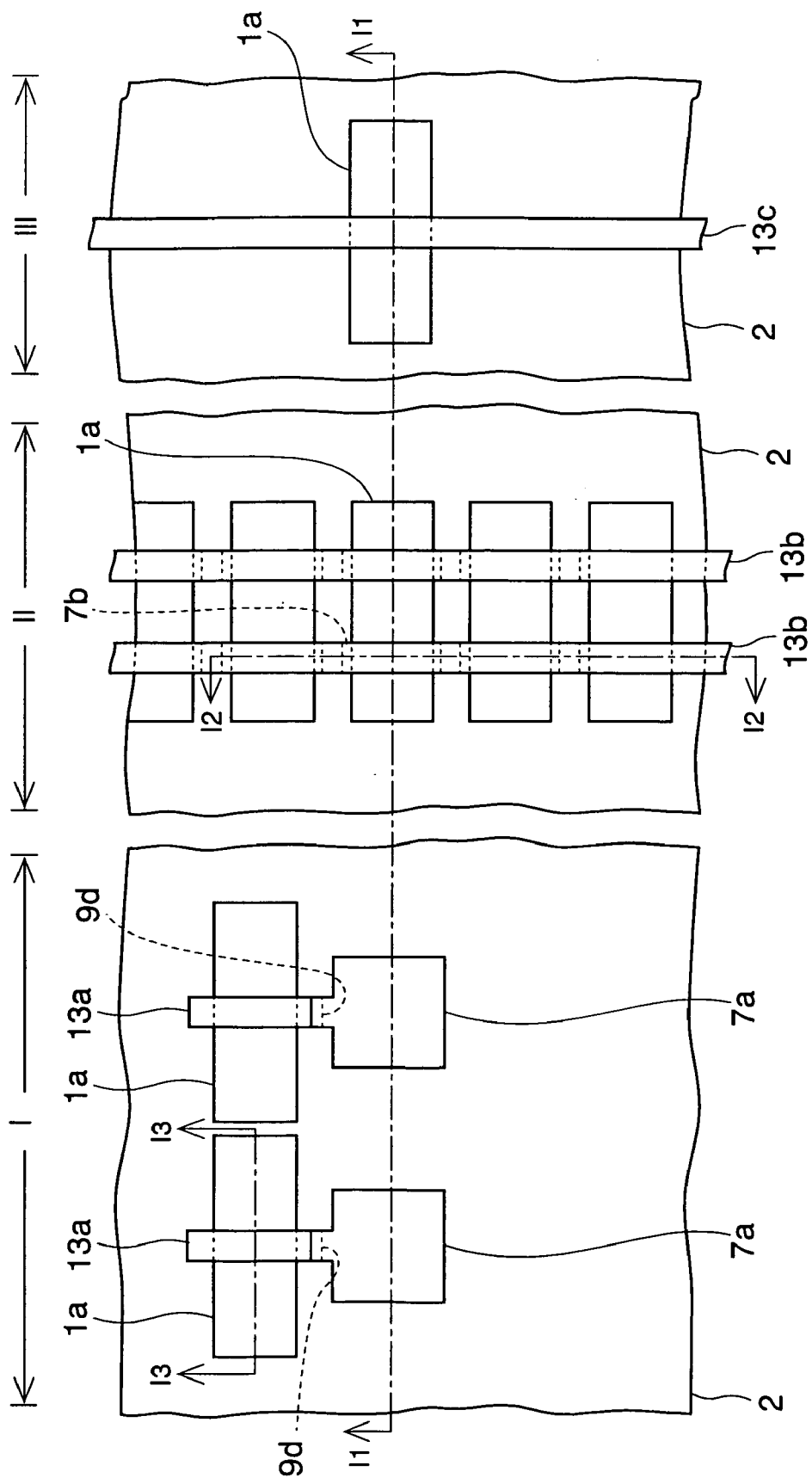

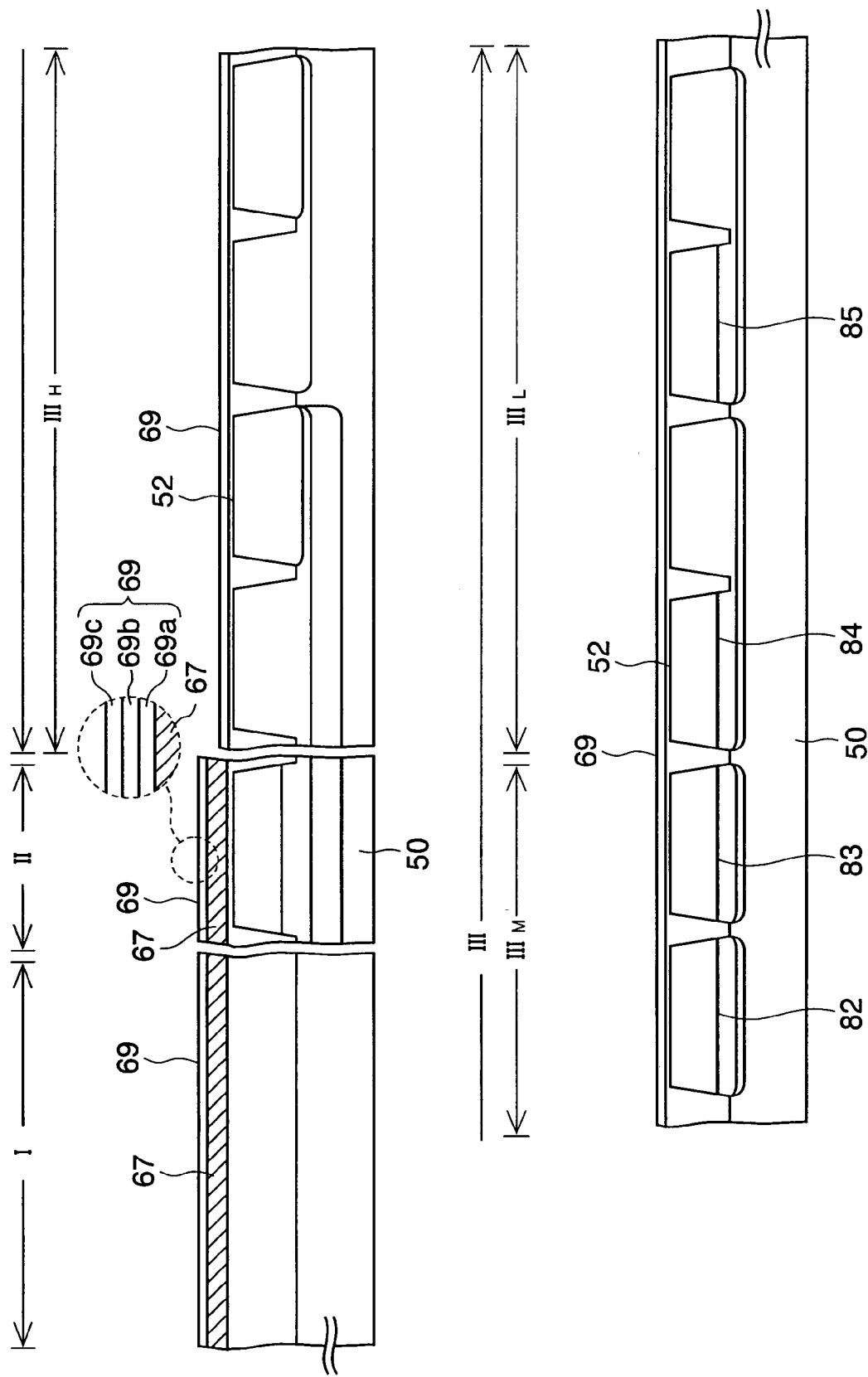

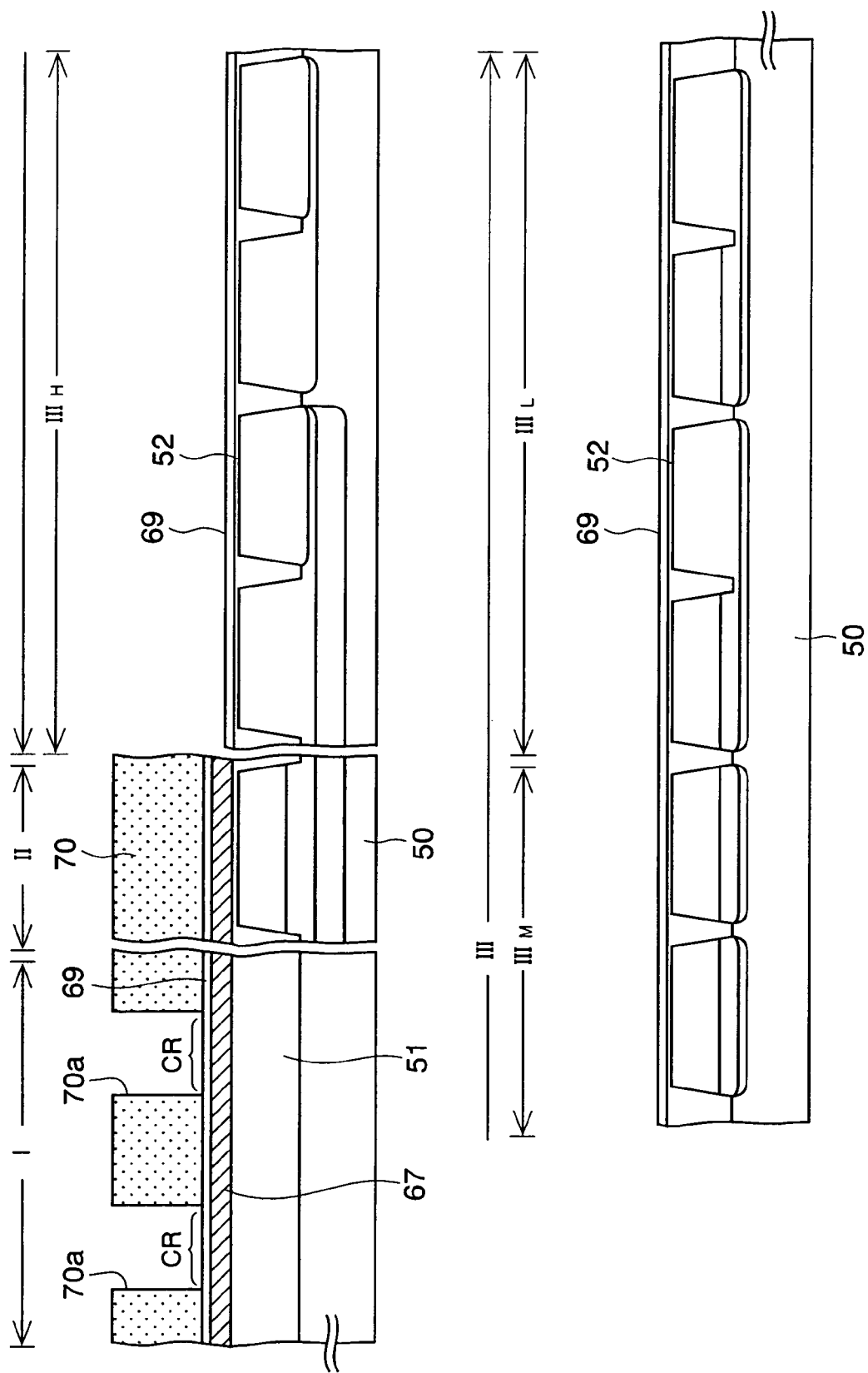

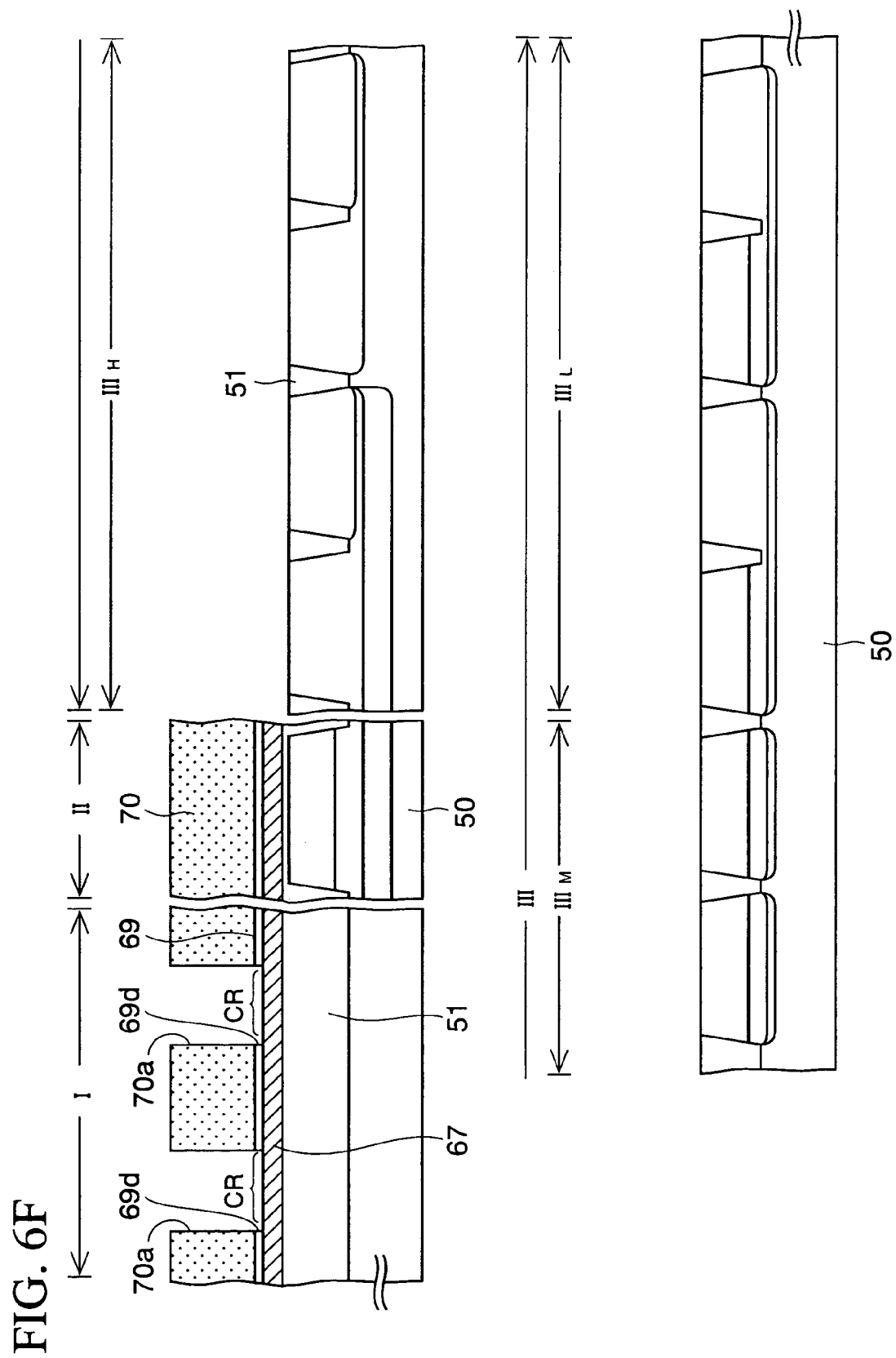

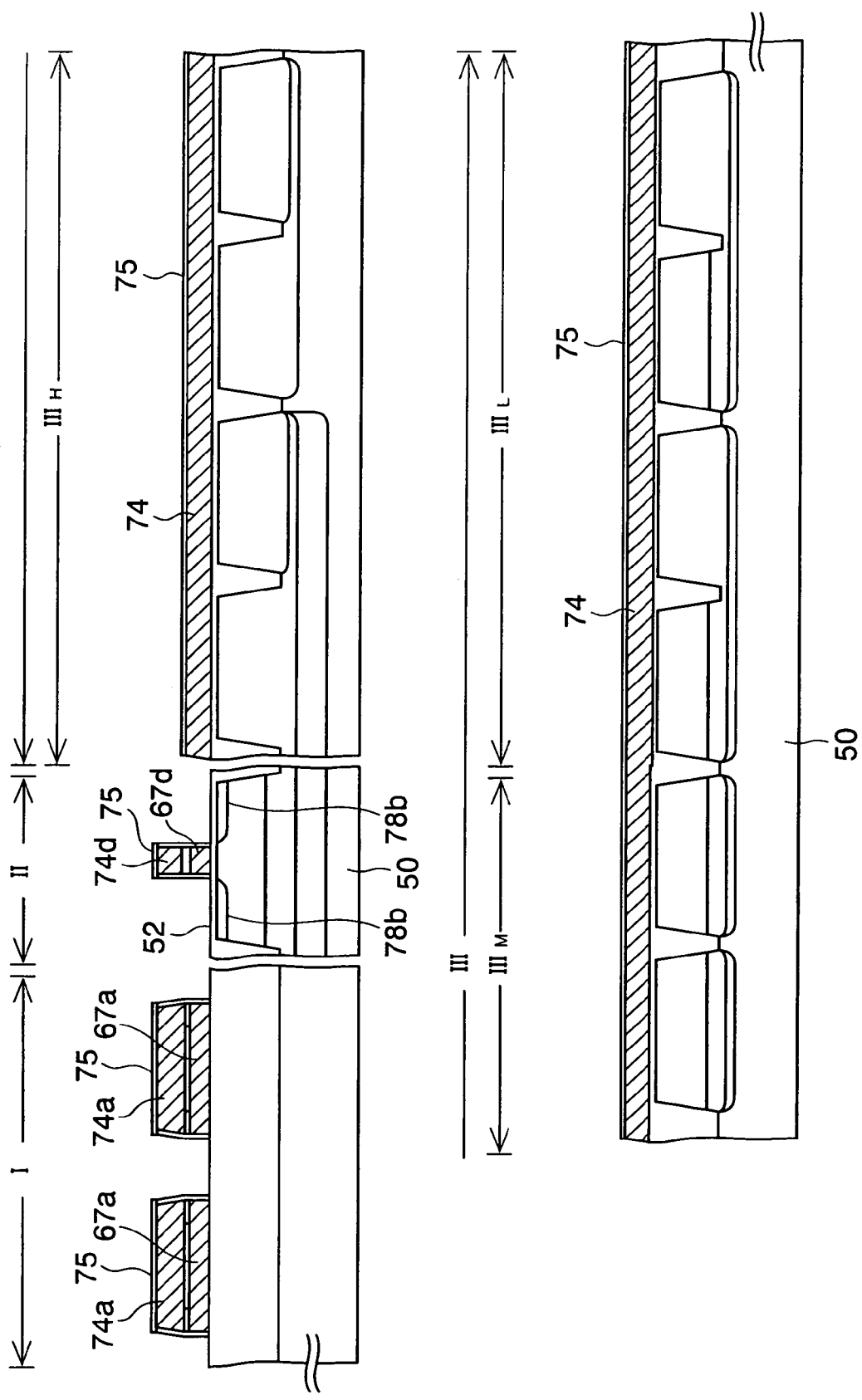

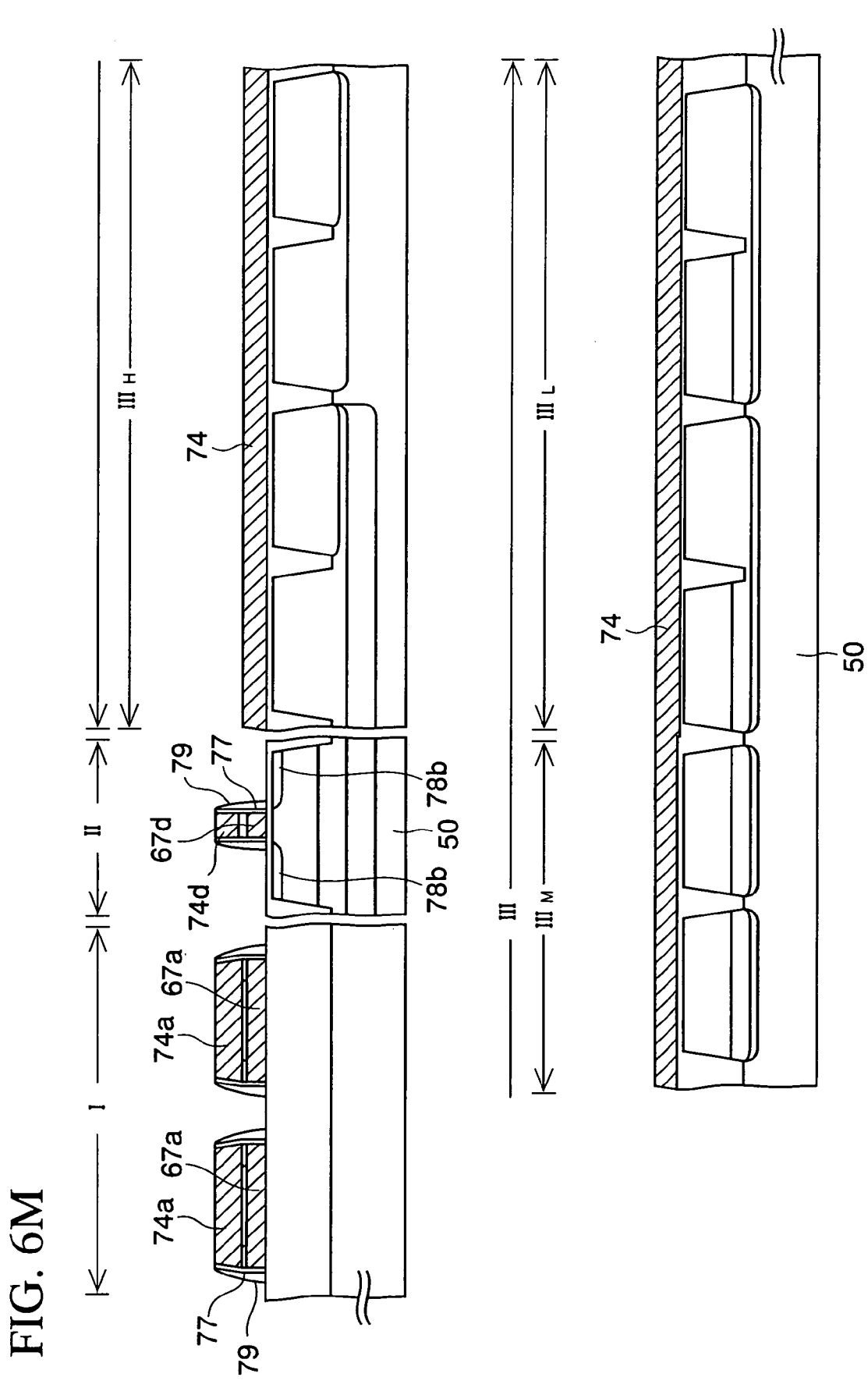

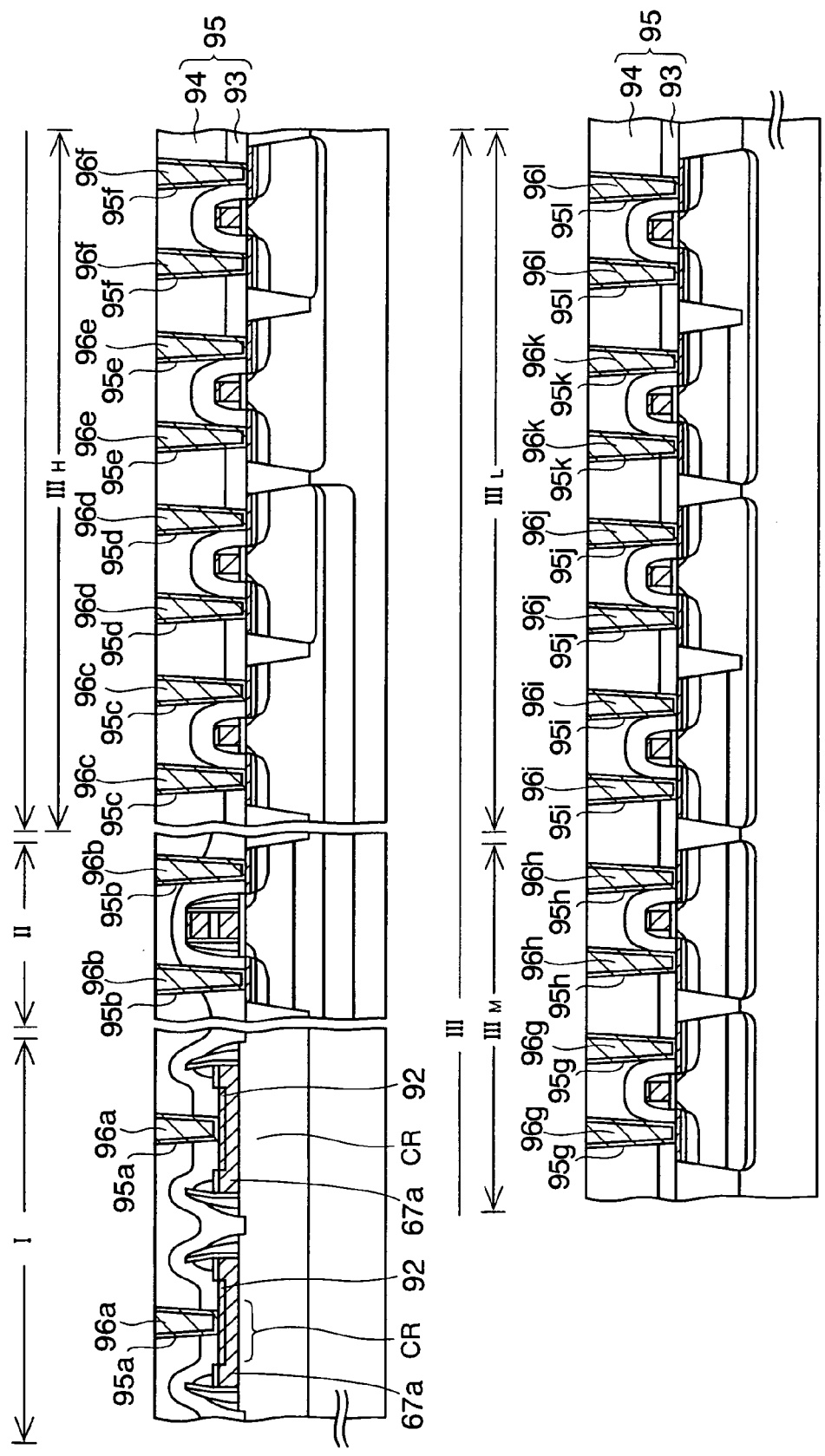

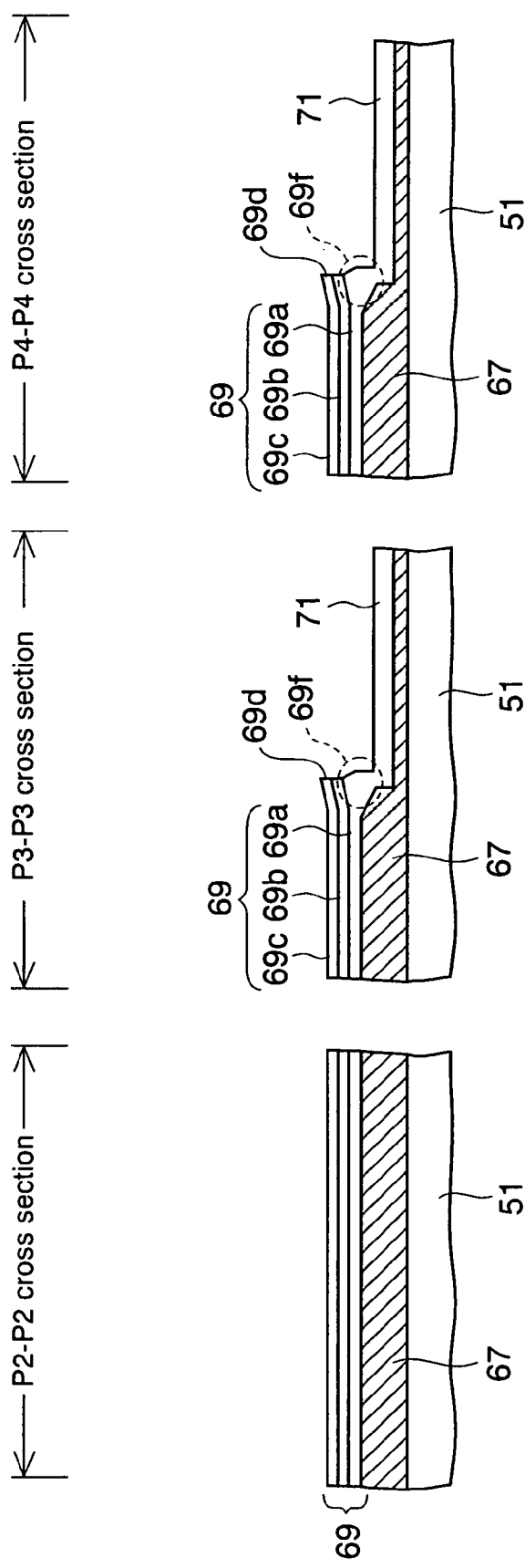

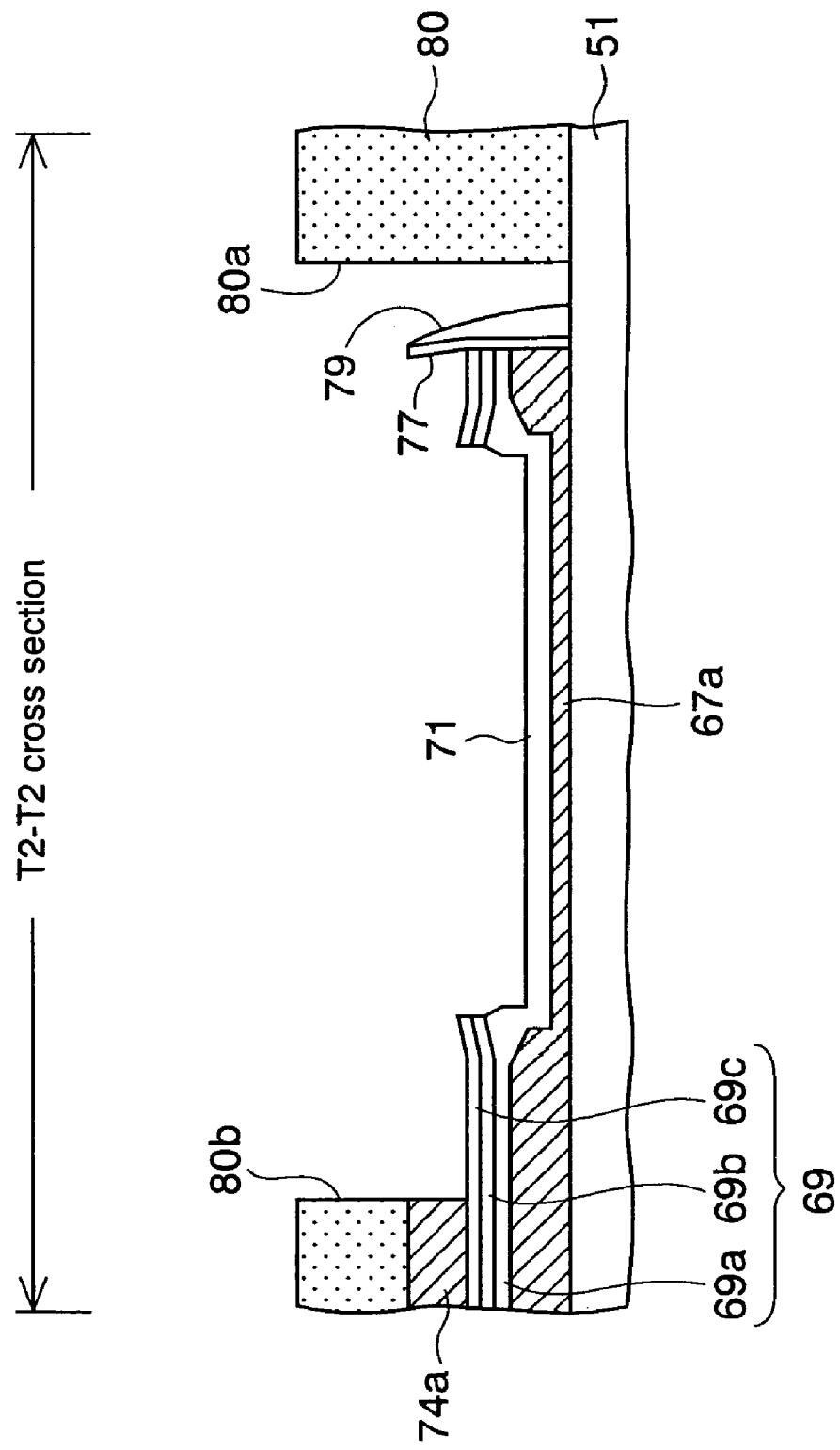

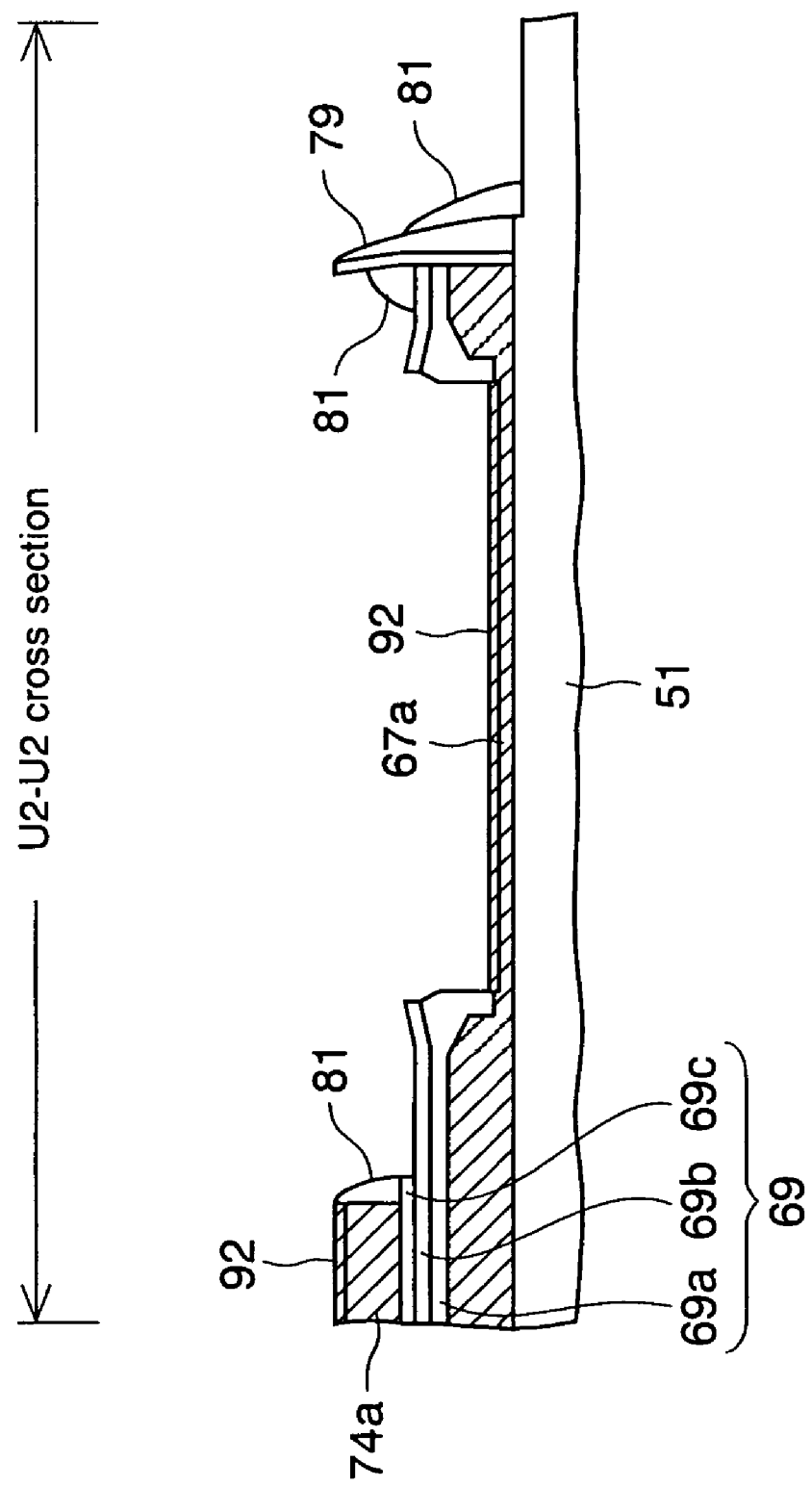

|←V3-V3 cross section→|

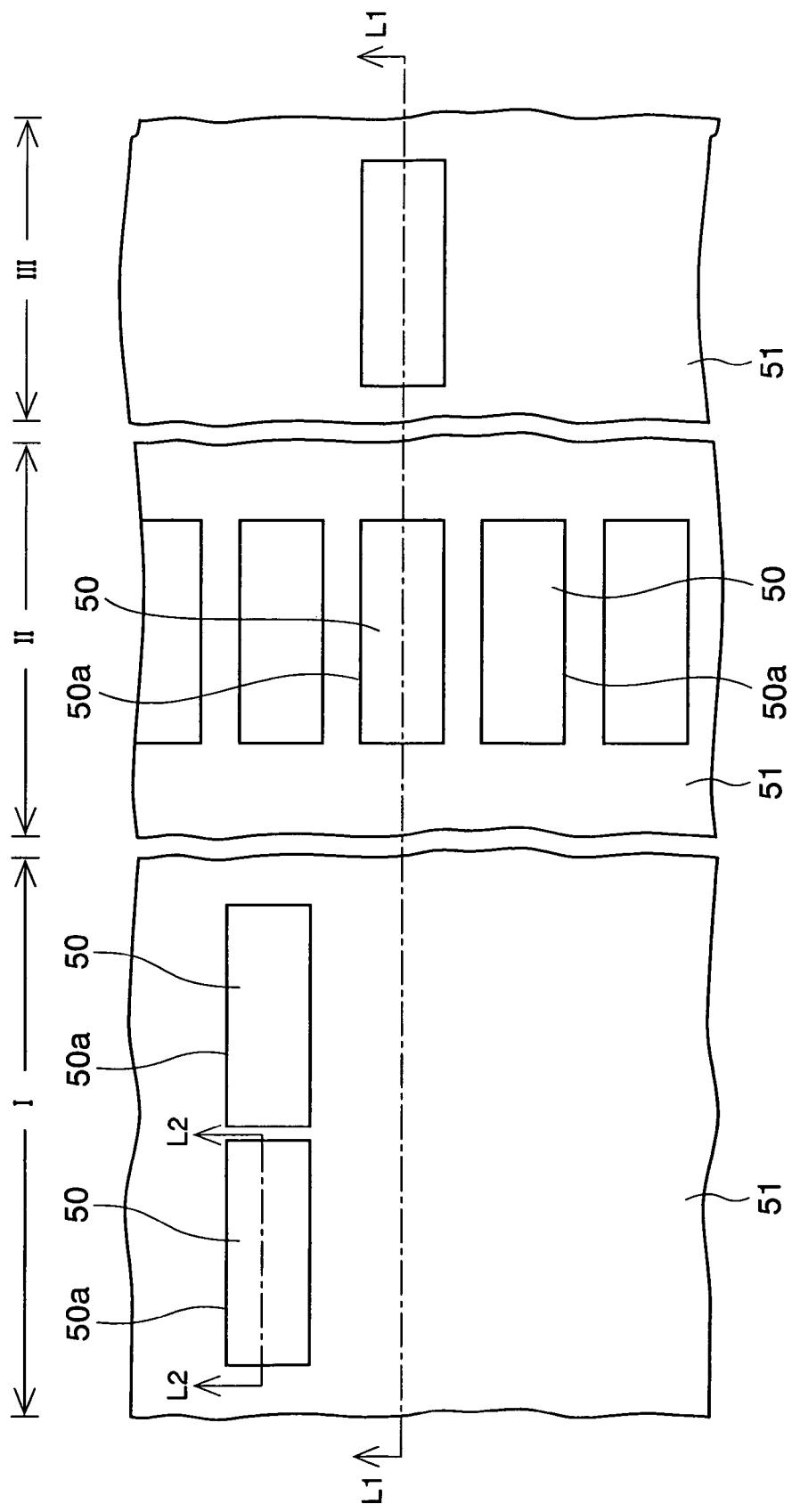

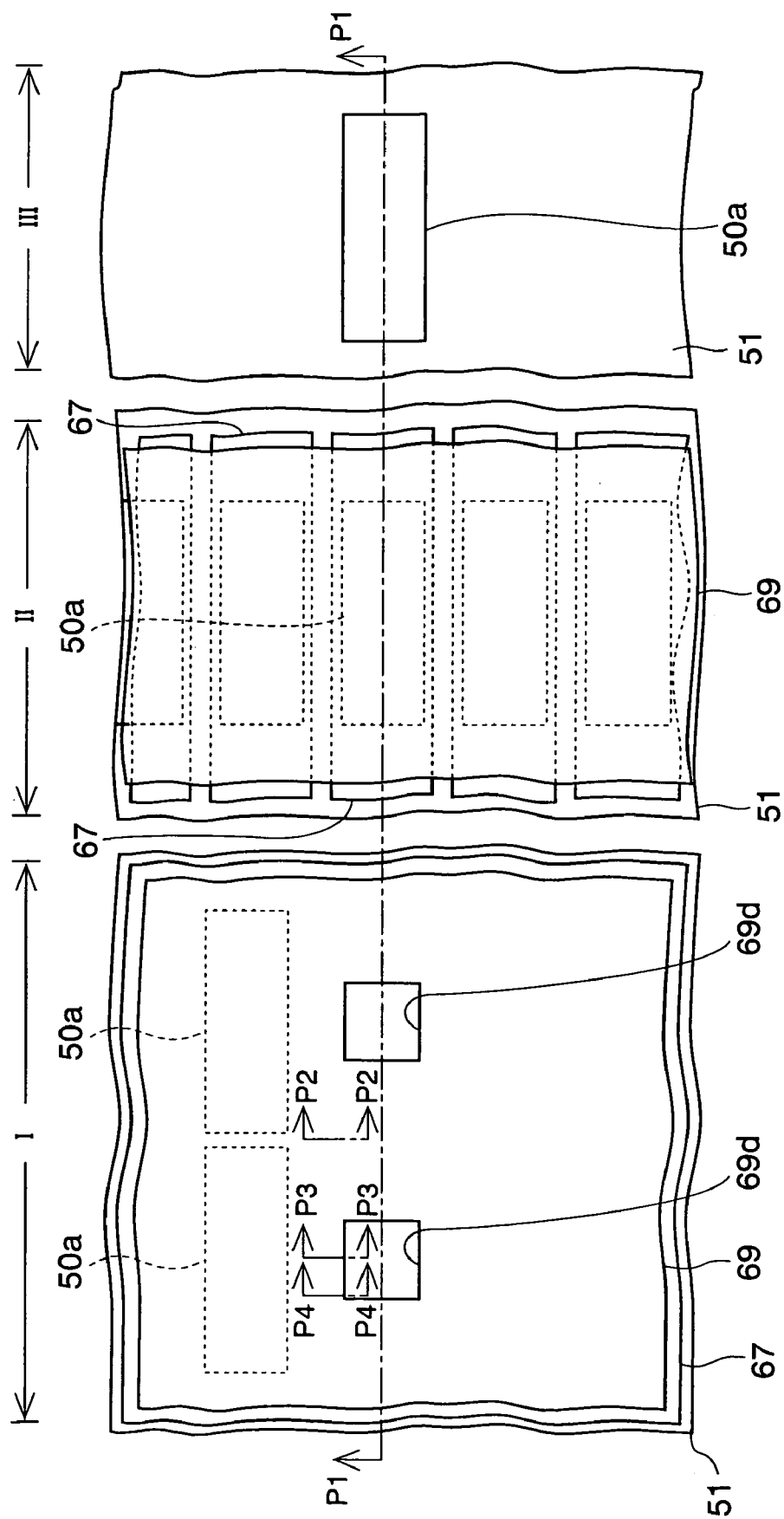

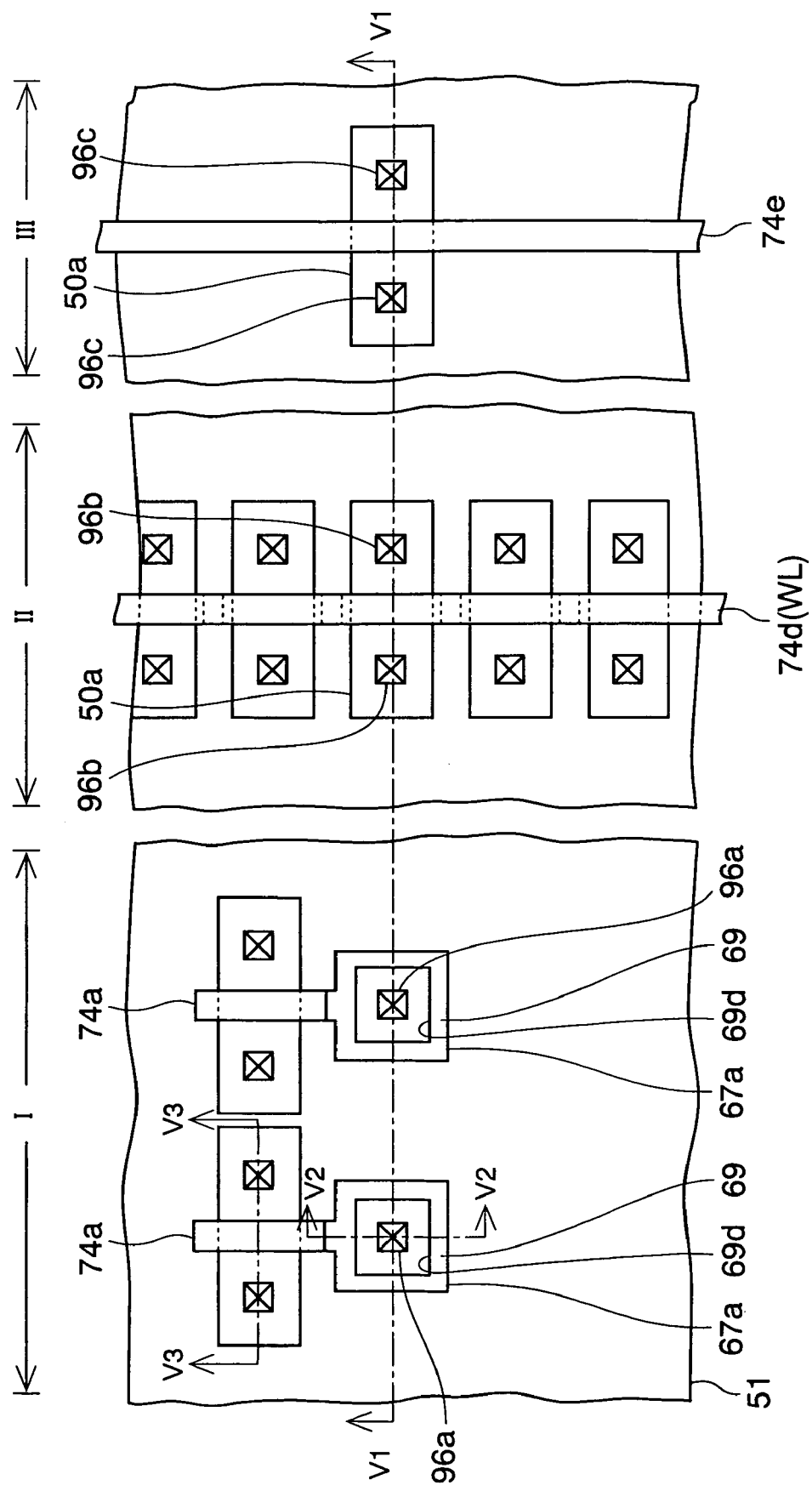

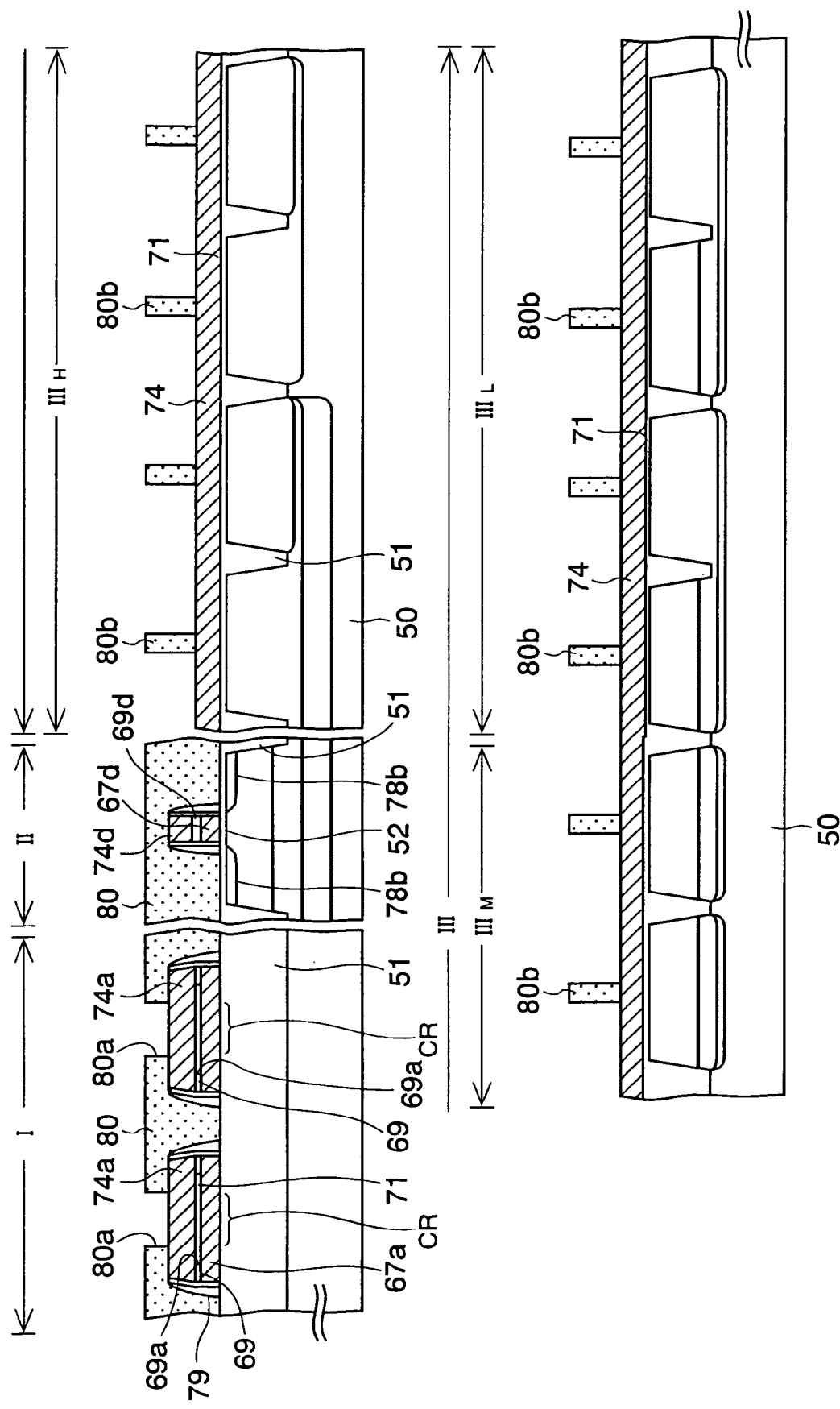

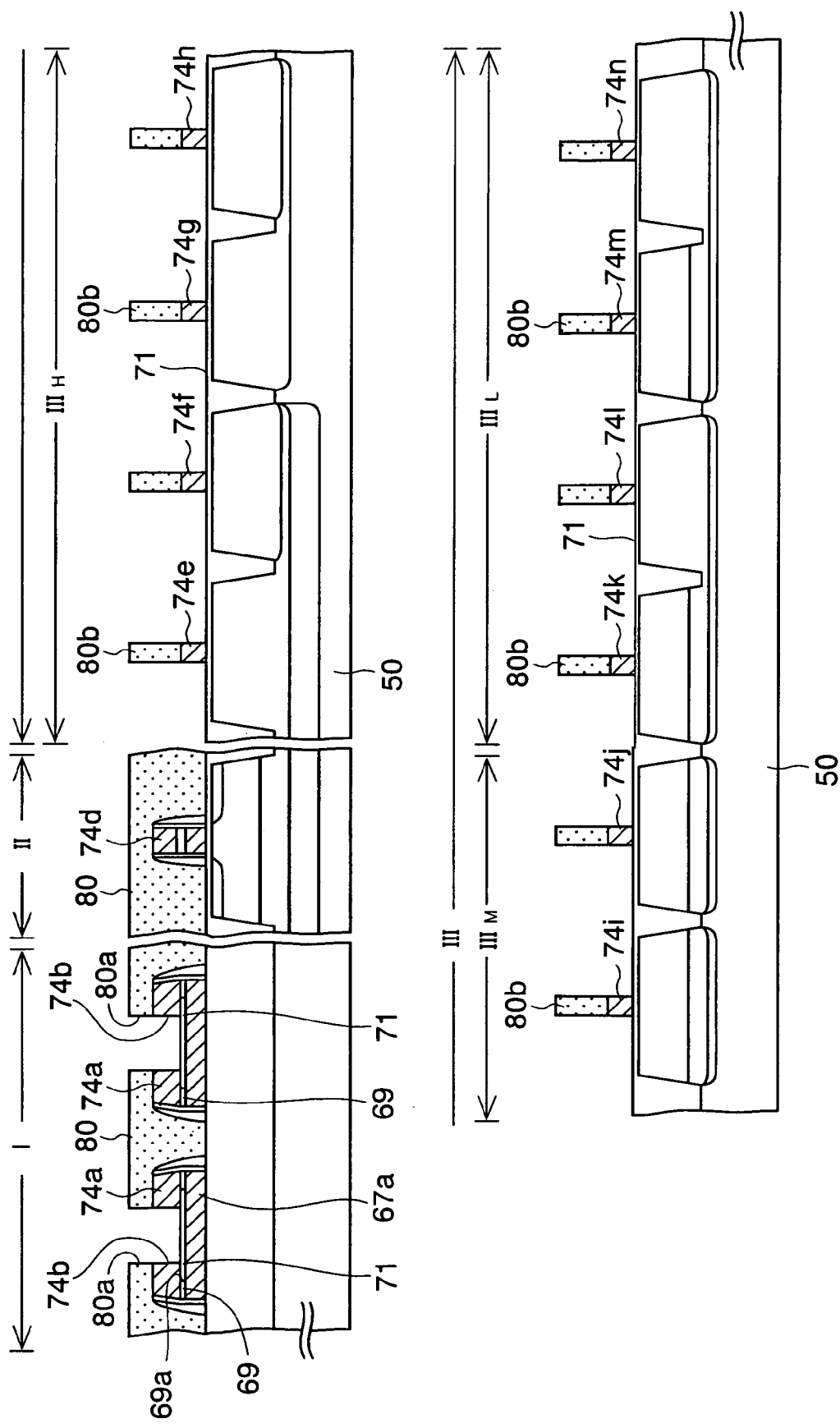

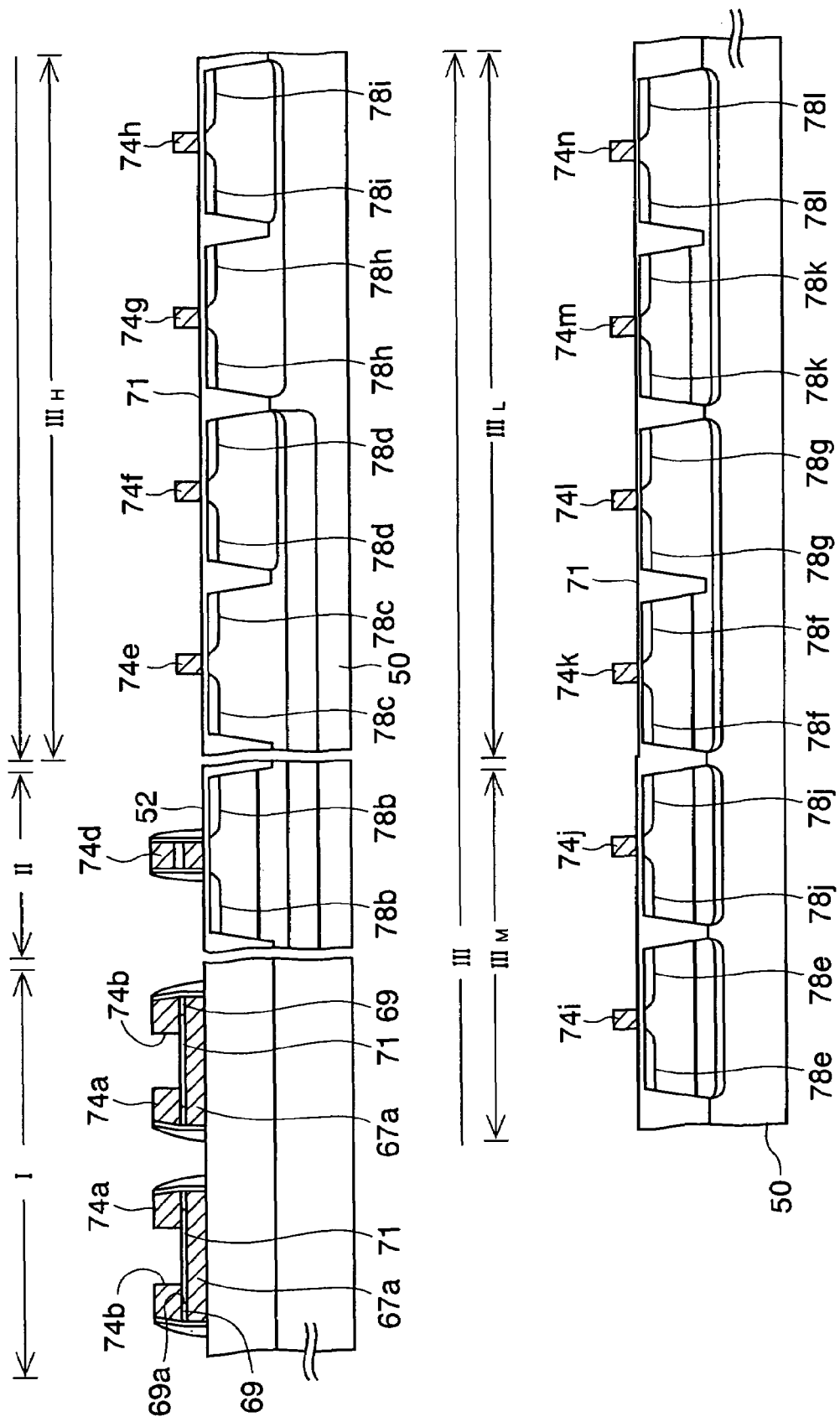

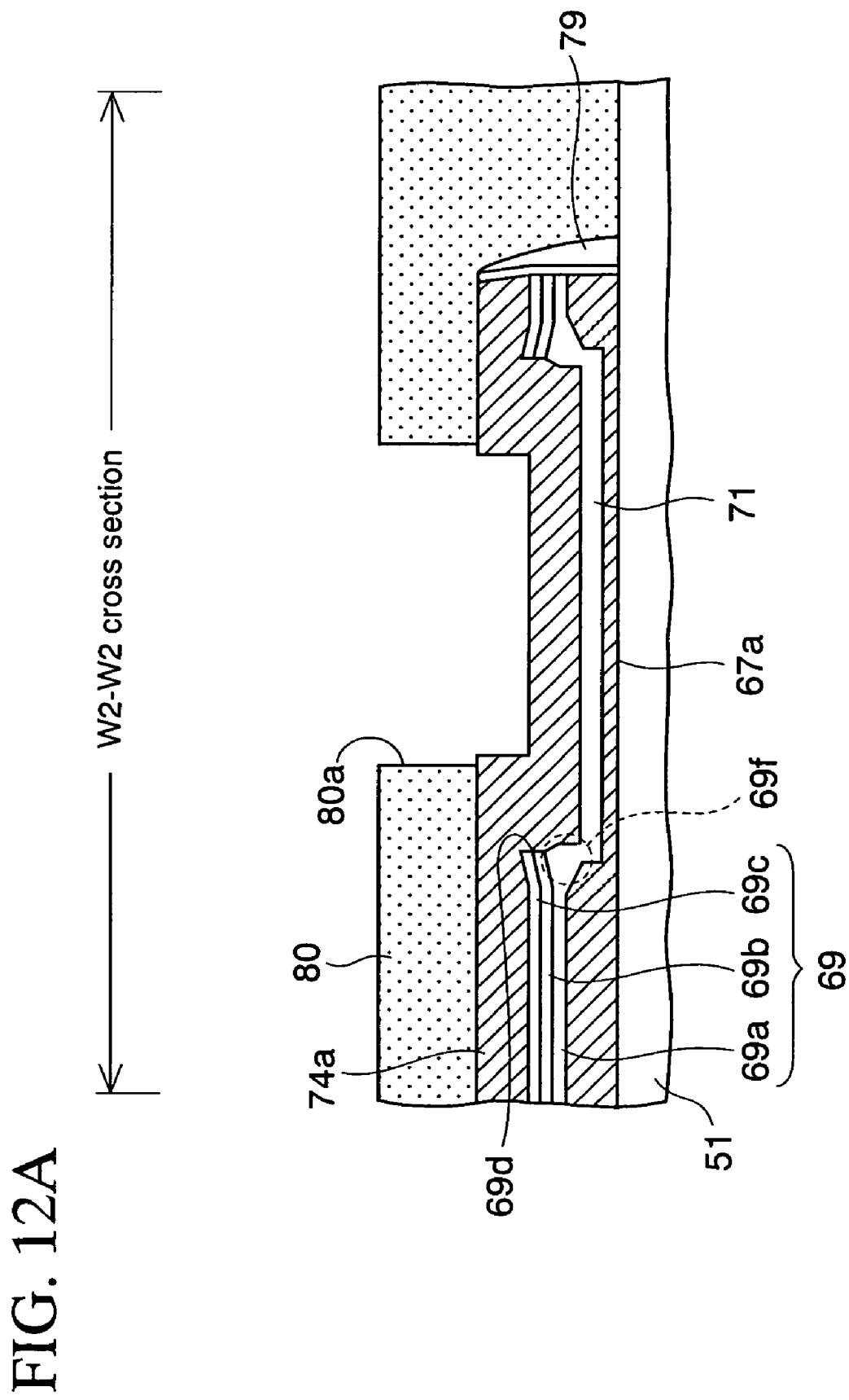

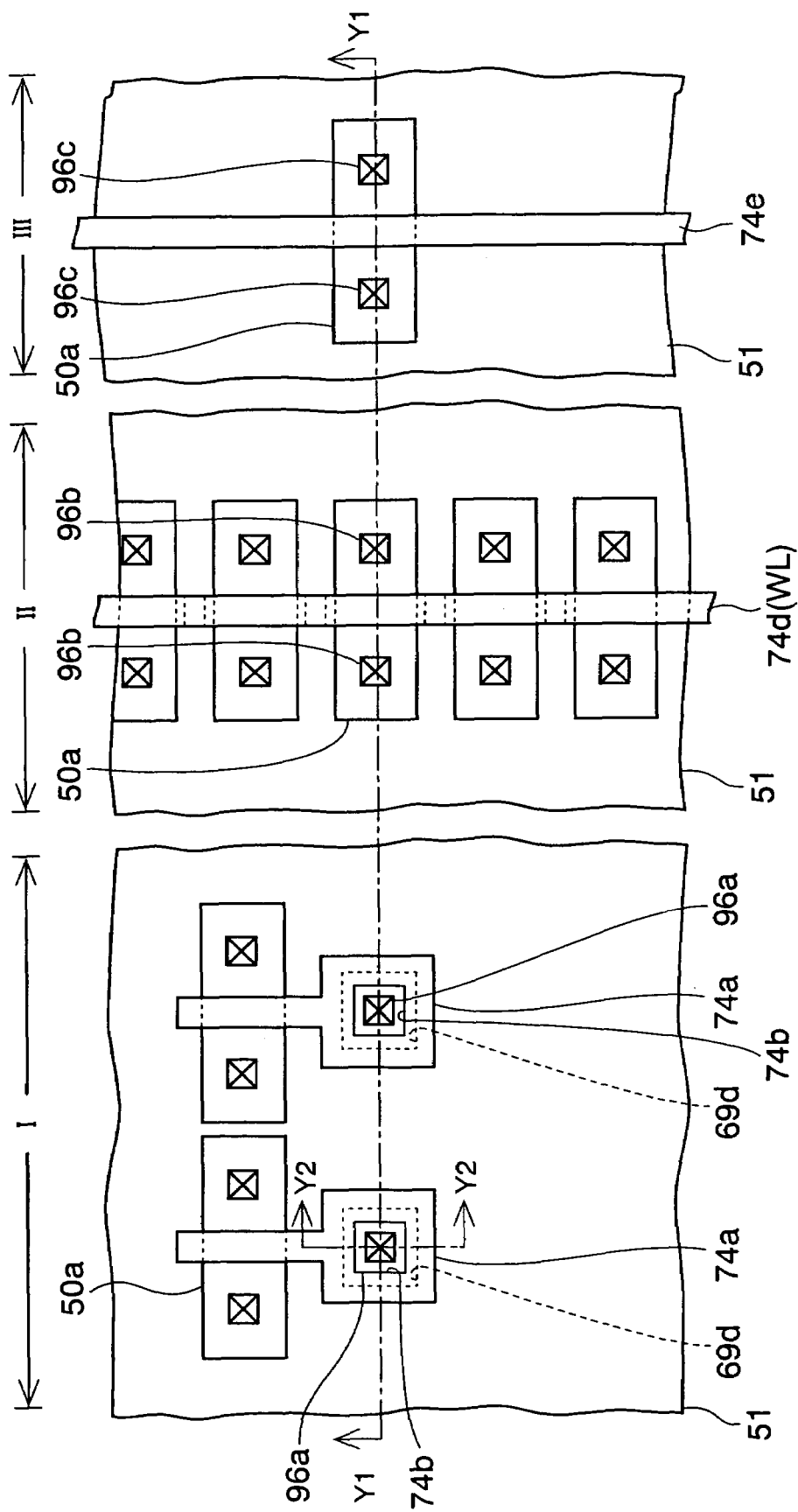

SEMICONDUCTOR DEVICE AND MANUFACTURING METHOD OF THE SAME

CROSS-REFERENCE TO RELATED APPLICATIONS

This application is based on and claims priority of Japanese Patent Application No. 2004-323414 filed on Nov. 8, 2004, the entire contents of which are incorporated herein by reference.

BACKGROUND OF THE INVENTION

1. Field of the Invention

The present invention relates to a semiconductor device and a manufacturing method of the same 2. Description of the Related Art A flash memory in which data can be maintained even when power is turned off is employed not only for mobile devices, such as cellular phones, but also for FPGAs (Field Programmable Gate Arrays) by embedding it in logic circuits. Especially when a flash memory is embedded in a logic circuit and is employed as in an FPGA, manufacturing processes for the memory cell and for the logic circuit must be compatible to prevent defects in a logic embedded memory which is to be shipped as a product.

In some cases, before the logic embedded memory is shipped as a product or at the time it is actually used, the breakdown voltage of a tunnel insulating film constituting the flash memory is monitored. A tunnel insulating film, however, is formed under a floating gate. Thus, in order to monitor the breakdown voltage by applying a voltage from above and below the tunnel insulating film, a conductive plug should be brought directly into contact with the floating gate without contacting a control gate, and a test voltage should be applied between the conductive plug and a semiconductor substrate.

Therefore, for the above described logic embedded memory, it is important how the process for forming a conductive plug, which contacts the floating gate, is combined with the process for manufacturing a peripheral logic circuit.

According to a technique disclosed in patent document 1, a floating gate and a control gate are electrically connected at an area provided in a peripheral circuit region, and the laminated structure of each gate is employed as a single gate electrode in this peripheral circuit region.

(Patent Document) Japanese Patent Laid-Open Publication No. Hei 6-97457

SUMMARY OF THE INVENTION

According to one aspect of the present invention, there is provided a semiconductor device comprising: a semiconductor substrate; a first conductor, formed in a first region of the semiconductor substrate with a first insulating film therebetween; a second insulating film, formed on the first conductor and having a first opening in a contact region of the first conductor; a flash memory, formed by sequentially laminating, on a second region of the semiconductor substrate, a tunnel insulating film made of the same material as the first insulating film, a floating gate made of the same material as the first conductor, an intermediate insulating film made of the same material as the second insulating film, and a control gate; an inter-layer insulating film having a hole in the contact region of the first conductor; and a conductive plug formed in the hole and electrically connected to the contact region of the first conductor.

According to another aspect of the present invention, there is provided a method of manufacturing a semiconductor device comprising the steps of: forming a first insulating film on first and second regions of a semiconductor substrate; forming a first conductive film on the first insulating film; forming a second insulating film on the first conductive film; forming on the second insulating film a first resist pattern having a first window in a contact region on the first conductive film of the first region; forming a first opening, through which the contact region exposes, in the second insulating film under the first window, by etching the second insulating film while using the first resist pattern as a mask; removing the first resist pattern; forming a third insulating film on the first conductive film exposed from the first opening; forming a second conductive film on the second and third insulating films; forming a second resist pattern having a first resist portion in the first region and a second resist portion in the second region, the first resist portion having a size to cover the first opening; etching the first and second conductive films and the second insulating film while using the second resist pattern as a mask, thus making the first and second conductive film under the first resist portion into a first and second conductor respectively, making the first and second conductive film under the second resist portion into a floating gate and a control gate respectively, and making the second insulating film into an intermediate insulating film; removing the second resist pattern; forming a third resist pattern in the first and second regions, where the third resist pattern having, in the first region, a second window that has a size to encompass the contact region of the first conductor; selectively removing the second conductor under the second window by etching the second conductor while using the third resist pattern as a mask; removing the third resist pattern; exposing the contact region by removing the third insulating film on the contact region of the first conductor; forming an inter-layer insulating film to cover the first conductor; forming a hole in the inter-layer insulating film on the contact region of the first conductor; and forming a conductive plug in the hole, the conductive plug being electrically connected to the contact region of the first conductor.

According to the present invention, since the first resist portion of the second resist pattern is formed to the size to cover the first opening of the second insulating film, the thick portion generated at the first opening of the second insulating film is covered with the first resist portion. Therefore, when the first conductor is formed by the etching that uses the first resist portion as a mask, the thick portion of the second insulating film resides outside of the etching region. As such, etching residue of the first conductive film, which commonly generates when the thick portion is function as an etching mask, does not generate in the present invention. Accordingly, a device failure or a short circuit due to the etching residue can be prevented, and a highly reliable semiconductor device can be provided.

The thick portion of the second insulating film is especially noticeable when an ONO film is employed as the second insulating film and an oxide film formed on the first conductive film is employed as a third insulating film. Therefore, the above described advantage can easily be obtained when such ONO film and oxide film are used.

Further, in the step of forming the third resist pattern, a second window may be formed in the size to be encompassed in the first opening, and in the step of selectively removing the second conductor under the second window, a second opening may be formed in the conductive film under the second window.

According to this, distance between the outer side surface of the second conductor and the edge of the second opening are made to be sufficiently large. Therefore, a silicide layer can be broadly formed on the upper surface of the second conductor, and even if the outer side surface of the second conductor is inclined like taper-shape, the silicide layer can not be easily stripped from the second conductor during a wetting process such as rinsing. As a result, a device failure due to the stripping of the silicide layer can be prevented, and the yield for the semiconductor device manufacturing process can be improved.

BRIEF DESCRIPTION OF THE DRAWINGS

FIG. 2B presents cross-sectional views respectively taken along lines D3—D3, D4—D4 and D5—D5 in FIG. 4D;

FIG. 2D presents cross-sectional views respectively taken along lines E3—E3, E4—E4 and E5—E5 in FIG. 4E;

FIGS. 4A to 4J are plan views of the hypothetical semiconductor device during the manufacturing process;

FIG. 7C presents cross-sectional views respectively taken along lines P2—P2, P3—P3 and P4—P4 in FIG. 10D after a third insulating film has been formed;

FIG. 8B is a cross-sectional view taken along line T2—T2 in FIG. 10H before a third resist pattern has been removed;

FIG. 8D is a cross-sectional view taken along line U2—U2 in FIG. 10I after a cobalt silicide layer has been formed;

FIGS. 11A to 11G are cross-sectional views of a semiconductor device according to a second embodiment of the present invention;

FIG. 12A is a cross-sectional view taken along line W2—W2 in 13A;

FIGS. 13A to 13C are plan views of the semiconductor device according to the second embodiment of the present invention.

DETAILED DESCRIPTION OF THE PREFERRED EMBODIMENTS (1) Preliminary Explanation A preliminary explanation for the present invention will be given before the preferred embodiments are described.

Figure 1A:
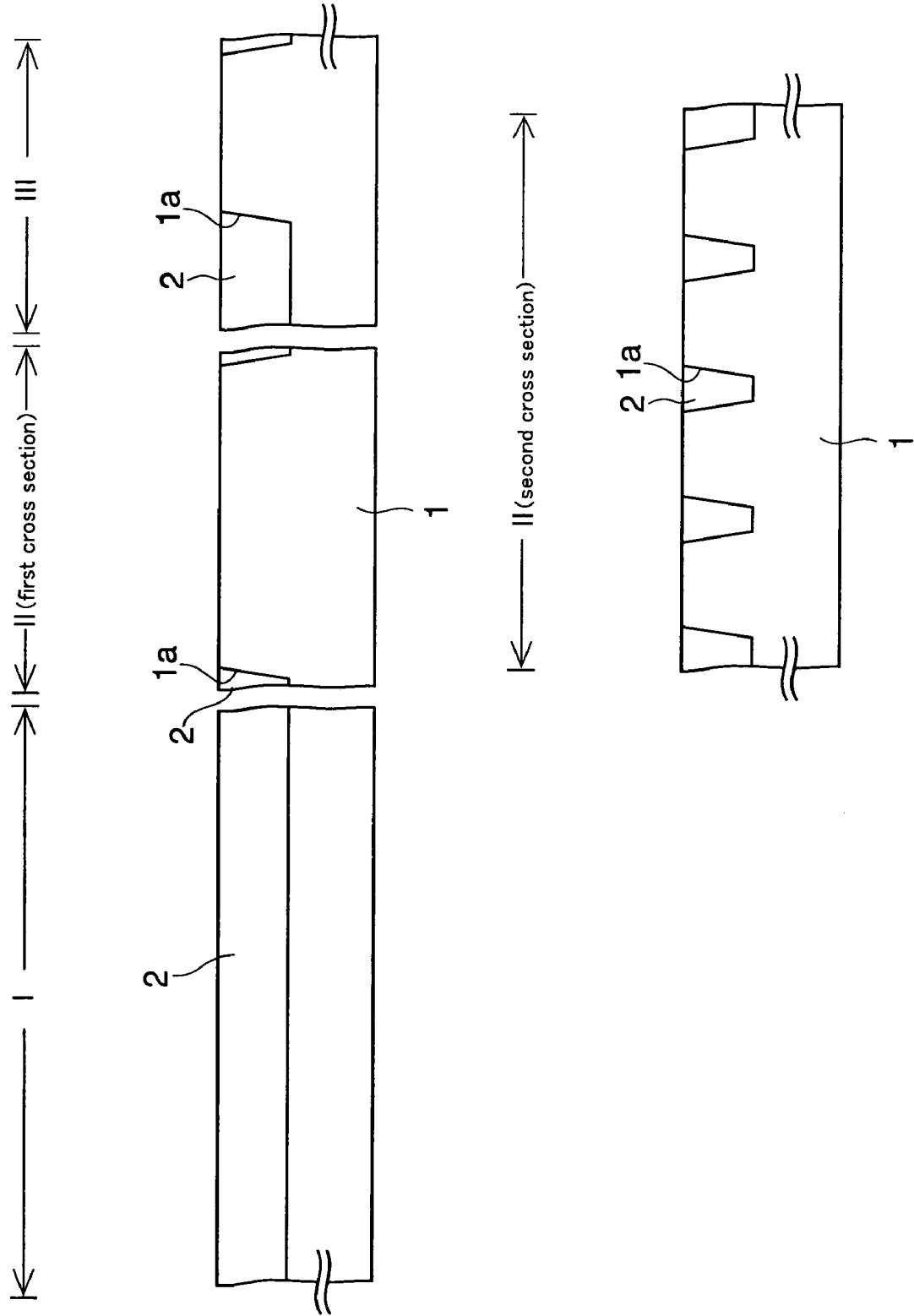
FIGS. 1A to 1U are cross-sectional views of a hypothetical semiconductor device during the manufacturing process.
Figure 1B:
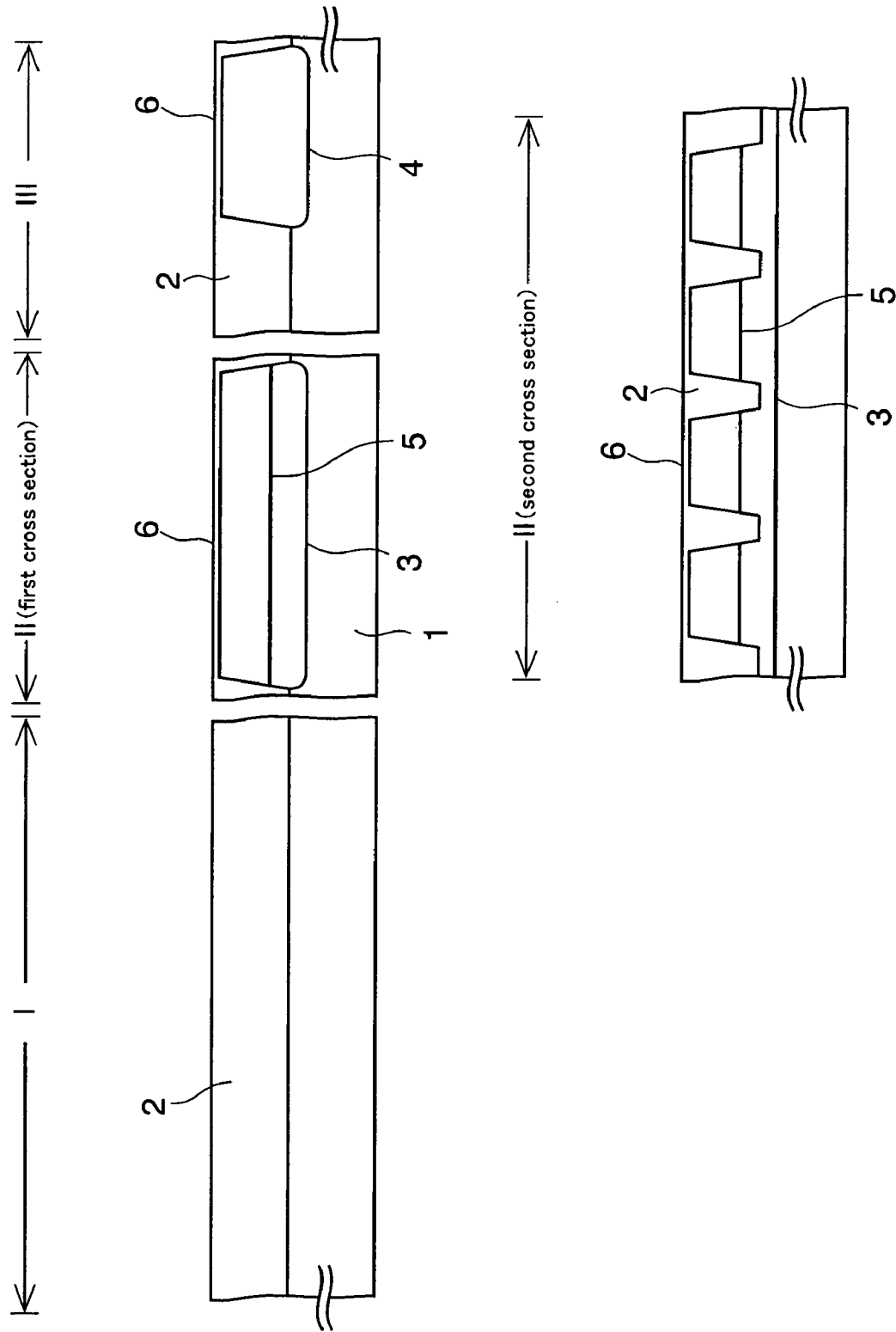
Figure 1C:
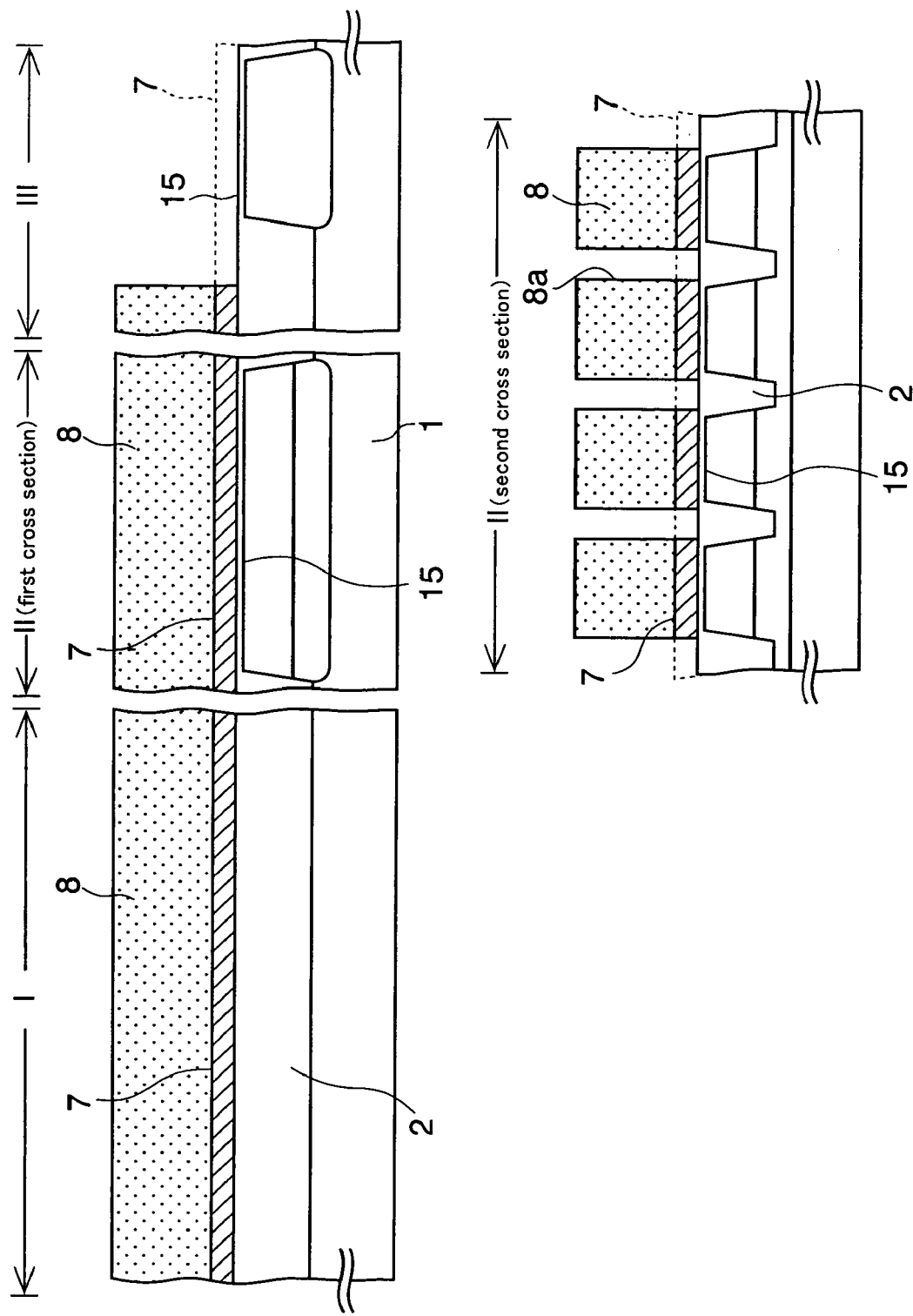
Figure 1E:
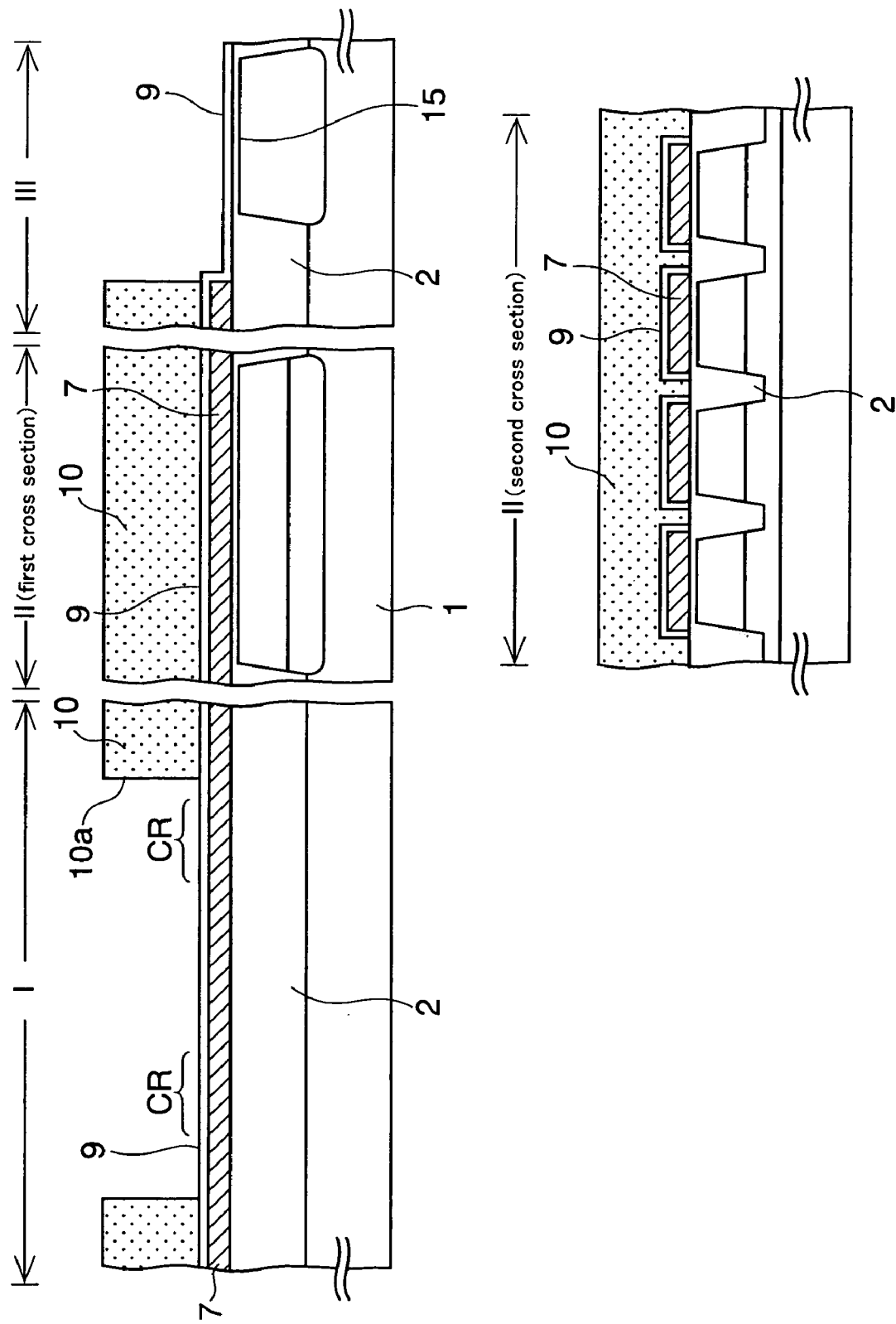
Figure 1F:
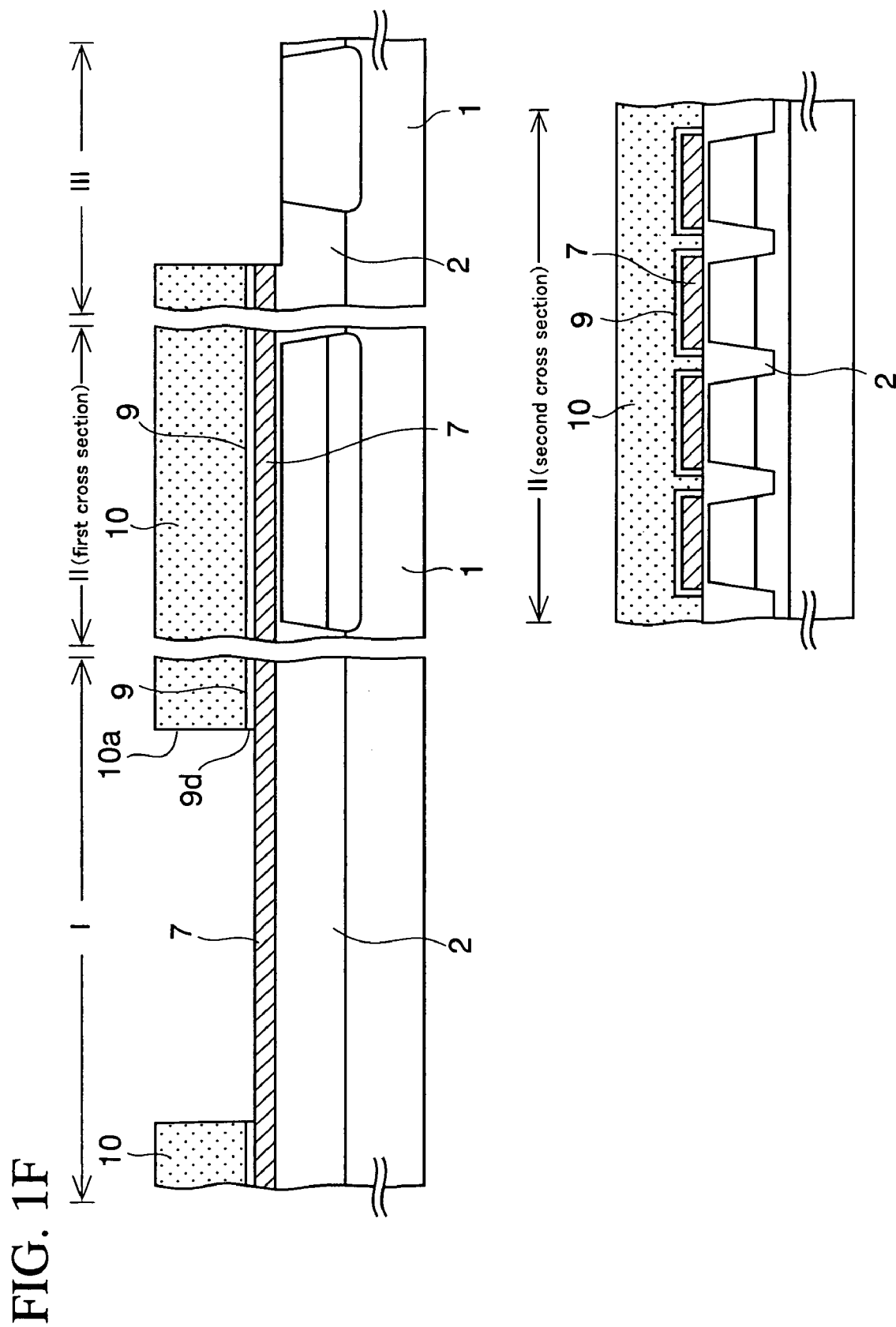
Figure 1H:
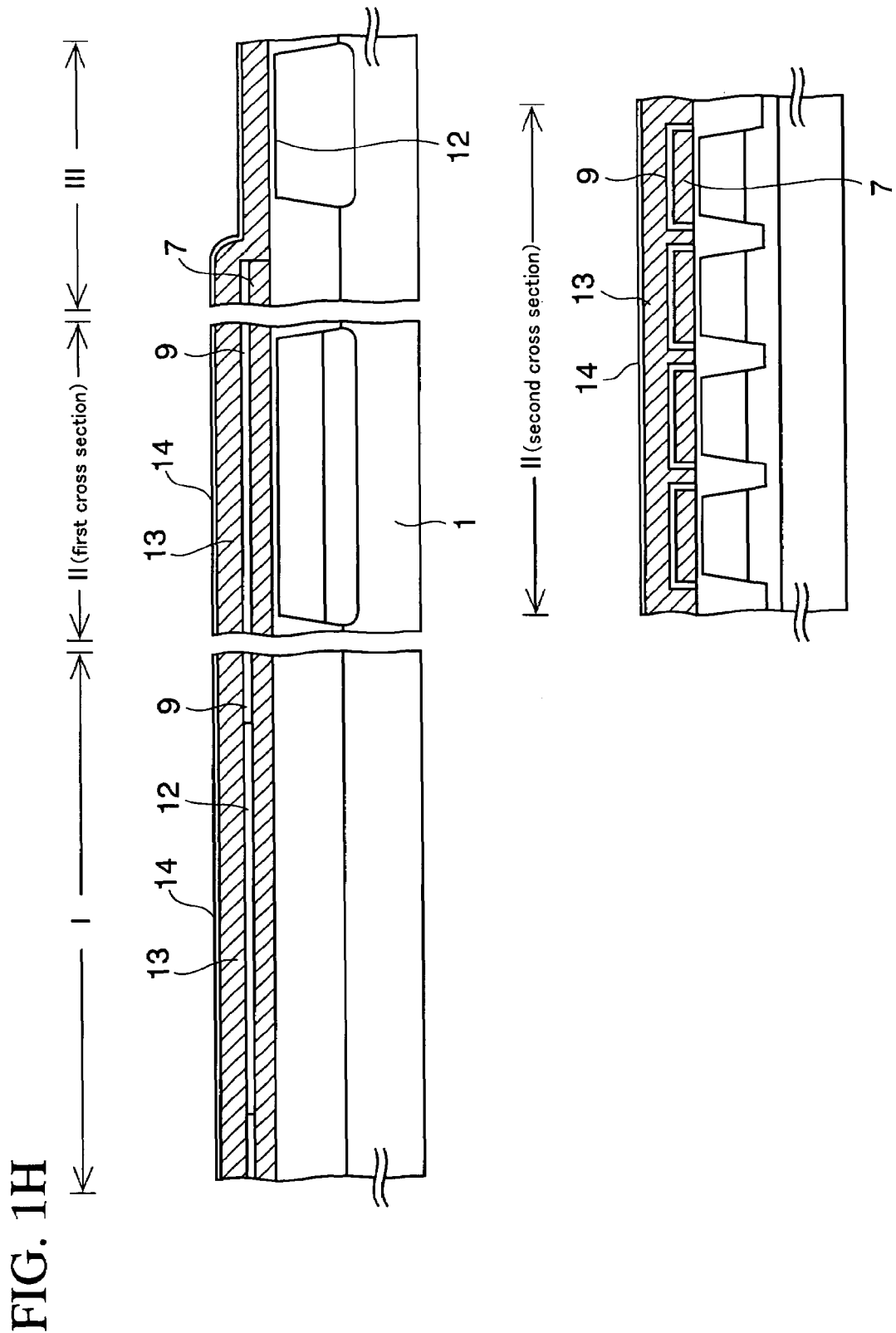
Figure 1L:
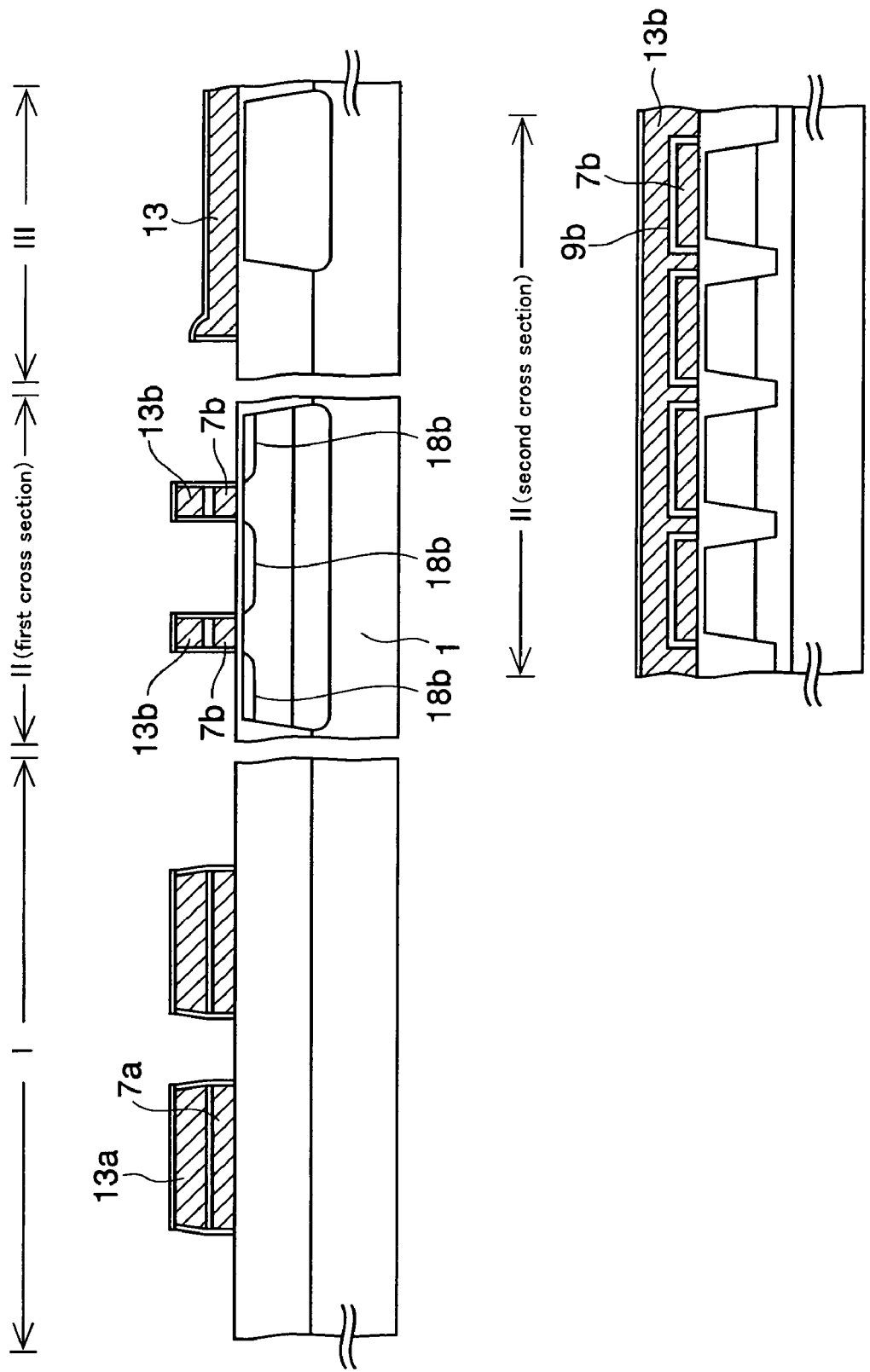
Figure 1M:
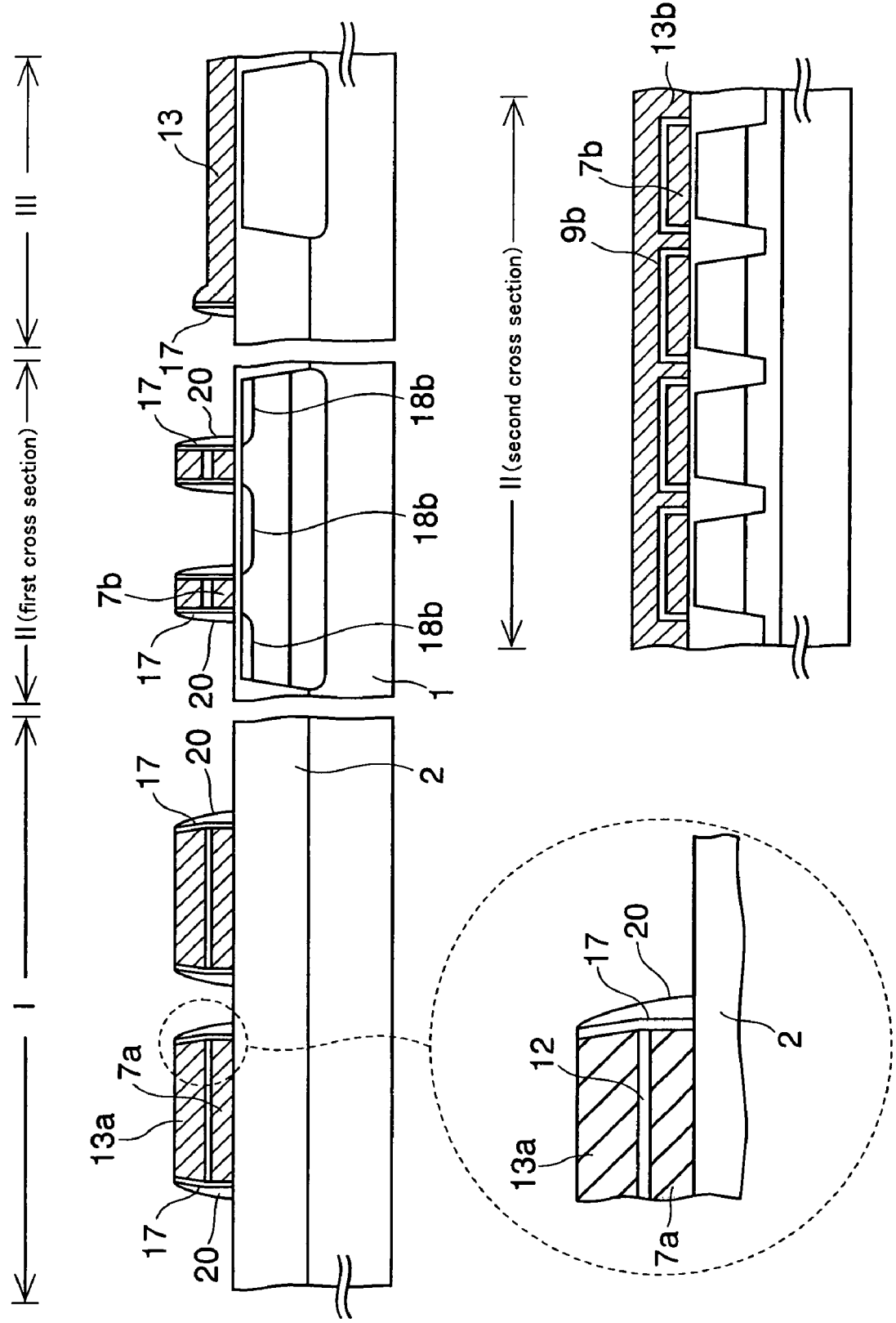
Figure 1N:
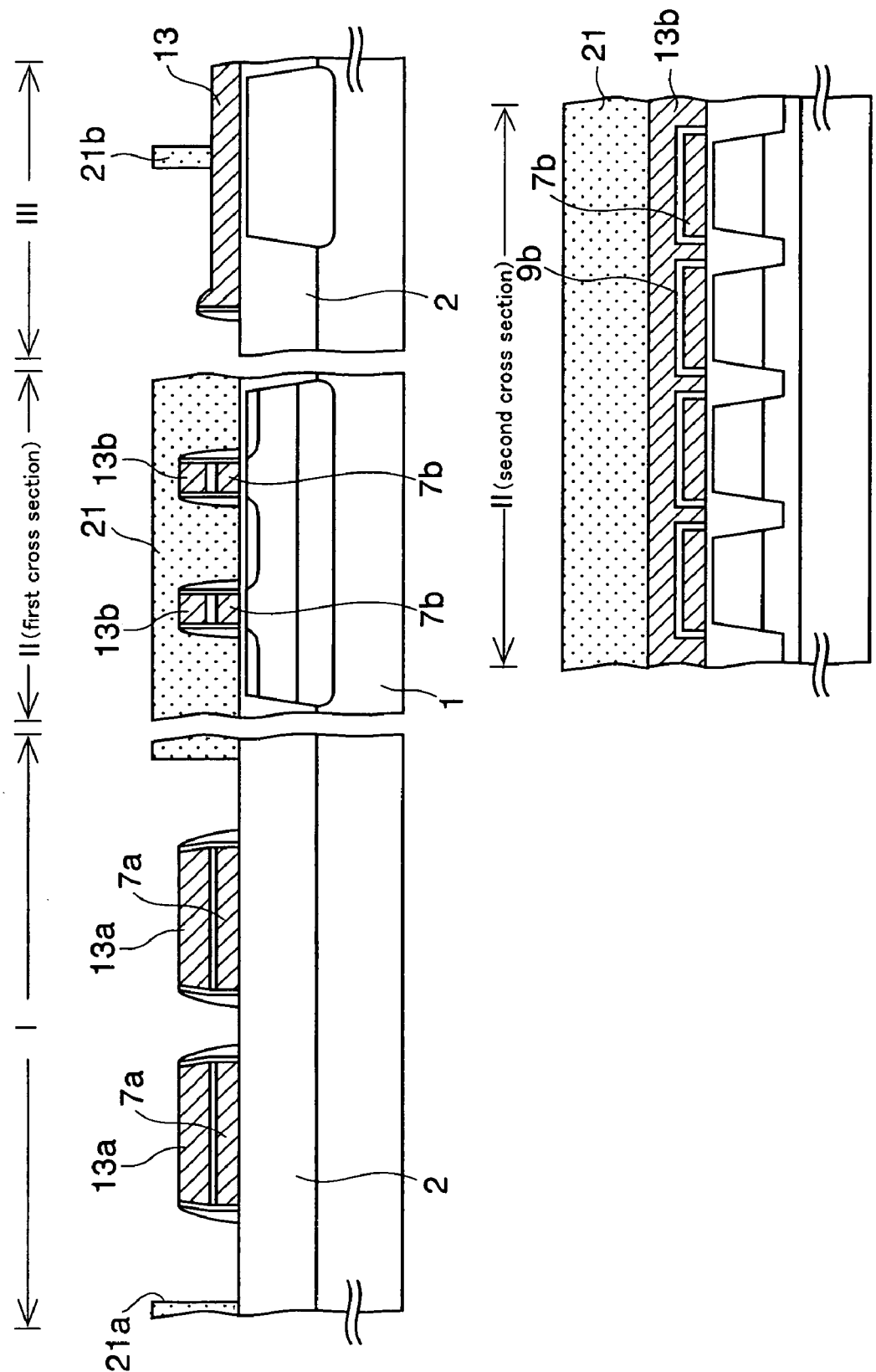
Figure 1P:
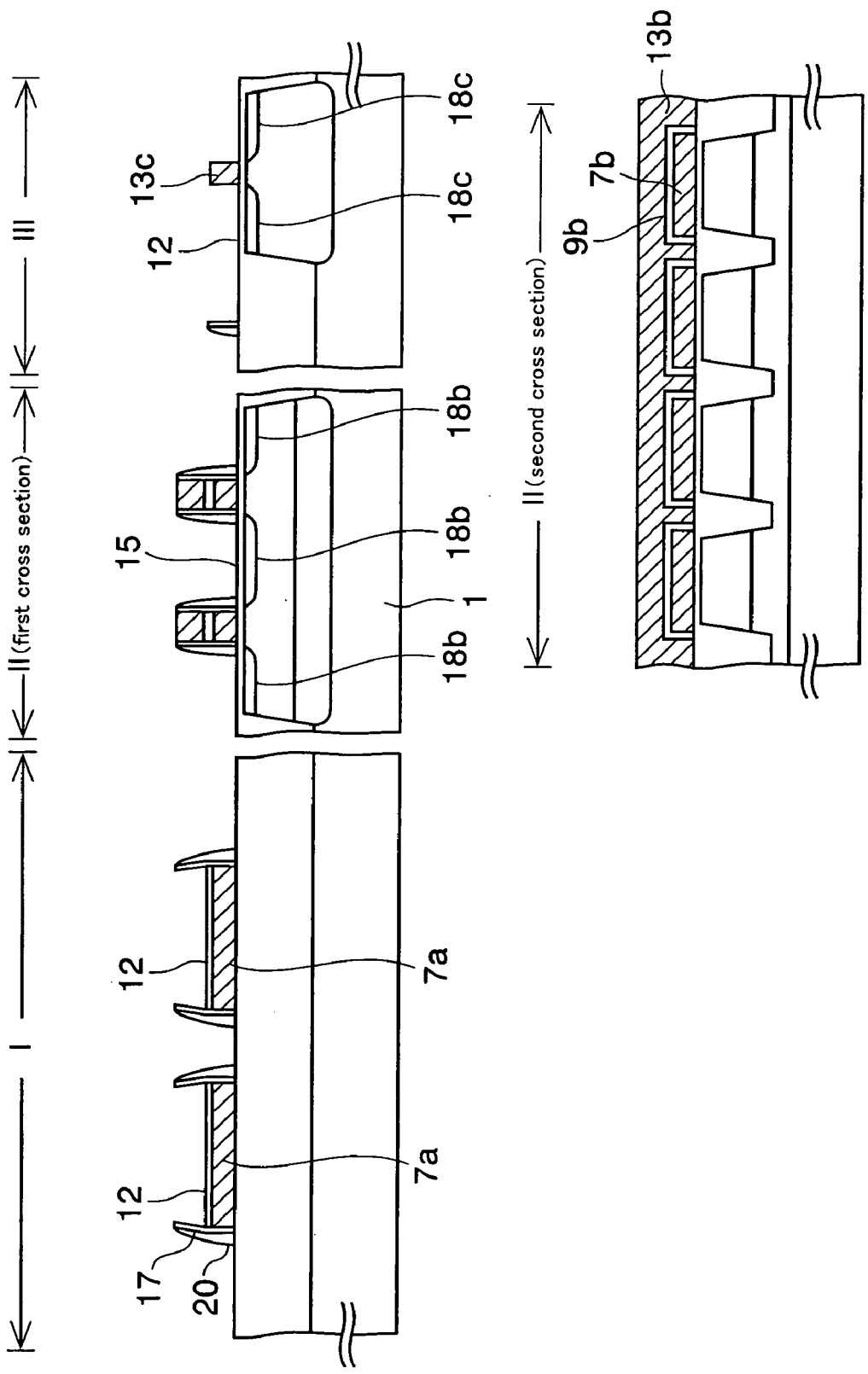
Figure 1Q:
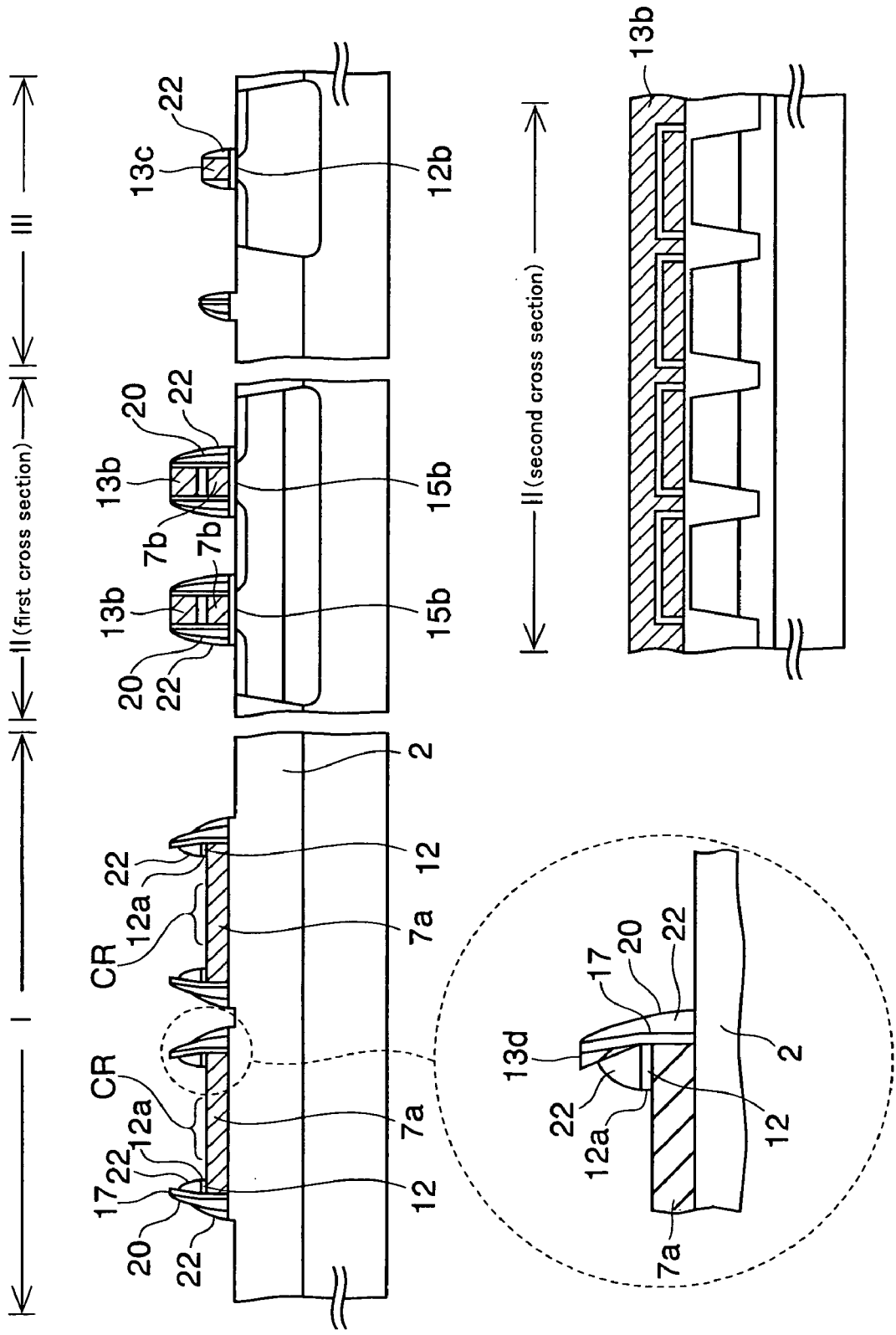
Figure 1R:
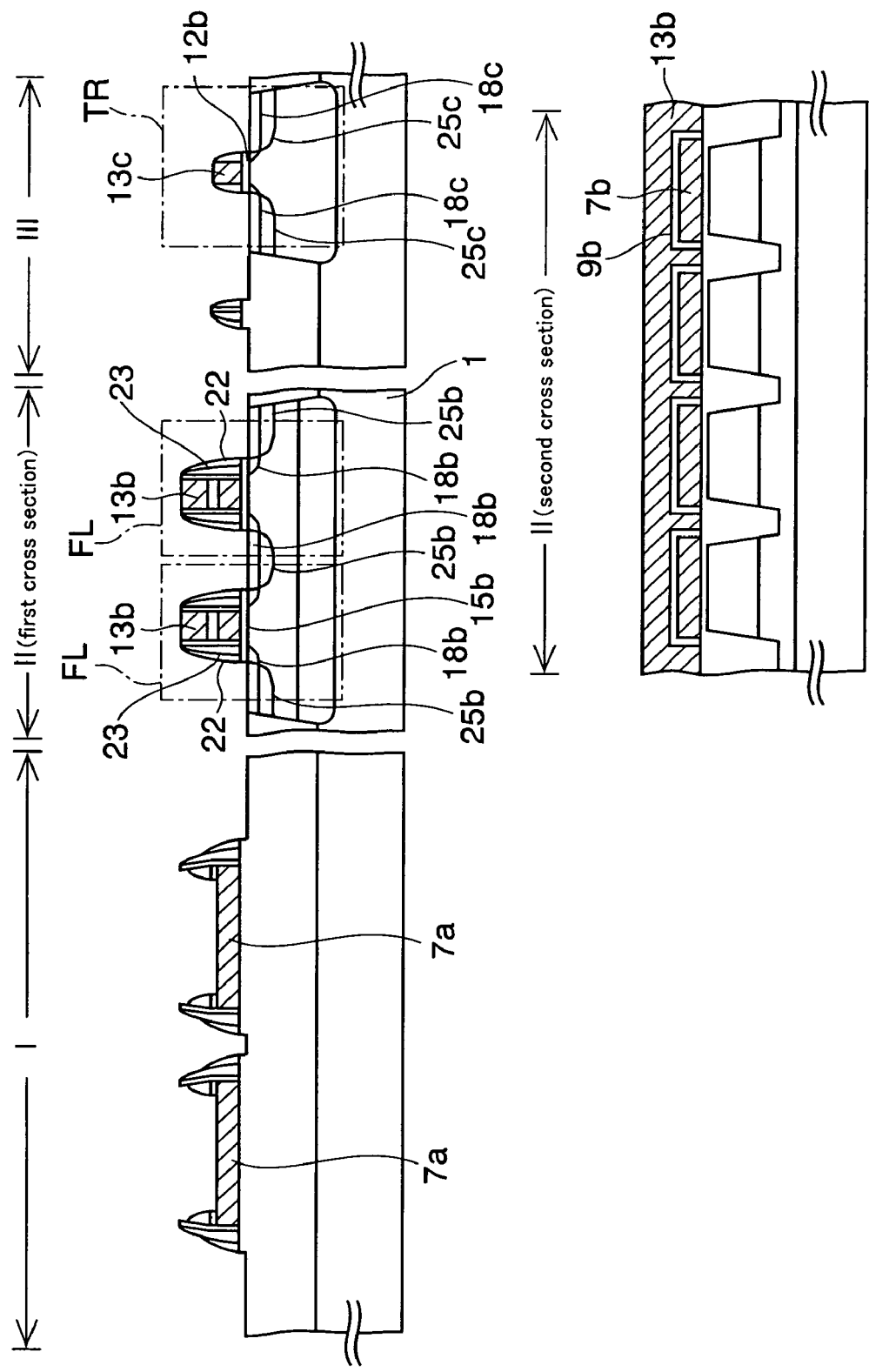
Figure 1S:
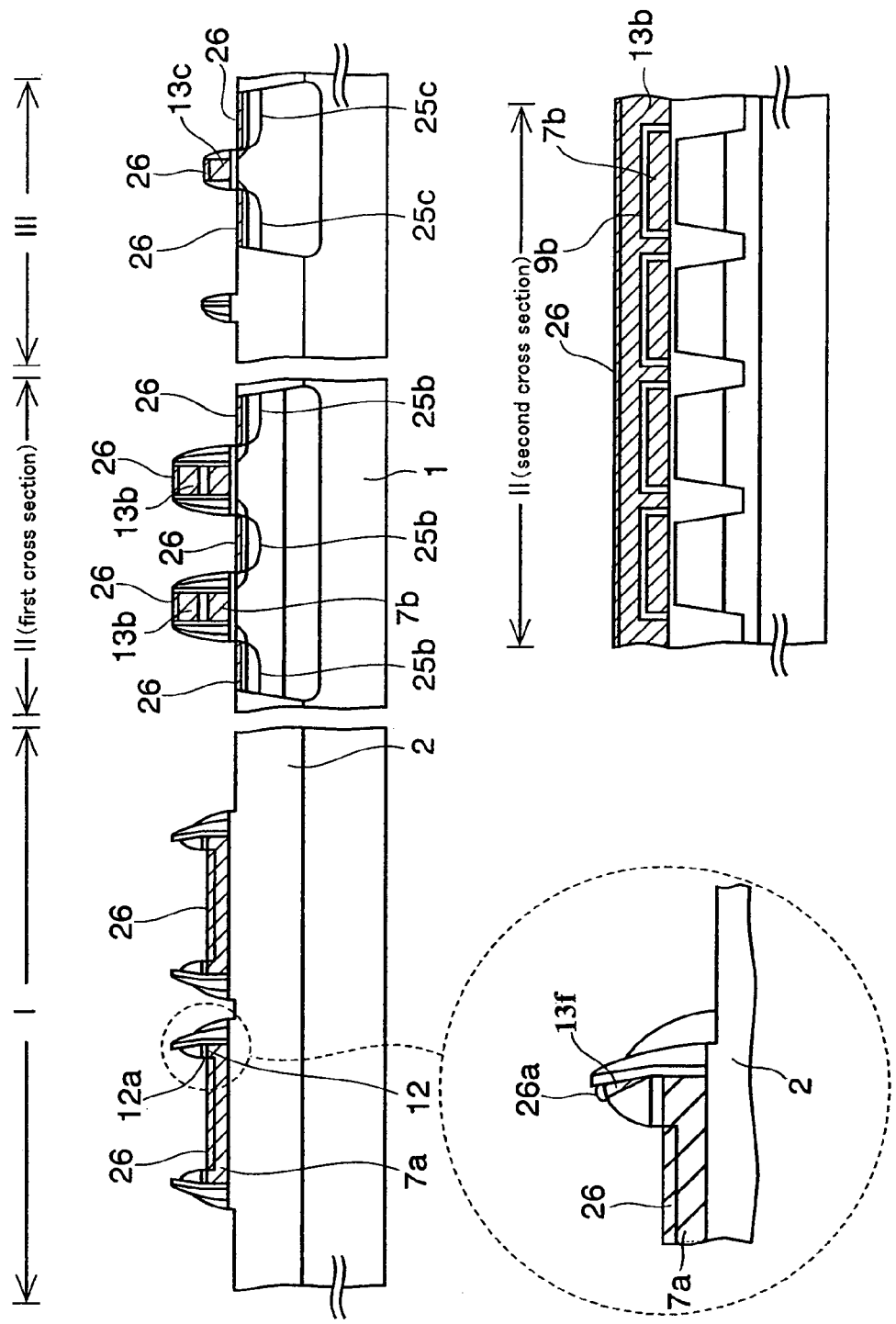
Figure 1U:
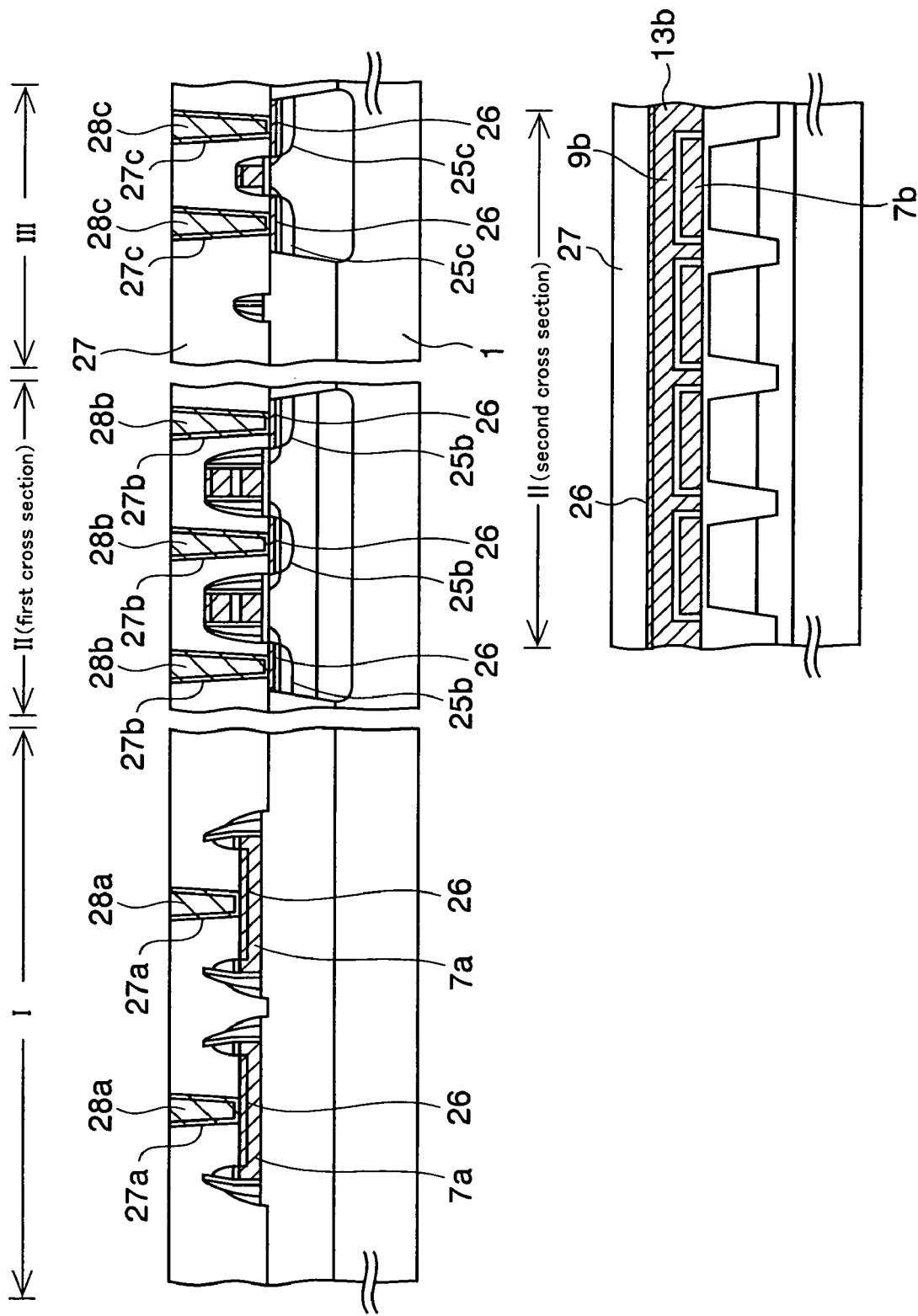

FIGS. 1A to 1U are cross-sectional views of a hypothetical semiconductor device during the manufacturing process, and FIGS. 4A to 4J are plan views of the semiconductor device. A manufacturing method of the semiconductor device will now be described.

Figure 4A:
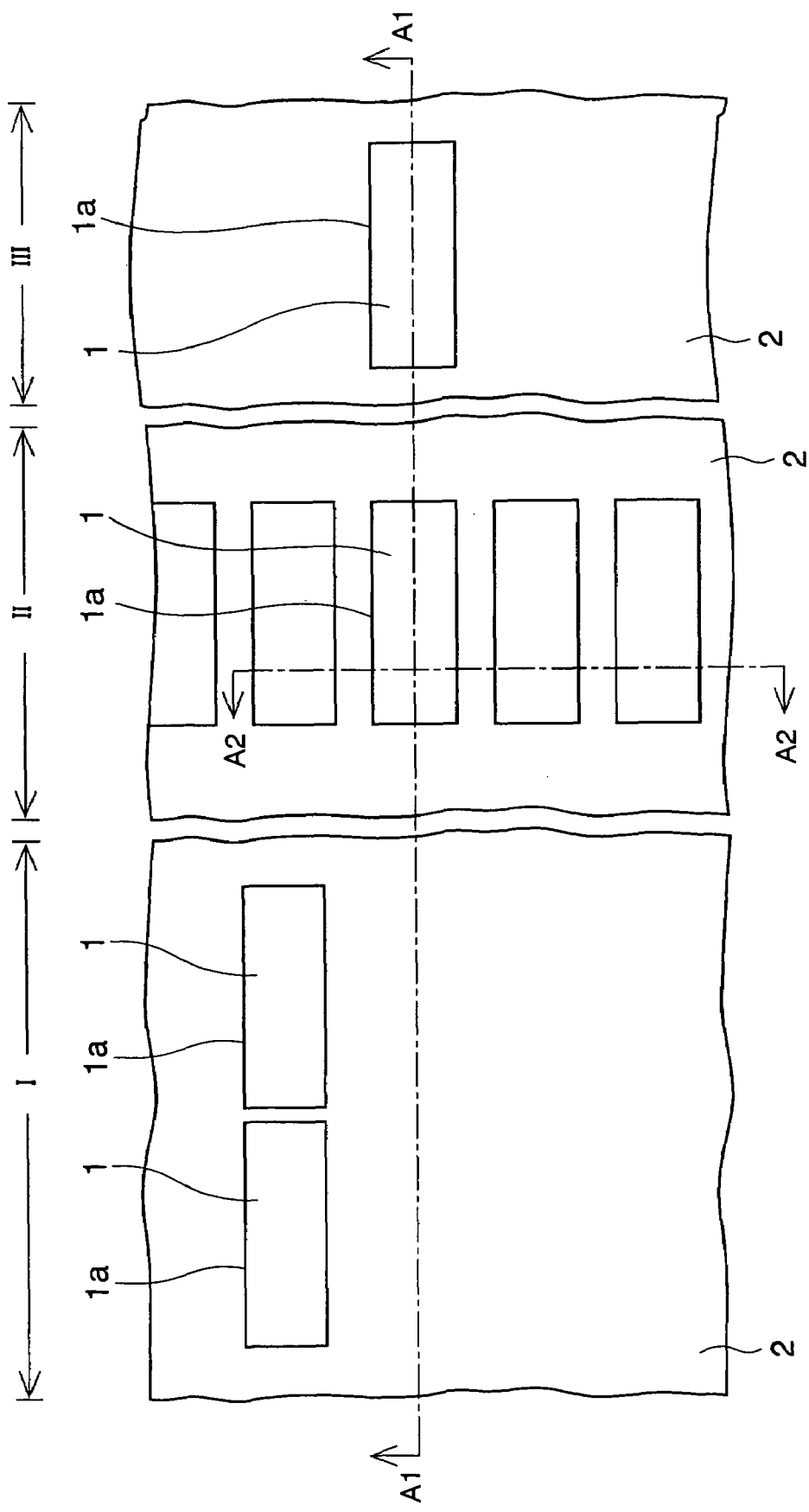

First, as is shown in FIG. 1A, a device isolation groove 1a is formed in a silicon substrate 1, and a device isolation insulating film 2 is embedded in the device isolation groove 1a. FIG. 4A is a plan view of the structure after the device isolation insulating film 2 has been formed in this manner. The upper portion in FIG. 1A corresponds to a cross section (first cross section) taken along line A1—A1 in FIG. 4A, and the lower portion corresponds to a cross section (second cross section) taken along line A2—A2 that is parallel to a word line. Further, as is shown in FIG. 4A, a first peripheral circuit region I, a cell region II and a second peripheral circuit region III are defined on the semiconductor substrate 1.

The procedures employed until the cross-sectional structure shown in FIG. 1B is obtained will now be described.

First, the surface of the silicon substrate 1 whereon the device isolation insulating film 2 is not formed is thermally oxidized, and a first thermal oxide film 6 is obtained. Then, ion implantation is performed, using the first thermal oxide film 6 as a through film, and an n well 3 is formed at the deep portion of the silicon substrate 1 in the cell region II. Further, a first p well 5 is formed at that portion of the silicon substrate 1, in the cell region II, that is shallower than the n well 3. In addition, a second p well 4 is formed in the portion of the silicon substrate 1 in the second peripheral circuit region III.

Next, the procedures employed until the cross-sectional structure shown in FIG. 1C is obtained will be explained.

First, the first thermal oxide film 6 that is used as a through film is removed, and the silicon substrate 1 is thermally oxidized again to form a first insulating film 15 on the silicon substrate 1 in the cell region II and the second peripheral circuit region III. Thereafter, a polysilicon film is formed as a first conductive film 7 on the first insulating film 15, and is etched by using a first resist pattern 8 as a mask. As a result, portions of the first conductive film 7 remain only on the first peripheral circuit region I and the cell region II.

FIG. 4B is a plan view of the structure after this process has been completed. The upper portion in FIG. 1C corresponds to a cross section taken along line B1—B1 in FIG. 4B, and the lower portion corresponds to a cross section taken along line B2—B2.

As is shown in FIG. 4B, in the first resist pattern 8 in the cell region II, a plurality of first elongated windows 8a are formed at intervals in the direction perpendicular to the word line. And as a result of the etching, the first conductive film 7 in the cell region II is patterned as a plurality of stripes arranged at intervals in the word line direction.

The first resist pattern 8 is thereafter removed.

Following this, as is shown in FIG. 1D, an ONO film is formed as a second insulating film 9 on the entire structure. As is shown in a broken-line circle, the ONO film is formed by laminating a first oxide silicon film 9a, a nitride silicon film 9b, and a second oxide silicon film 9c in this order, and because a leak current is low, the use of the ONO film as the intermediate insulating film is appropriate for a flash memory.

The second insulating film 9 must be removed from the first peripheral circuit region I because a conductive plug is later to be connected to contact regions CR and to provide control for the potential of the part of the first conductive film 7 located in the first peripheral circuit region I.

Therefore, at the next step, as is shown in FIG. 1E, a second resist pattern 10 is formed on the second insulating film 9, so that the second insulating film 9 can be patterned and contact regions CR on the first conductive film 7 can be exposed. The second resist pattern 10 includes a second window 10a large enough to cover the contact regions CR on the first conductive film 7. The second peripheral circuit region III is exposed and is not hidden by the second resist pattern 10.

FIG. 4C is a plan view of the structure after this process has been completed. The upper portion in FIG. 1E corresponds to a cross section taken along line C1—C1 in FIG. 4C, and the lower portion corresponds to a cross section taken along line C2—C2.

Figure 2A:
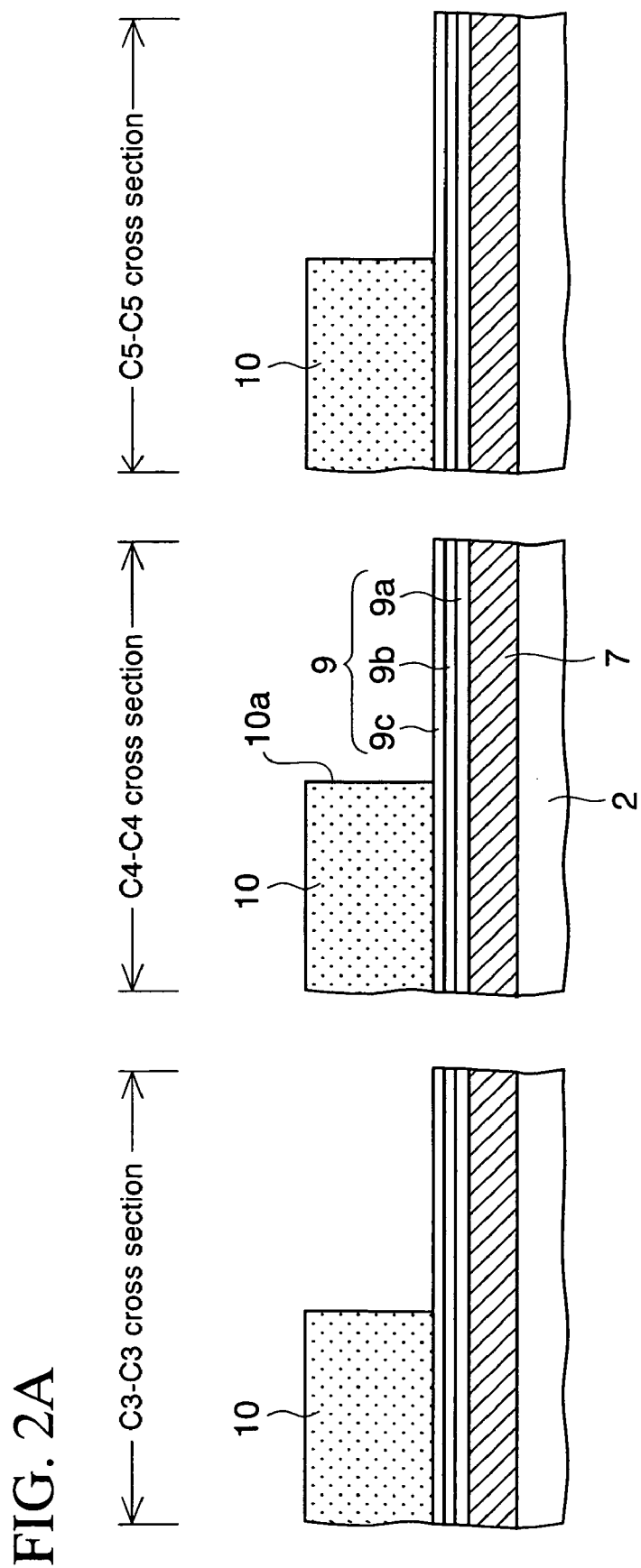
FIG. 2A presents cross-sectional views respectively taken along lines C3—C3, C4—C4 and C5—C5 in FIG. 4C.

The cross sections in FIG. 2A are those taken along lines C3—C3, C4—C4 and C5—C5 in FIG. 4C.

Next, as is shown in FIG. 1F, the second insulating film 9 under the second window 10a is etched, using the second resist pattern 10 as a mask, and a first opening 9d is obtained. Also, parts of the first and the second insulating films 15 and 9 in the second peripheral circuit region III are removed to expose the surface of the silicon substrate 1.

The second resist pattern 10 is thereafter removed.

Figure 4D:
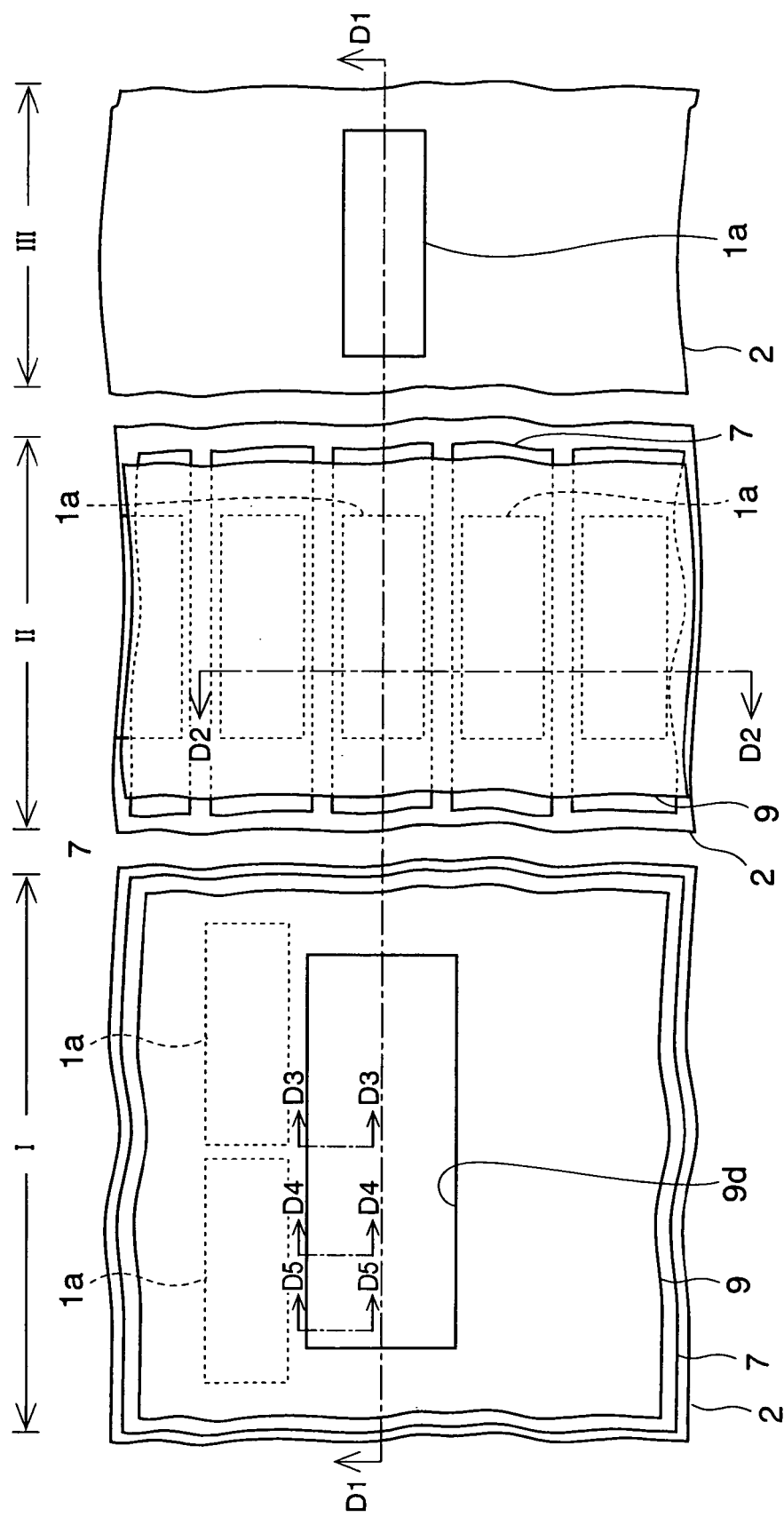

FIG. 4D is a plan view of the structure after this process has been completed. The upper portion in FIG. 1F corresponds to a cross section taken along line D1—D1 in FIG. 4D, and the lower portion corresponds to a cross section taken along line D2—D2.

The cross sections shown in FIG. 2B are those taken along lines D3—D3, D4—D4 and D5—D5 in FIG. 4D.

Sequentially, as is shown in FIG. 1G, parts of the silicon substrate 1 in the second peripheral circuit region II and the first conductive film 7, made of polysilicon, are thermally oxidized, and a third insulating film 12 made of oxide silicon is obtained.

Figure 2C:
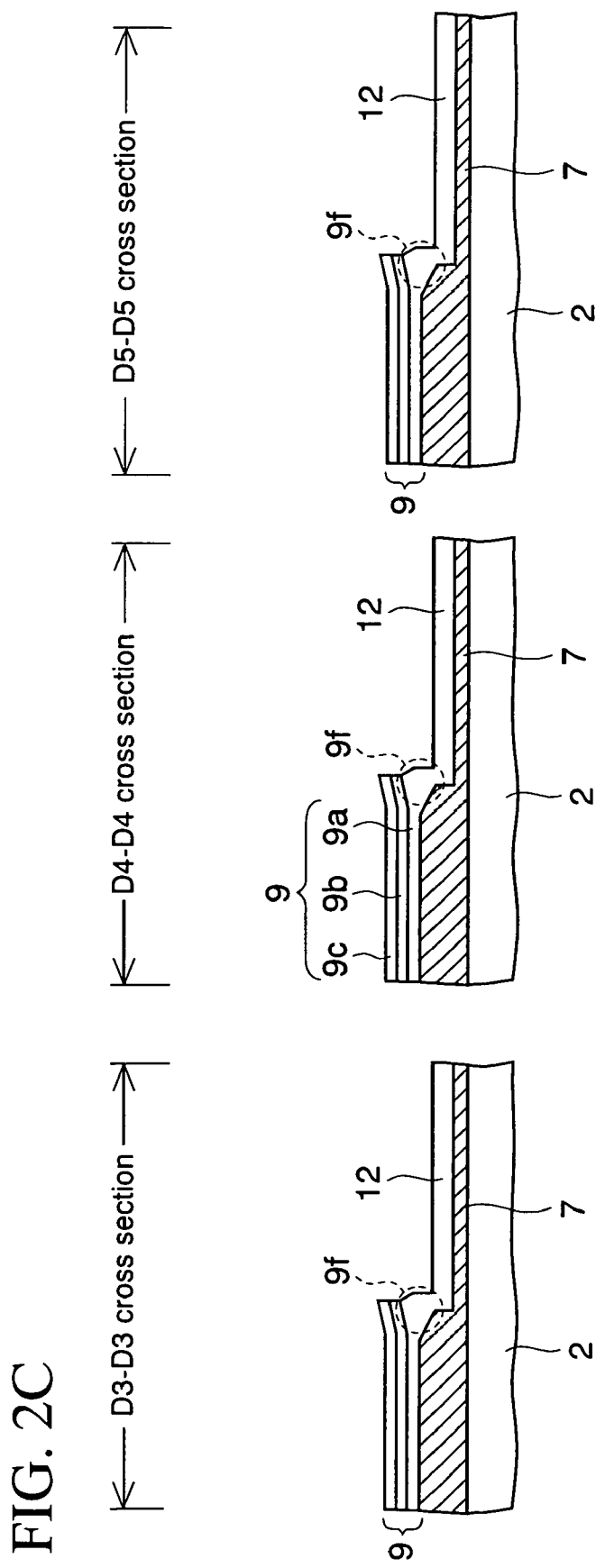
FIG. 2C presents the cross-sectional views as in FIG. 2B, taken after thermal oxidization has been completed.

The cross section in FIG. 2C is the same as that in FIG. 2B after the thermal oxidization has been completed. As is shown in FIG. 2C, the thickness of the part of the first conductive film 7 that is not covered by the second insulating film 9 is reduced. The amount of the portion of the first conductive film 7 under the first opening 9d of the second insulating film 9 that is oxidized is increased, compared with the other portions, and a thick portion 9f, made of first oxide silicon 9a, is obtained.

Following this, as is shown in FIG. 1H, a polysilicon film is formed on the entire surface as a second conductive film 13, and on this second conductive film 13, a silicon nitride film is formed as an anti-reflection film 14 to prevent the reflection of exposure light during the succeeding photolithography process.

Thereafter, as is shown in FIG. 1I, a third resist pattern 16, which has first and second resist portions 16a and 16b in the first peripheral circuit region I and the cell region II, is formed on the anti-reflection film 14.

Figure 4E:
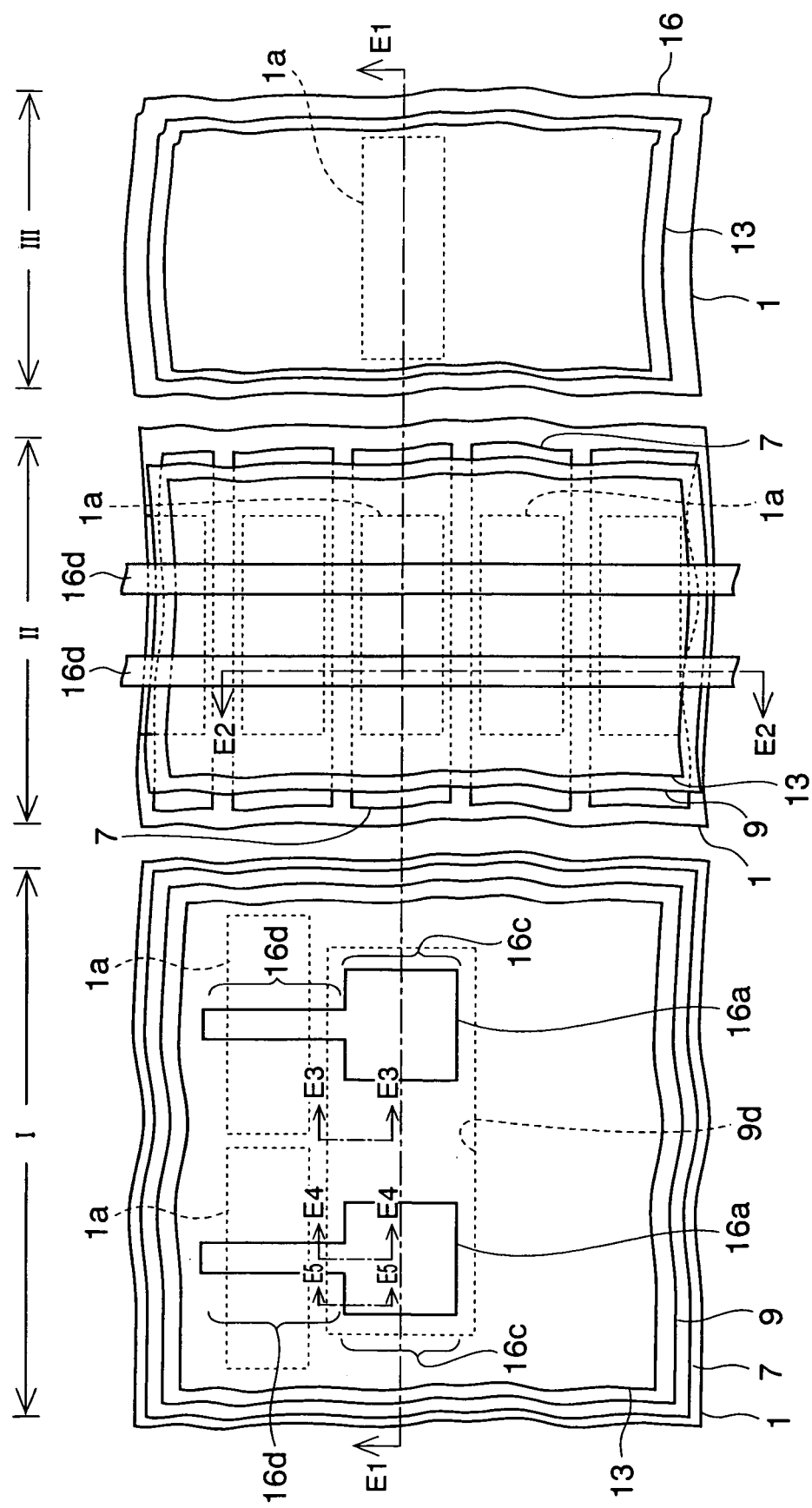

FIG. 4E is a plan view of the structure after this process has been completed. The upper portion in FIG. 1I corresponds to a cross section taken along line E1—E1 in FIG. 4E, and the lower portion corresponds to a cross section taken along line E2—E2.

As is shown in FIG. 4E, the first resist portion 16a, which is located in the first peripheral circuit region I, is shaped like a gate electrode for a reference transistor that will be described later and has a pad 16c and a gate 16d. The pad 16c is so formed that it will fit in the first opening 9d of the second insulating film 9.

The second resist portion 16b located in the cell region II is shaped like a control gate extended in the word line direction.

The cross sections in FIG. 2D are those taken along lines E3—E3, E4—E4 and E5—E5 in FIG. 4E.

As is shown in FIG. 1J, the first and second conductive films 7 and 13 and the second insulating film 9 are etched, using the first and second resist portions 16a and 16b as masks. Through this etching, the first conductive film 7 in the first region I can be used as first gate electrodes 7a for a reference transistor, and the second conductive film 13 lying on the film 7 can be used as second conductors 13a. In the cell region II, the first and second conductive films 7 and 13 are used as floating gates 7b and control gates 13b, and between these gates, the second insulating film 9 is used as an intermediate insulating film 9e.

Through study of the results, the present inventor found that, as is shown in a broken-line circle, an outer side surface 13e of the second conductive film 13 is inclined like taper-shape during the etching.

The third resist pattern 16 is removed thereafter.

Figure 4F:
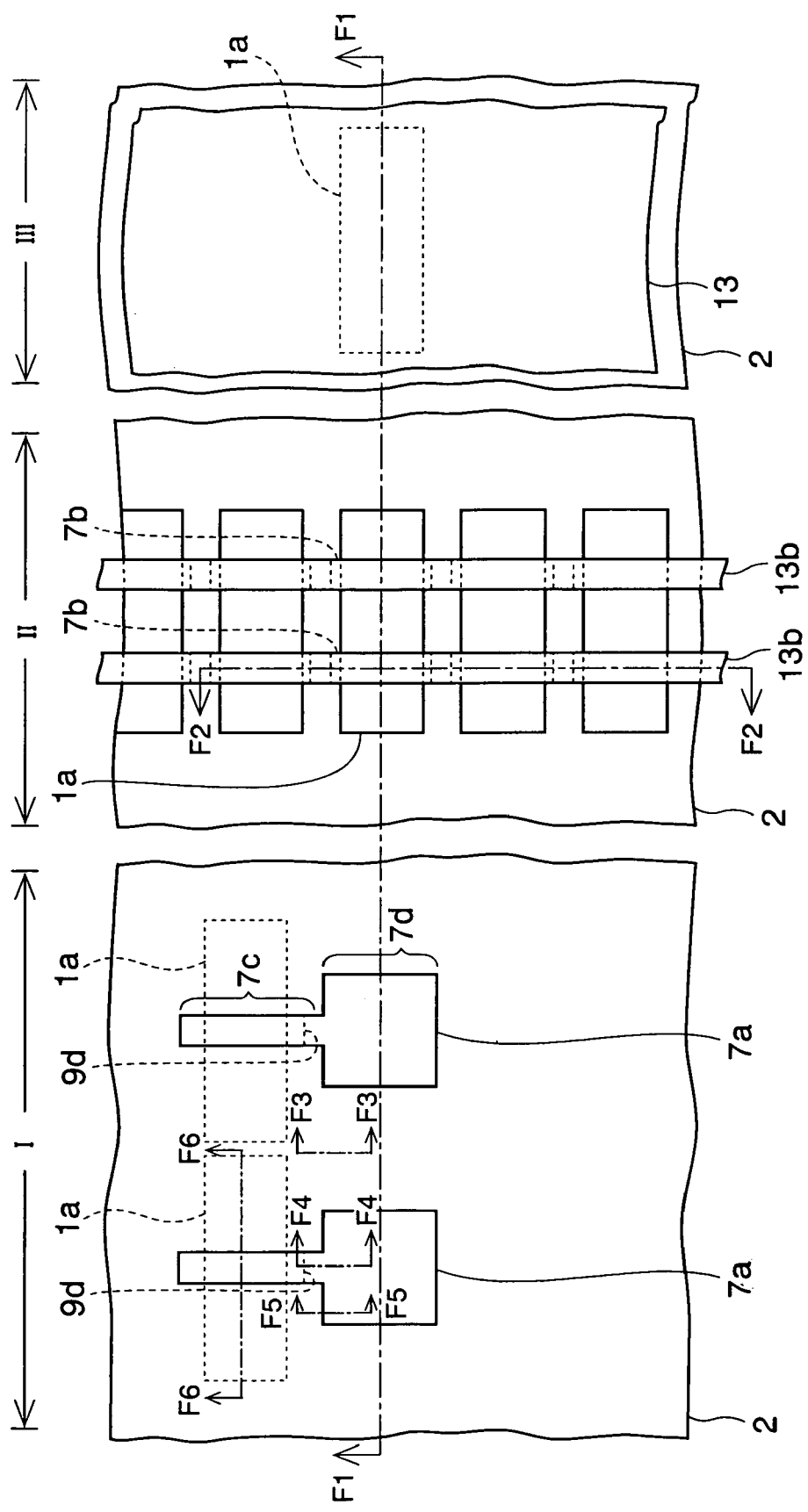

FIG. 4F is a plan view of the structure after the third resist pattern 16 has been removed. The upper portion in FIG. 1J corresponds to a cross section taken along line F1—F1 in FIG. 4F, and the lower portion corresponds to a cross section taken along line F2—F2. It should be noted that the conductors 13a in the first peripheral circuit region I are not shown in FIG. 4F.

As is shown in FIG. 4F, each first gate electrode 7a, used as a reference transistor, is constituted by a gate 7c and a pad 7d which is extended on the device isolation insulating film 2.

Figure 2E:
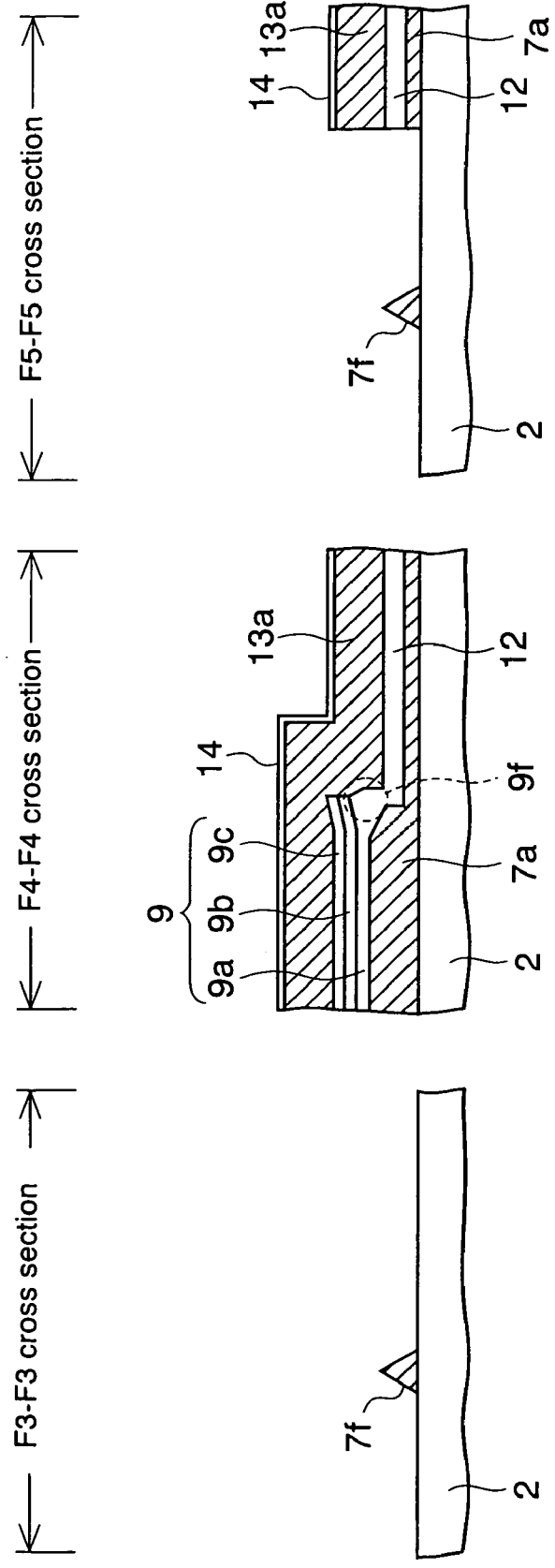
FIG. 2E presents cross-sectional views respectively taken along lines F3—F3, F4—F4 and F5—F5 in FIG. 4F.

The cross sections in FIG. 2E are those taken along lines F3—F3, F4—F4 and F5—F5 in FIG. 4F. In the cross sections taken along lines F3—F3 and F5—F5, since the thick oxide silicon portion 9f is used as a mask for etching, the portion of the first conductive film 7 lying under the thick portion 9f is not etched, and an etching residue 7f of the first conductive film 7 remains on the device isolation insulating film 2.

Figure 3A:
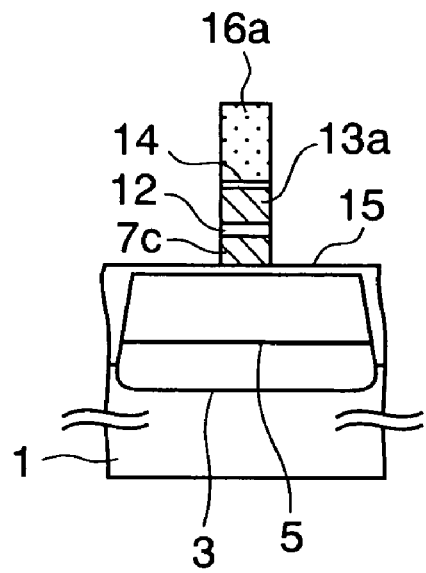
FIG. 3A is a cross-sectional view taken along line F6—F6 in FIG. 4F.

FIG. 3A is a cross-sectional view taken along line F6—F6 in FIG. 4F.

As is shown in FIG. 1K, the side walls of the floating gates 7b and the control gates 13b are thermally oxidized and a second thermal oxide film 17 is formed in order to improve the retention characteristic of the flash memory cell. The second thermal oxide film 17 also covers the side walls of the first gate electrodes 7a and the second conductors 13a in the first peripheral circuit region I.

Then, as is shown in FIG. 1L, an n-type impurity is implanted in the portions of the silicon substrate 1 alongside the floating gates 7b, and second n-type source/drain extensions 18b are formed for a flash memory cell.

Figure 3B:
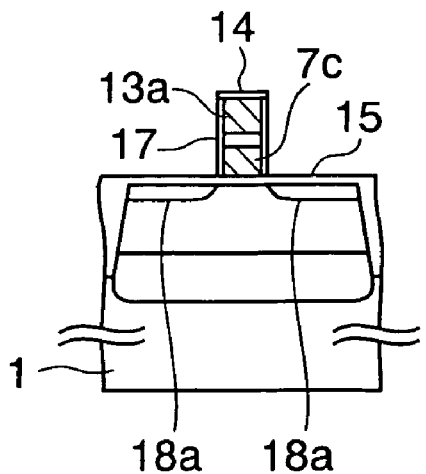
FIG. 3B is a cross-sectional view taken along line F6—F6 in FIG. 4F after a second n-type source/drain extension has been formed.

FIG. 3B is a cross-sectional view taken along line F6—F6 in FIG. 4F after the second n-type source/drain extensions 18b have been formed. As is shown in FIG. 3B, the ion implantation is performed to form the second n-type source/drain extensions 18b, and first n-type source/drain extensions 18a are formed in the portions of the silicon substrate 1 alongside the gates 7c.

Sequentially, as is shown in FIG. 1M, a silicon nitride film is formed on the entire surface and etched back, to form first insulating side walls 20 in each regions I to III. The anti-reflection film 14, laid on the second conductors 13a, the control gates 13b and the second conductive film 13, is removed during the etch back process.

Next, as is shown in FIG. 1N, a fourth resist pattern 21 is formed in the regions I to III.

Figure 4G:
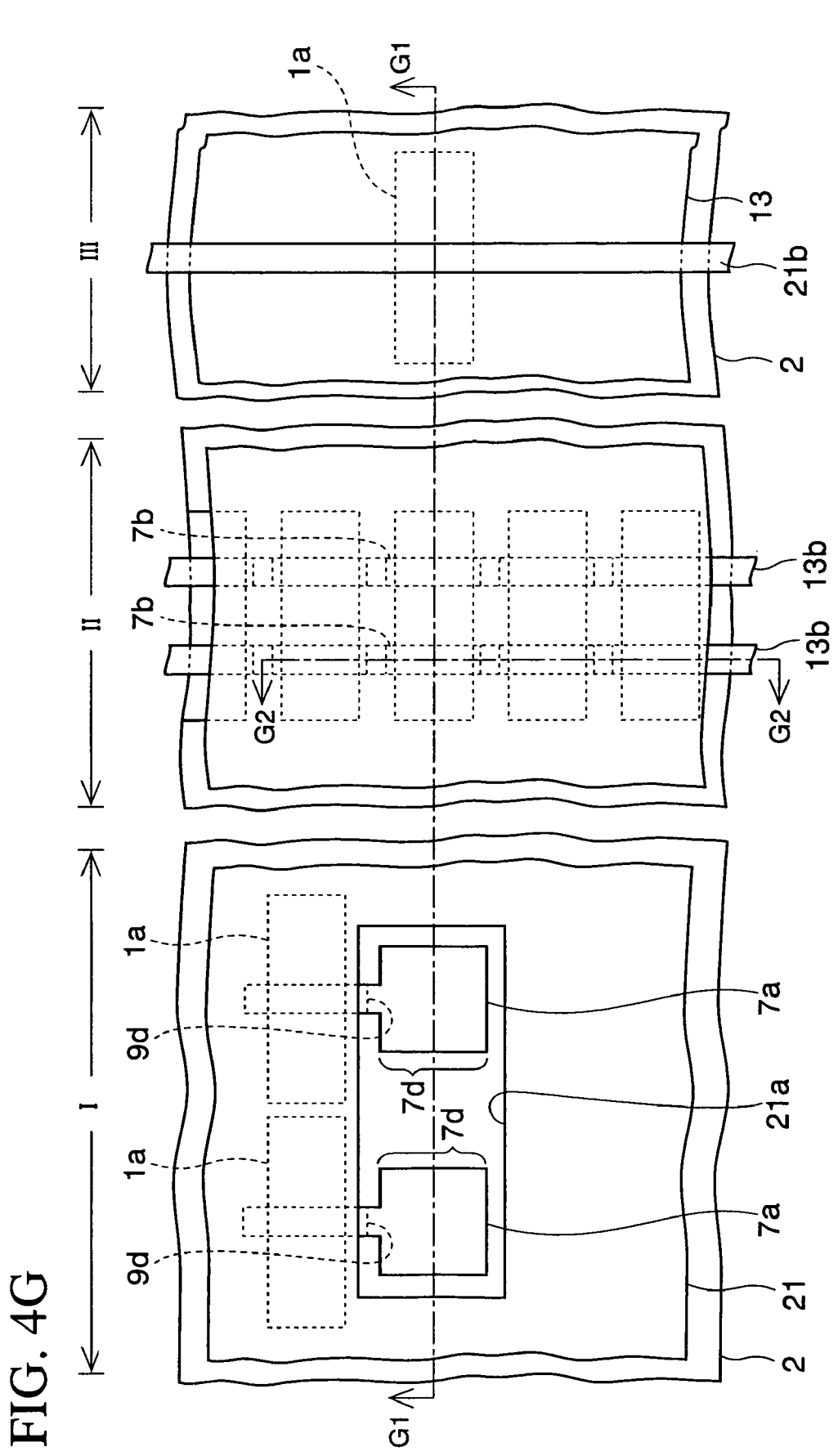

FIG. 4G is a plan view of the structure after this process has been completed. The upper portion in FIG. 1N corresponds to a cross section taken along line G1—G1 in FIG. 4G, and the lower portion corresponds to a cross section taken along line G2—G2.

As is shown in FIG. 4G, for the fourth resist pattern 21, a third window 21a, which is larger than the pad 7d of the first gate electrode 7a, is present in the first peripheral circuit region I, and a third resist portion 21b, having a gate electrode shape, is present in the second peripheral circuit region III.

Following this, as is shown in FIG. 1O, using the fourth resist pattern 21 as a mask, the conductors 13a in the first circuit region I and the second conductive film 13 in the second peripheral circuit region III are anisotropically etched by using RIE (Reactive Ion Etching), for example. As a result, in the first peripheral circuit region I, the conductors 13a are removed from the pads 7d (see FIG. 4F) of the first gate electrodes 7a, and in the second peripheral circuit region III, the second conductive film 13 is patterned for employment as a second gate electrode 13c for a peripheral transistor.

During the above anisotropic etching, however, since the second conductors 13a are behind the tapered side surfaces 13e of the second conductors 13a, the etching can not completely remove the second conductors 13a near the side surfaces 13e, and the etching residues 13f of the second conductors 13a remain, as indicated in a broken line circle.

Figure 4H:
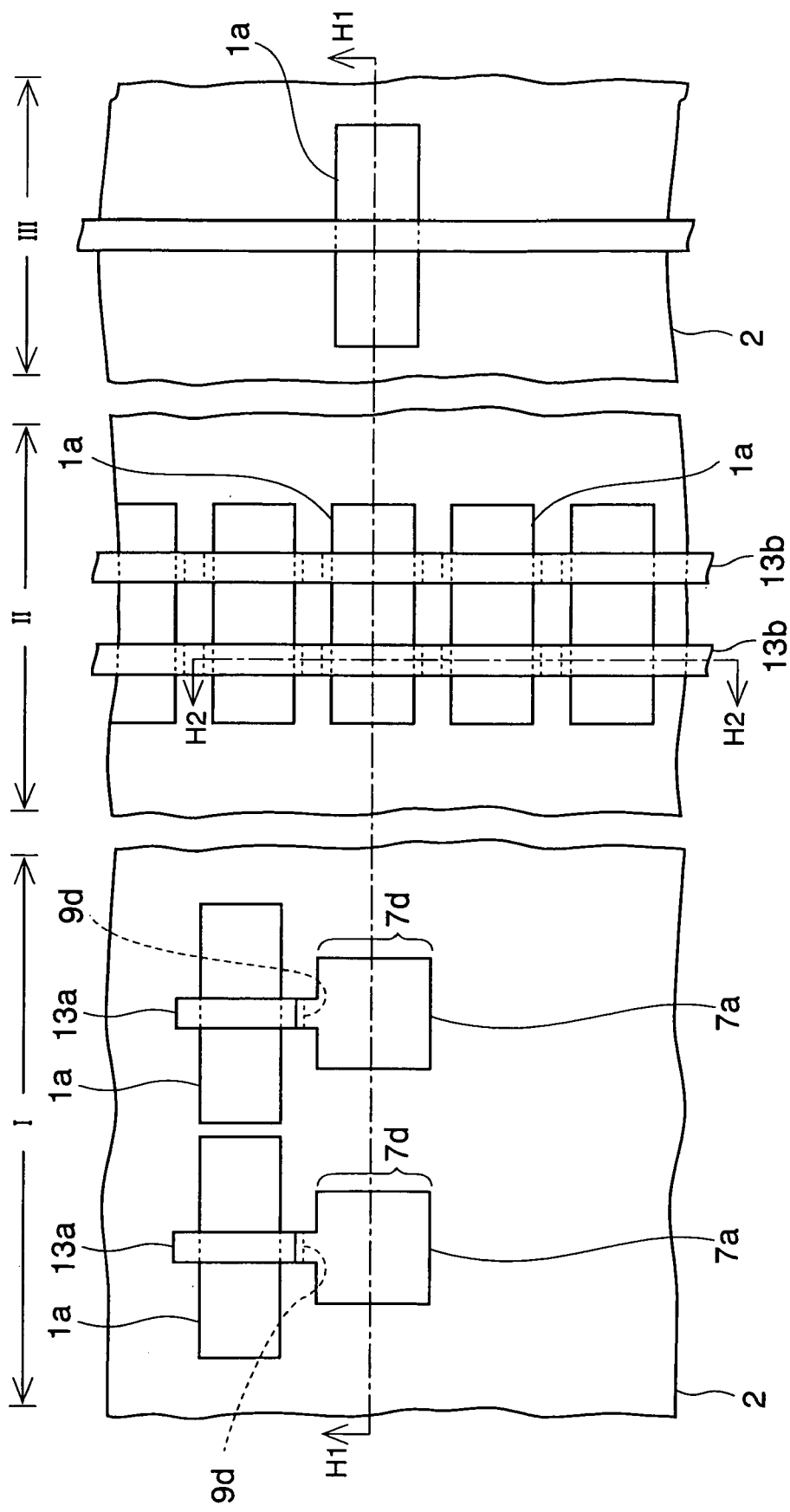

FIG. 4H is a plan view of the structure after this process has been completed. The upper portion in FIG. 1O corresponds to a cross section taken along line H1—H1 in FIG. 4H, and the lower portion corresponds to a cross section taken along line H2—H2.

Then, as is shown in FIG. 1P, an n-type impurity is implanted in the silicon substrate 1, using the second gate electrode 13c as a mask, and third n-type source/drain extensions 18c are formed on either side of the second gate electrode 13c.

Next, as is shown in FIG. 1Q, an oxide silicon film is formed on the entire surface, and etched back to form second insulating side walls 22 in each regions I to III. Further, the performance of the etch back process is continued, i.e., the third insulating films 12 are etched from the first gate electrodes 7a, using the second insulating side walls 22 as masks, and second openings 12a are formed in the third insulating films 12, exposing the contact regions CR of the first gate electrodes 7a from the second openings 12a. Furthermore, through this etching back process, in the cell region II and the second peripheral circuit region III, the first insulating films 15 and the third insulating films 12 are patterned and respectively left as tunnel insulating films 15b and second gate insulating films 12b under the floating gates 7b and the second gate electrodes 13c.

FIG. 4I is a plan view of the structure after this process has been completed. The upper portion in FIG. 1Q corresponds to a cross section taken along line I1—I1 in FIG. 4I, and the lower portion corresponds to a cross section taken along line I2—I2.

Thereafter, as is shown in FIG. 1R, an n-type impurity is implanted in the cell region II and the second peripheral circuit region III, and second and third n-type source/drain regions 25b and 25c are formed in the silicon substrate 1 on either side of the floating gates 7b and the second gate electrodes 13c.

Therefore, obtained in the cell region II are two flash memory cells FL, each constituted by a control gate 13b, the intermediate insulating film 9e, the floating gate 7b and the second n-type source/drain region 25b.

In the second peripheral circuit region III, a peripheral transistor TR is obtained that is constituted by the second gate electrode 13c, the second gate insulating film 12b and the third n-type source/drain region 25c.

Figure 3C:
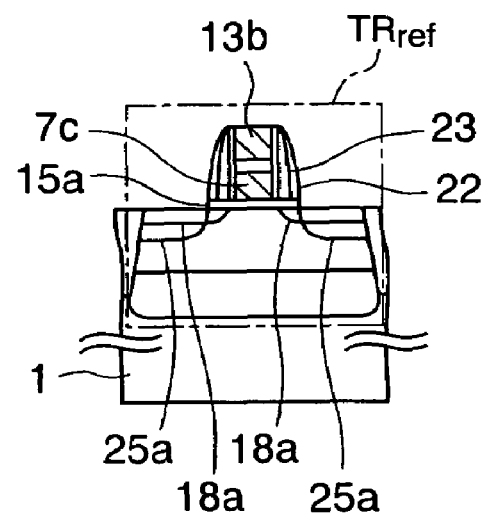
FIG. 3C is a cross-sectional view taken along line I3—I3 in FIG. 4I after second and third n-type source/drain regions have been formed.

FIG. 3C is a cross-sectional view of the structure taken along line I3—I3 in FIG. 4I after the second and third n-type source/drain regions 25b and 25c are formed in the above described manner. As is shown in FIG. 3C, in the ion implantation process for the second and third n-type source/drain regions 25b and 25c, the first n-type source/drain regions 25a are formed in the silicon substrate 1 on either side of the gate 7c. Further, under the gate 7c the first insulating film 15, which is not removed during the etch back process (see FIG. 1Q) for the second insulating side wall 22, remains as the first gate insulating film 15a. As a result, obtained in the first peripheral circuit region I is a reference transistor $TR_{ref}$ constituted by the first gate 7c, the first gate insulating film 15a and the first n-type source/drain regions 25a.

Following this, as is shown in FIG. 1S, a refractory metal layer is formed on the entire surface and is heated to react with silicon, so that a silicide layer 26 is formed in the individual regions I to III.

At this time, since the upper end portions of the etching residues 13f of the second conductors 13a, made of polysilicon, are also unnecessarily silicided, unnecessary silicide portions 26a are generated at the upper ends.

Figure 5:
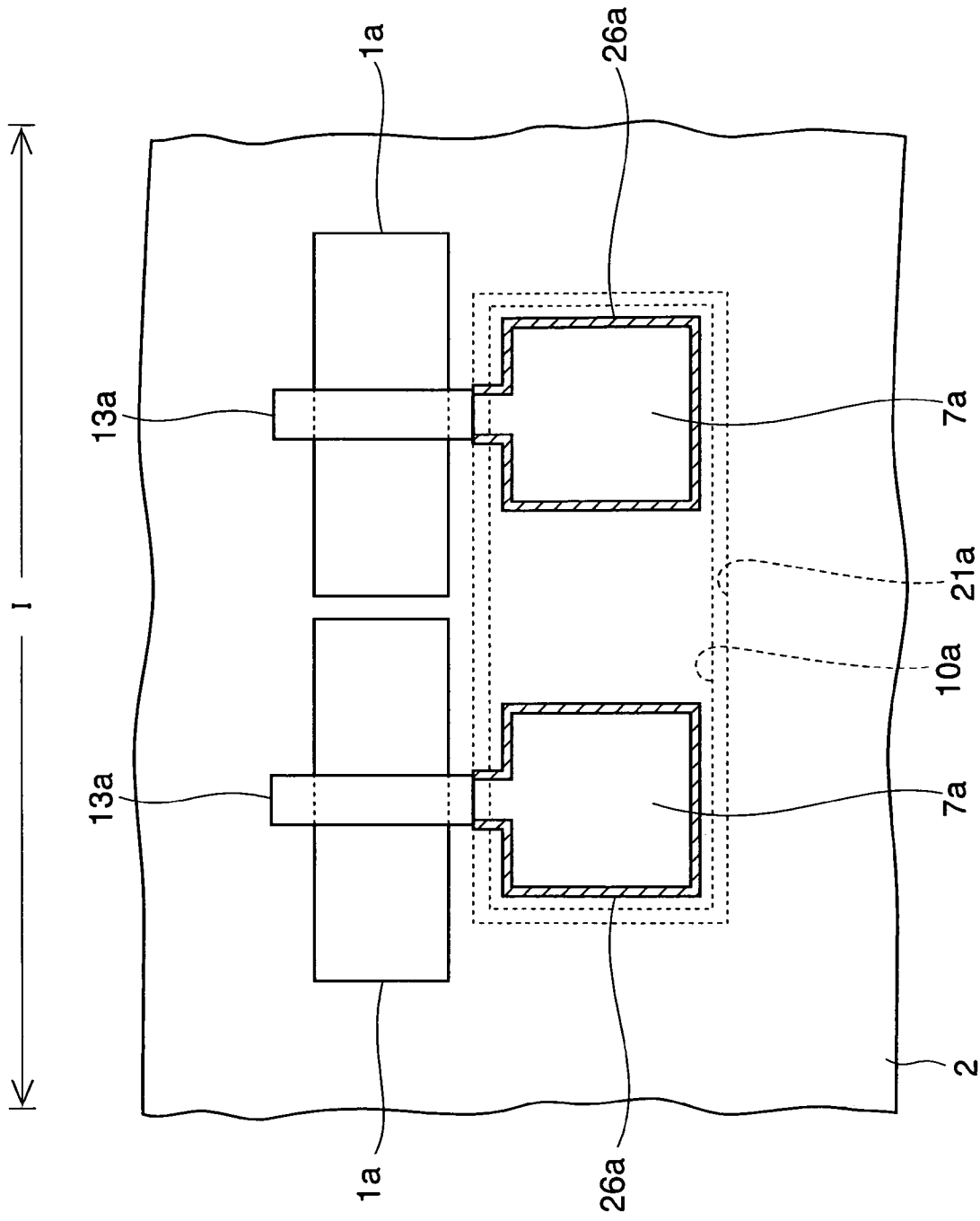
FIG. 5 is a plan view of the hypothetical semiconductor device during the manufacturing process.

FIG. 5 is an enlarged plan view of the first peripheral circuit region I after this process has been completed. As is shown in FIG. 5, the unnecessary silicide portions 26a are located on the first gate electrodes 7a inside the third windows 21a (see FIG. 4G) of the fourth resist pattern 21.

A fourth insulating film 27 is formed on the entire surface, as is shown in FIG. 1T, and is then patterned, as is shown in FIG. 1U, to form first to third holes 27a to 27c. Of these holes, the first, holes 27a, are located in the contact regions CR of the first gate electrodes 26, and the second and third, holes 27b and 27c, are respectively located in the second and third n-type source/drain regions 25b and 25c. Thereafter, for electrical connection to the contact regions CR of the first gate electrodes 26, first conductive plugs 28a are formed in the first holes 27a and second and third conductive plugs 28b and 28c are formed inside the second and third holes 27b and 27c.

Figure 4J:
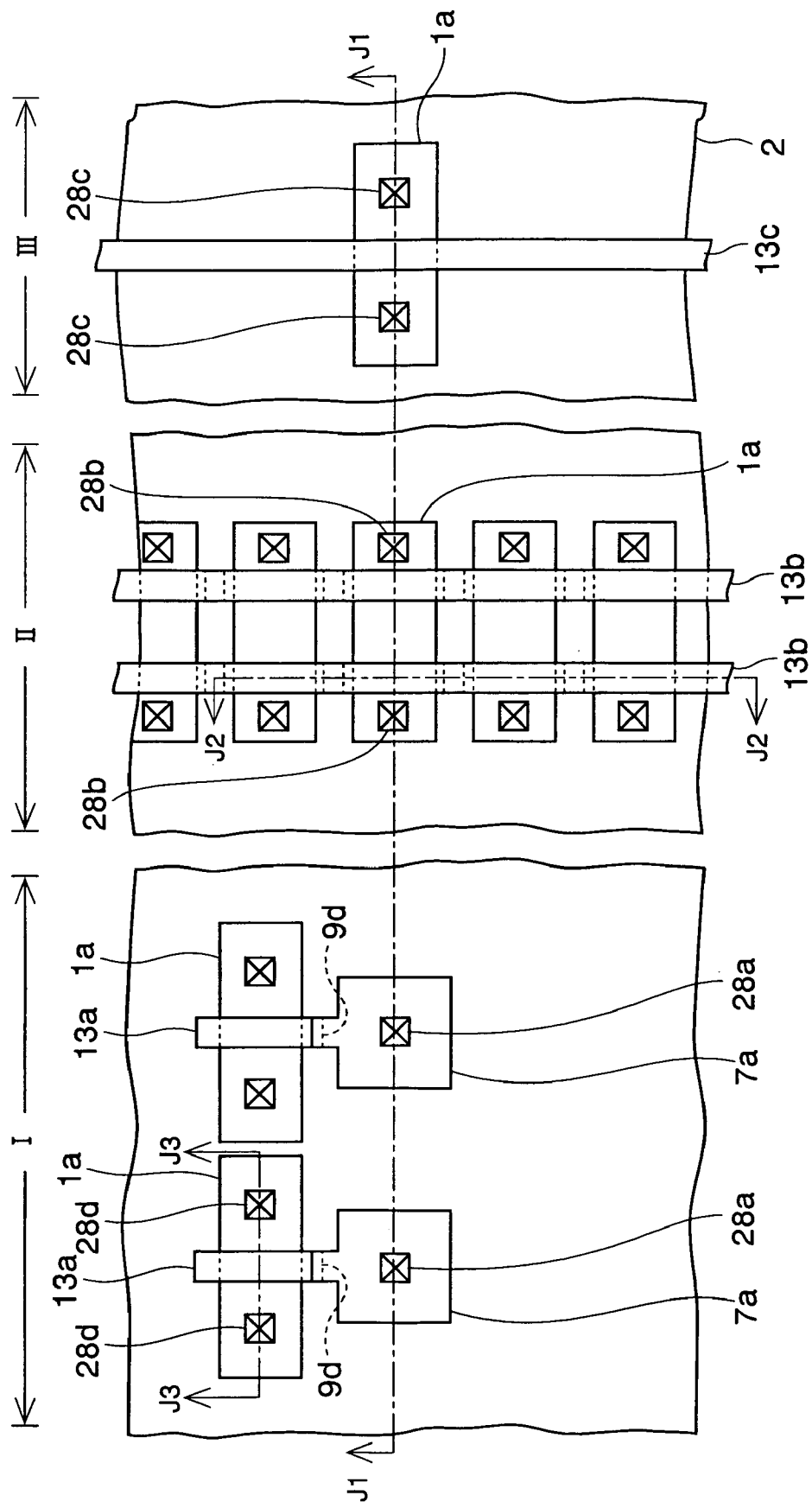

FIG. 4J is a plan view of the structure after this process has been completed. The upper portion in FIG. 1U corresponds to a cross section taken along line J1—J1 in FIG. 4J, and the lower portion corresponds to a cross section taken along line J2—J2.

Figure 3D:
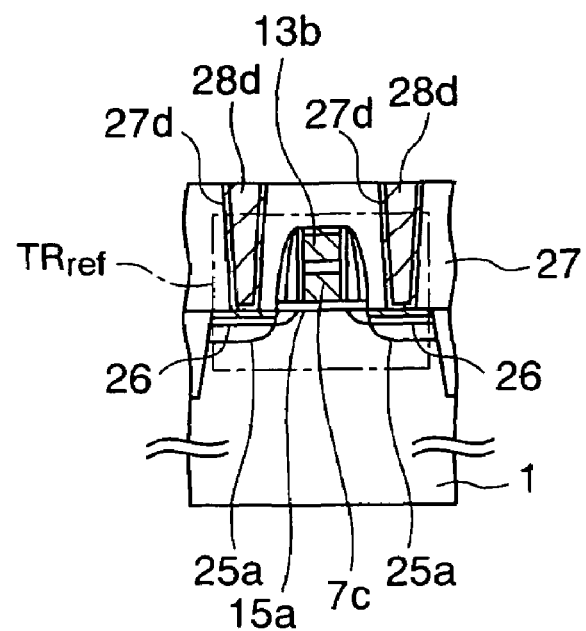
FIG. 3D is a cross-sectional view taken along line J3—J3 in FIG. 4J.

FIG. 3D is a cross-sectional view taken along line J3—J3 in FIG. 4J. As is shown in FIG. 3D, fourth holes 27d are formed in the fourth insulating film 27 on the first n-type source-drain regions 25a, and fourth conductive plugs 28d are embedded in the fourth holes 27d.

The basic structure of the hypothetical semiconductor device is thus completed.

For this semiconductor device, the breakdown voltage of the tunnel insulating film 15b (see FIG. 1R) of the flash memory cell FL can be monitored by using the reference transistor $TR_{ref}$ shown in FIG. 3D. To monitor the breakdown voltage, a predetermined voltage is applied to the first n-type source/drain regions 25a through the fourth conductive plugs 28d in FIG. 3D, and in this state, the potential of the gate 7c is increased through the first conductive plug 28a (see FIG. 1U). When a breakdown occurs in the first gate insulating film 15a and electrons are injected in the gate 7c, a current flows across the first conductive plug 28a. By detecting this current, breakdown voltage of the tunnel insulating film 15b, which is formed in the same process as that of the first gate insulating film 15a, can be examined.

According to the above described method of manufacturing a semiconductor device, during the etching process shown in FIG. 1J, in which the third resist pattern 16 is used as a mask, thick portion 9f of the silicon oxide function as a mask for the first conductive film 7, thus generating etching residue 7f of the first conductive film 7.

However, when the etching residue 7f thus generates, the etching residue 7f would float in the liquid in the succeeding wetting process and be attached to another portion of the silicon substrate 1, so that a device failure may be occur at that portion and the yield may be reduced. In addition, even when floating of the etching residue 7f does not occur, since the etching residue 7f is present linearly along the first opening 9d in the second conductive film 9, it may short-circuit the two first gate electrodes 7a in the first peripheral circuit region I.

Furthermore, as is shown in FIG. 1J, the outer side surfaces 13e are inclined and tapered during the etching of the second conductors 13a. Therefore, during the process in FIG. 1O of removing the conductor 13a, the etching residues 13f (see FIG. 1O) of the second conductors 13a are left on the side surfaces 13e, and accordingly, the unnecessary silicide portions 26a shown in FIG. 1S are generated. As well as the etching residue 7f of the first conductive film 7, the unnecessary silicide portion 26a is not preferable because it could cause a device failure or a short circuit.

The present inventor considered the following preferred embodiments in order to resolve problems attributable to the etching residue 7f and the unnecessary silicide portions 26a.

(2) First Embodiment

Figure 6A:
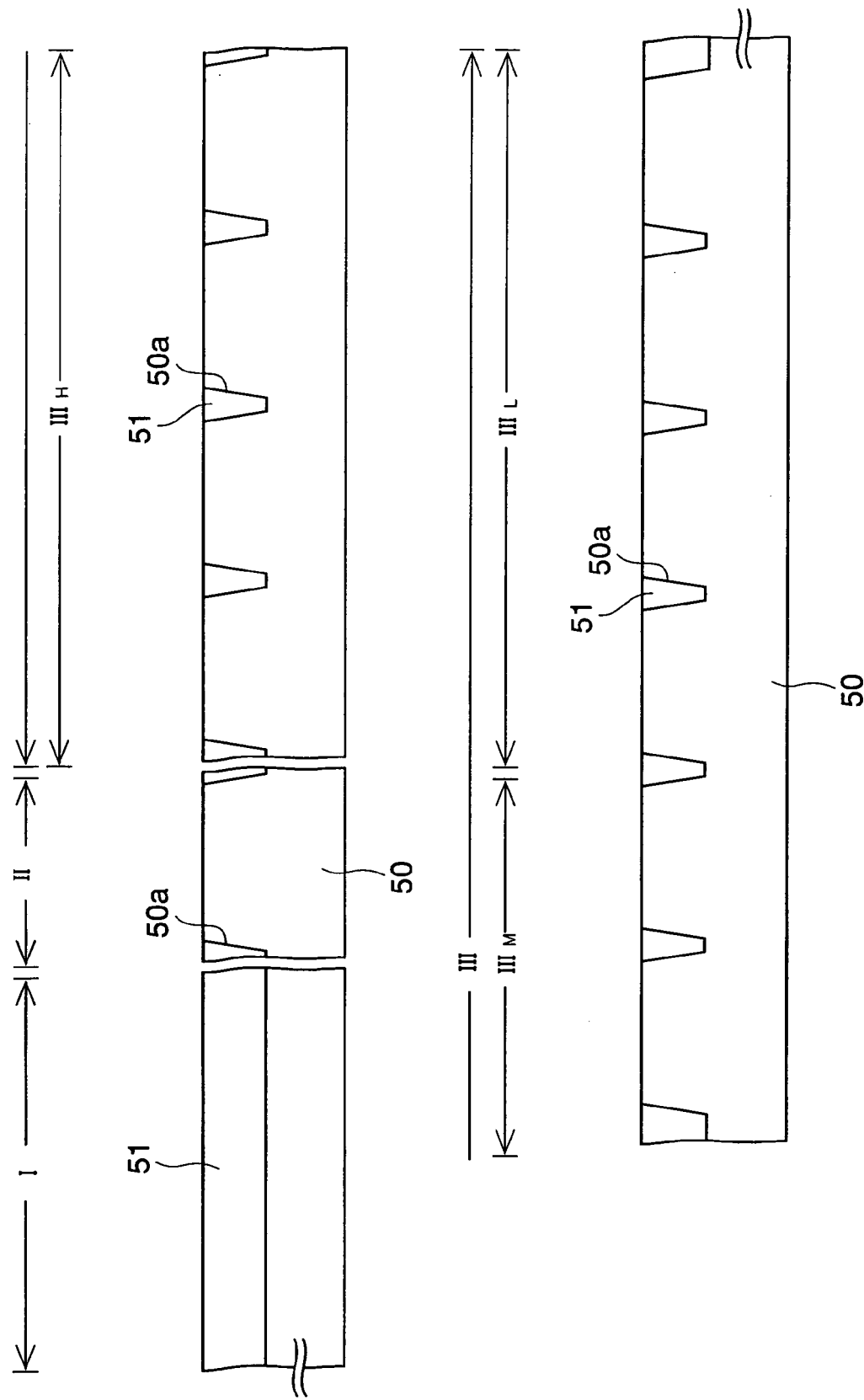
FIGS. 6A to 6U are cross-sectional views of a semiconductor device according to a first embodiment of the present invention.
Figure 6B:
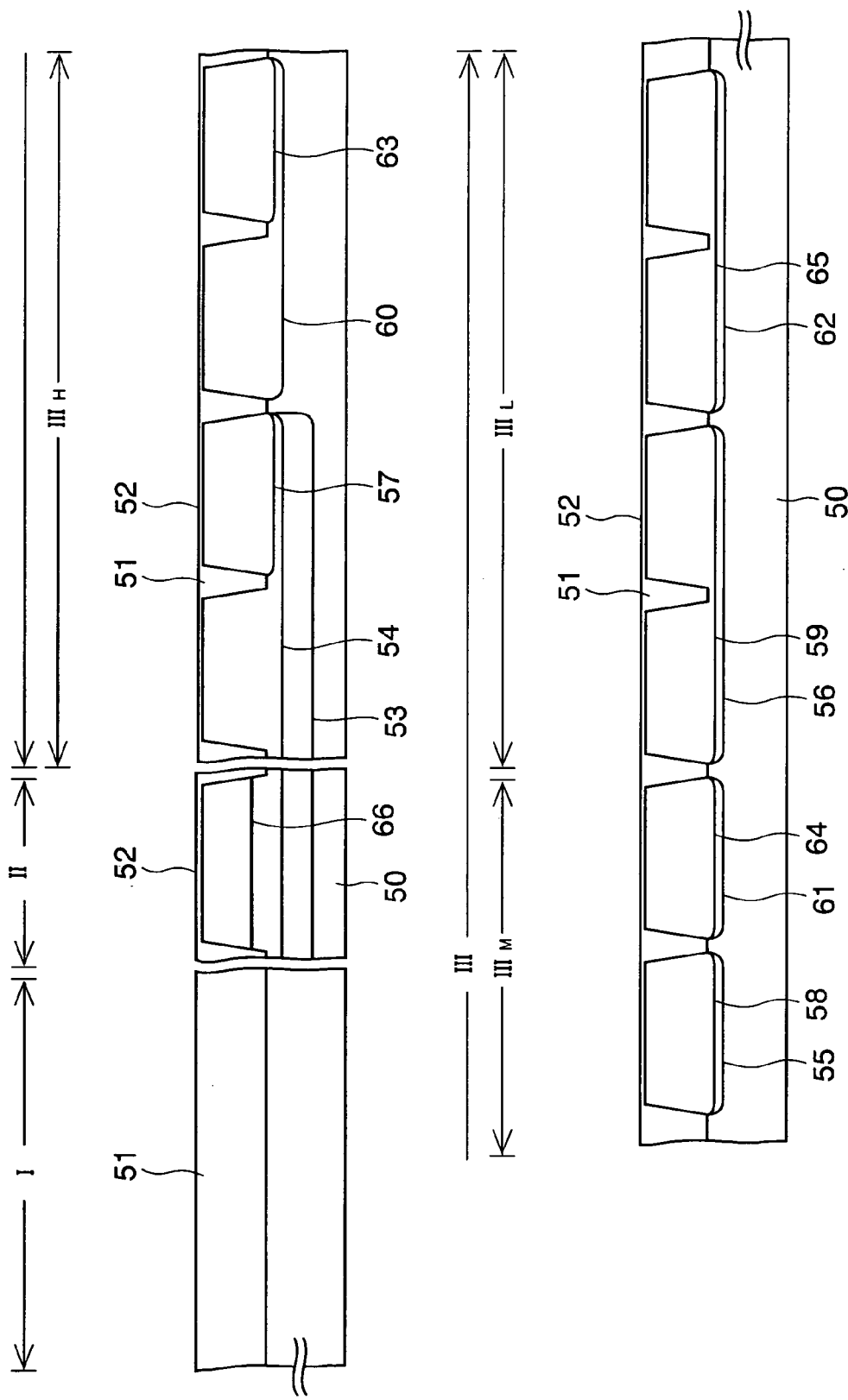
Figure 6C:
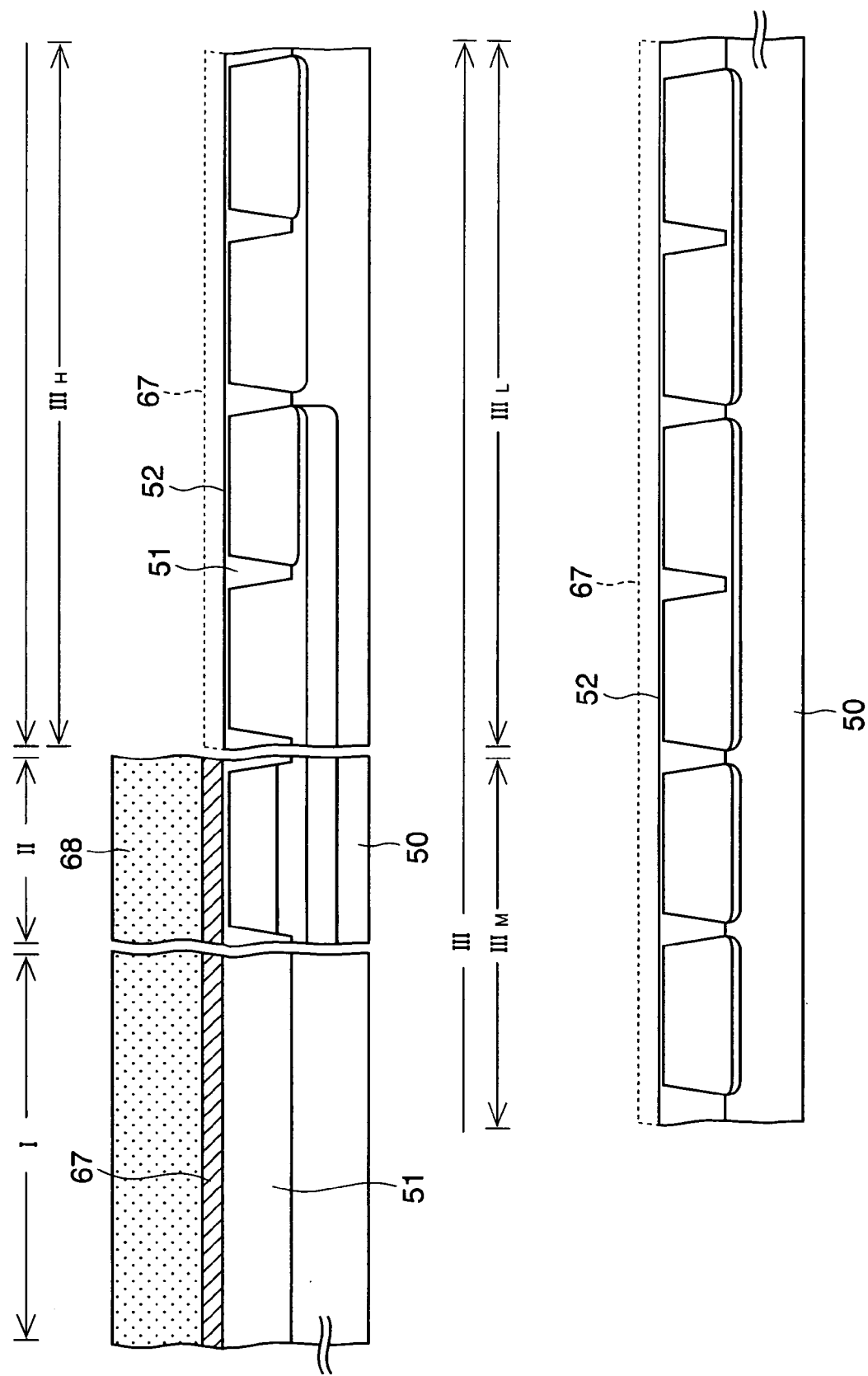
Figure 6G:
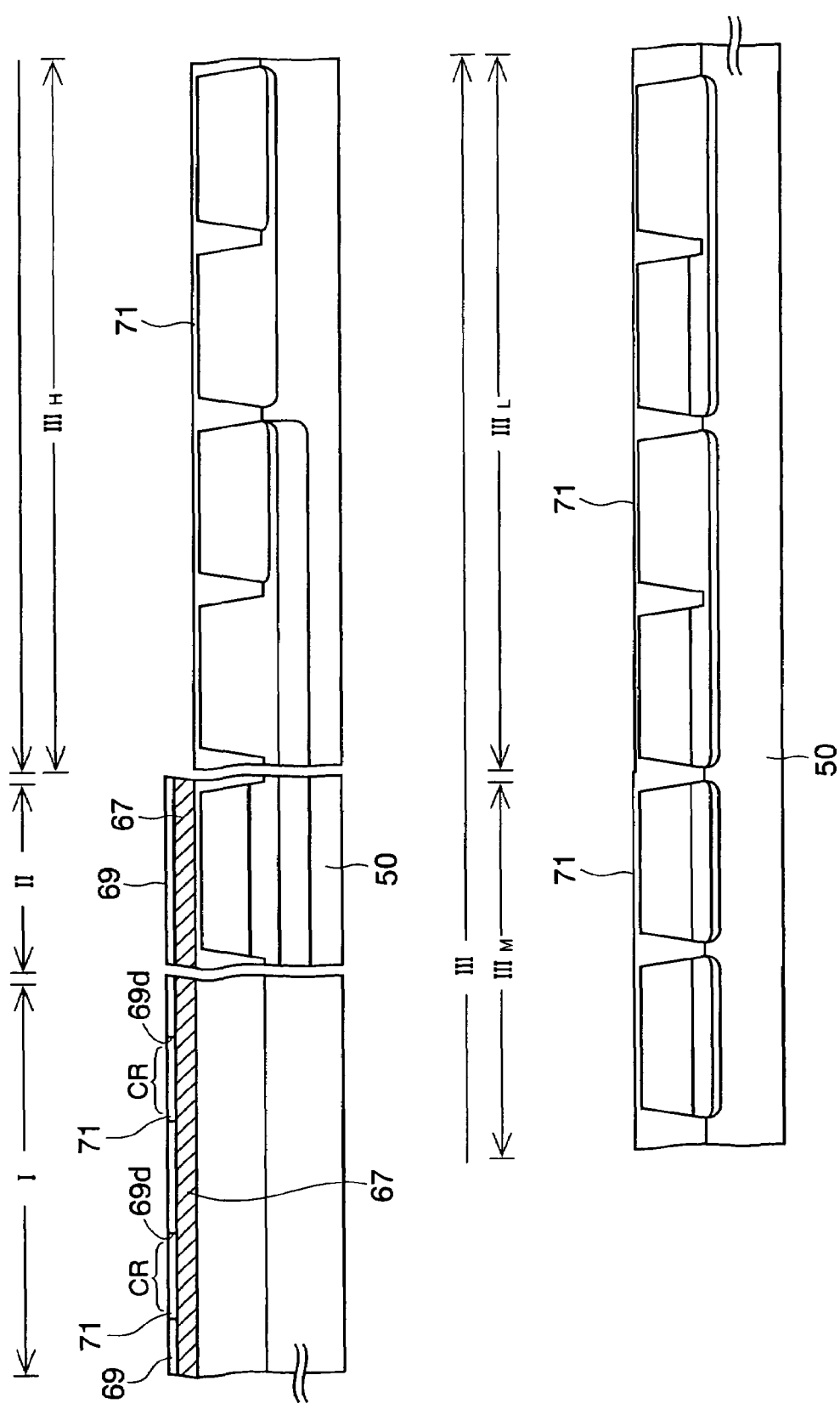
Figure 6H:
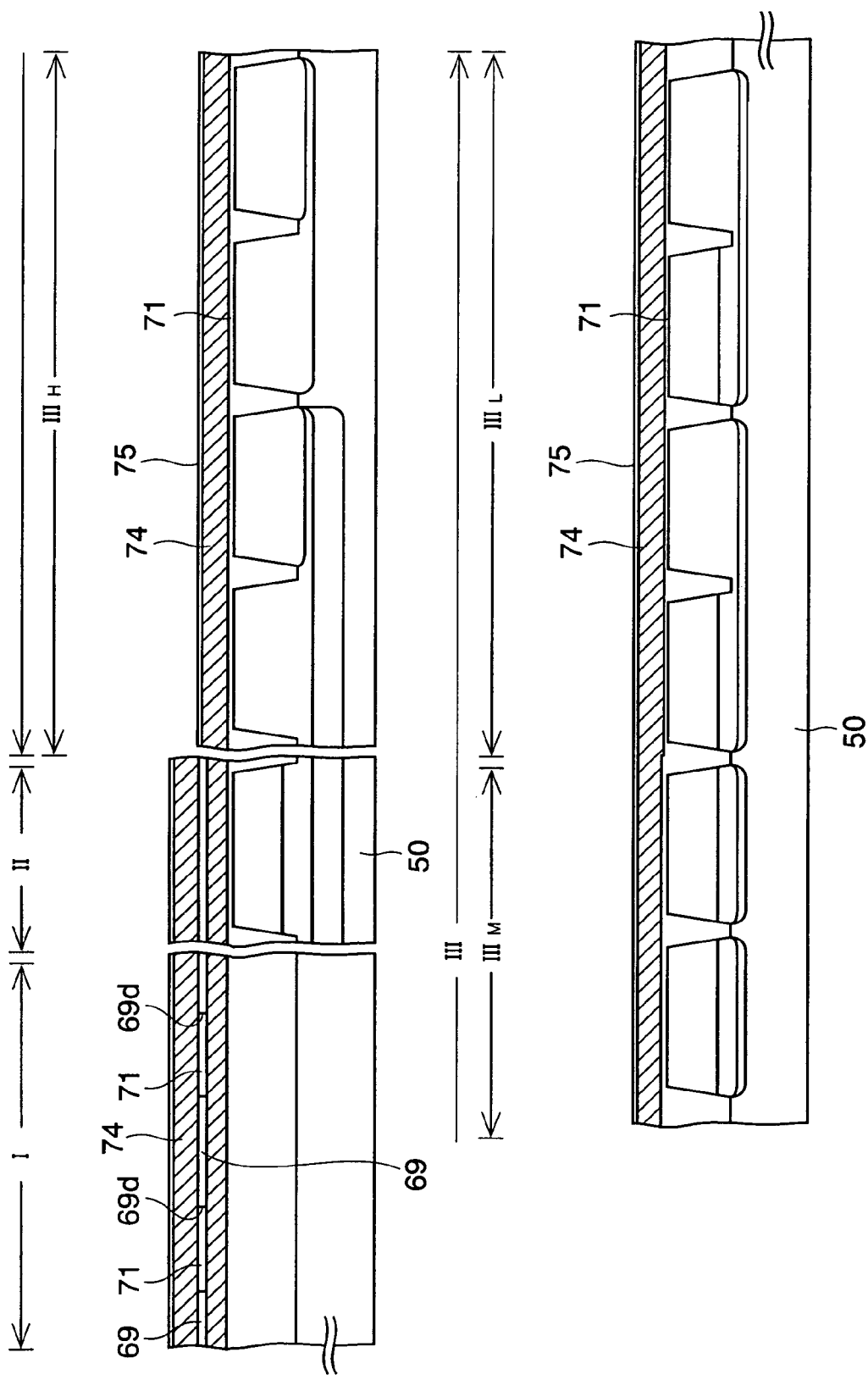
Figure 6I:
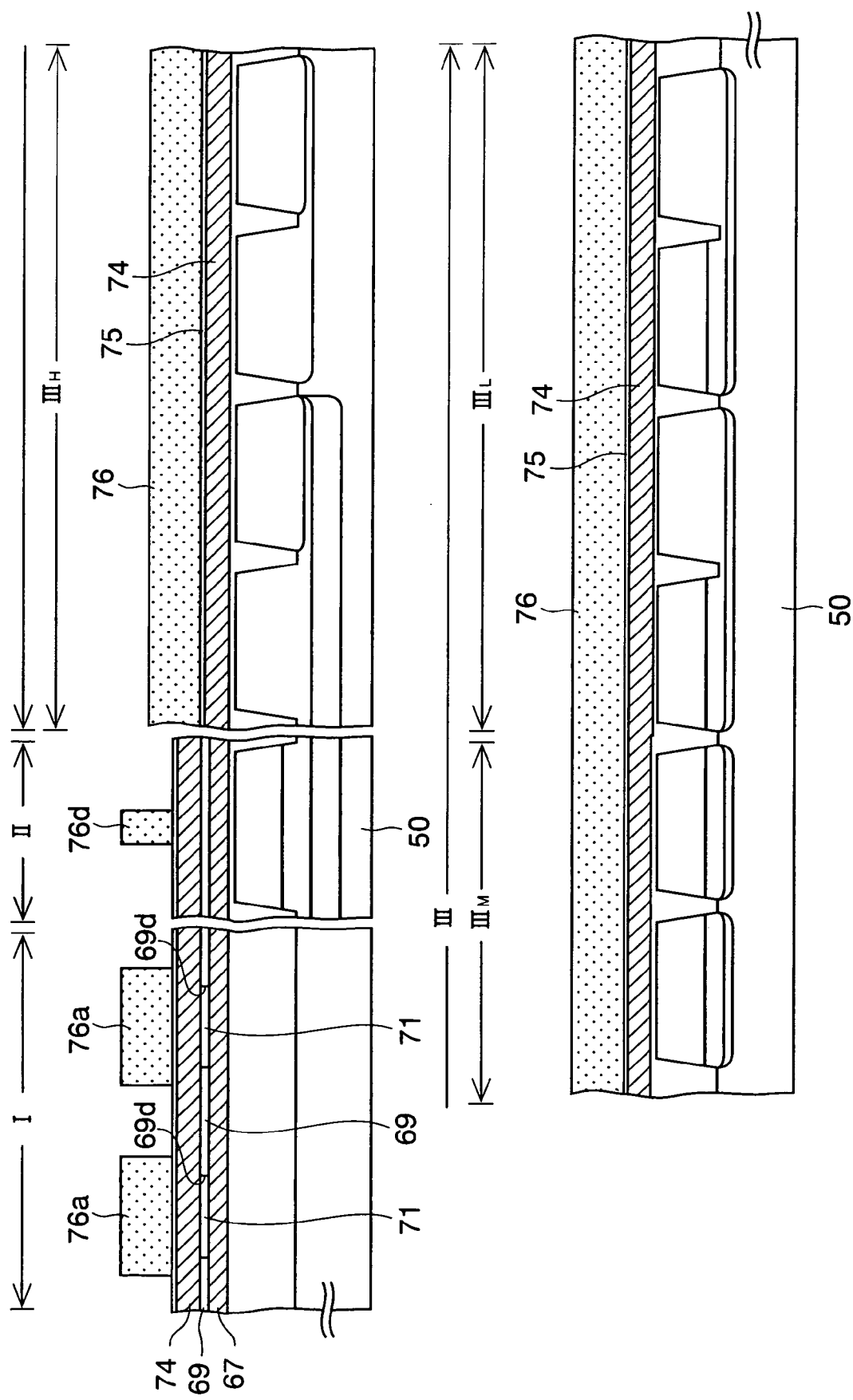
Figure 6J:
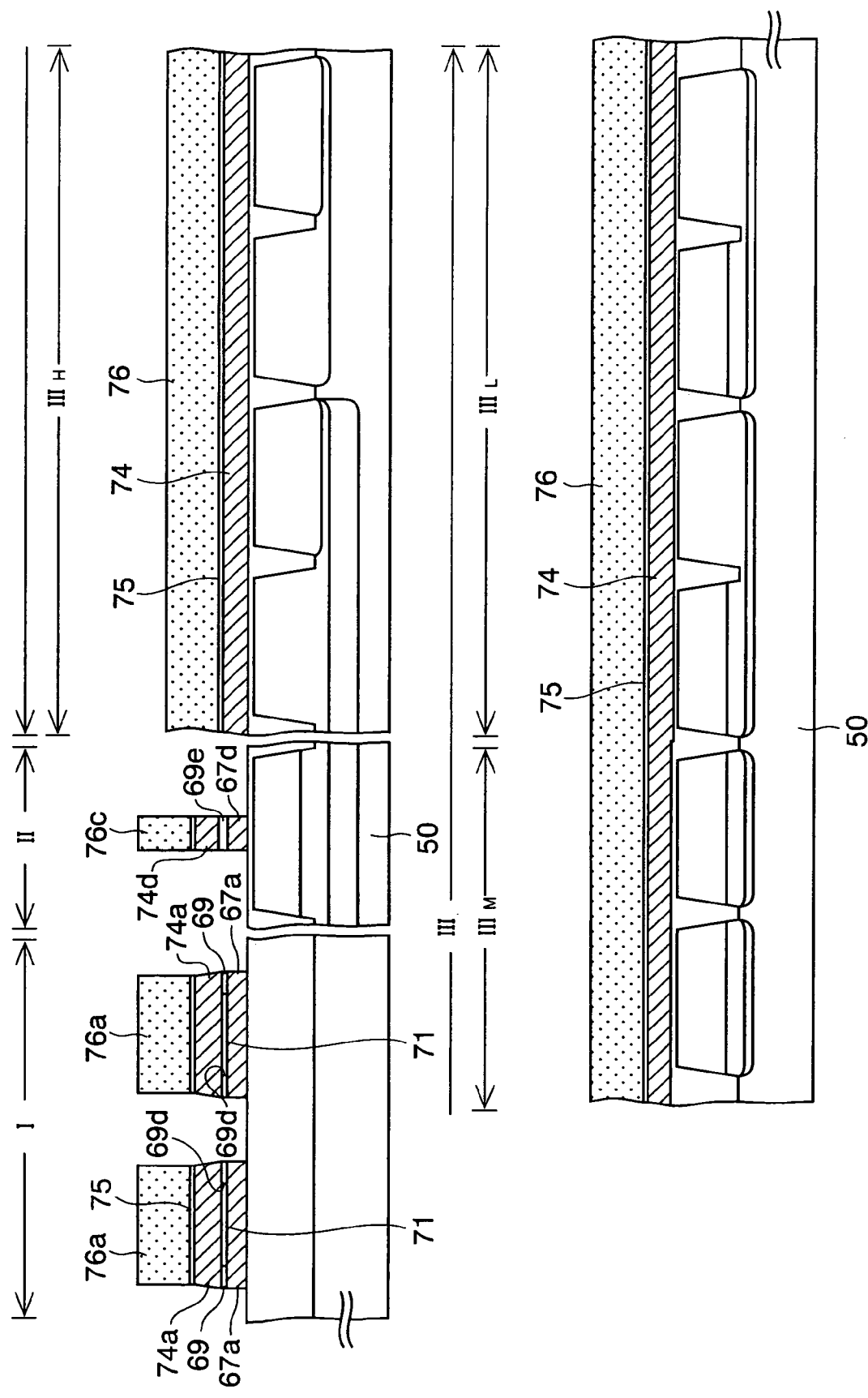
Figure 6K:
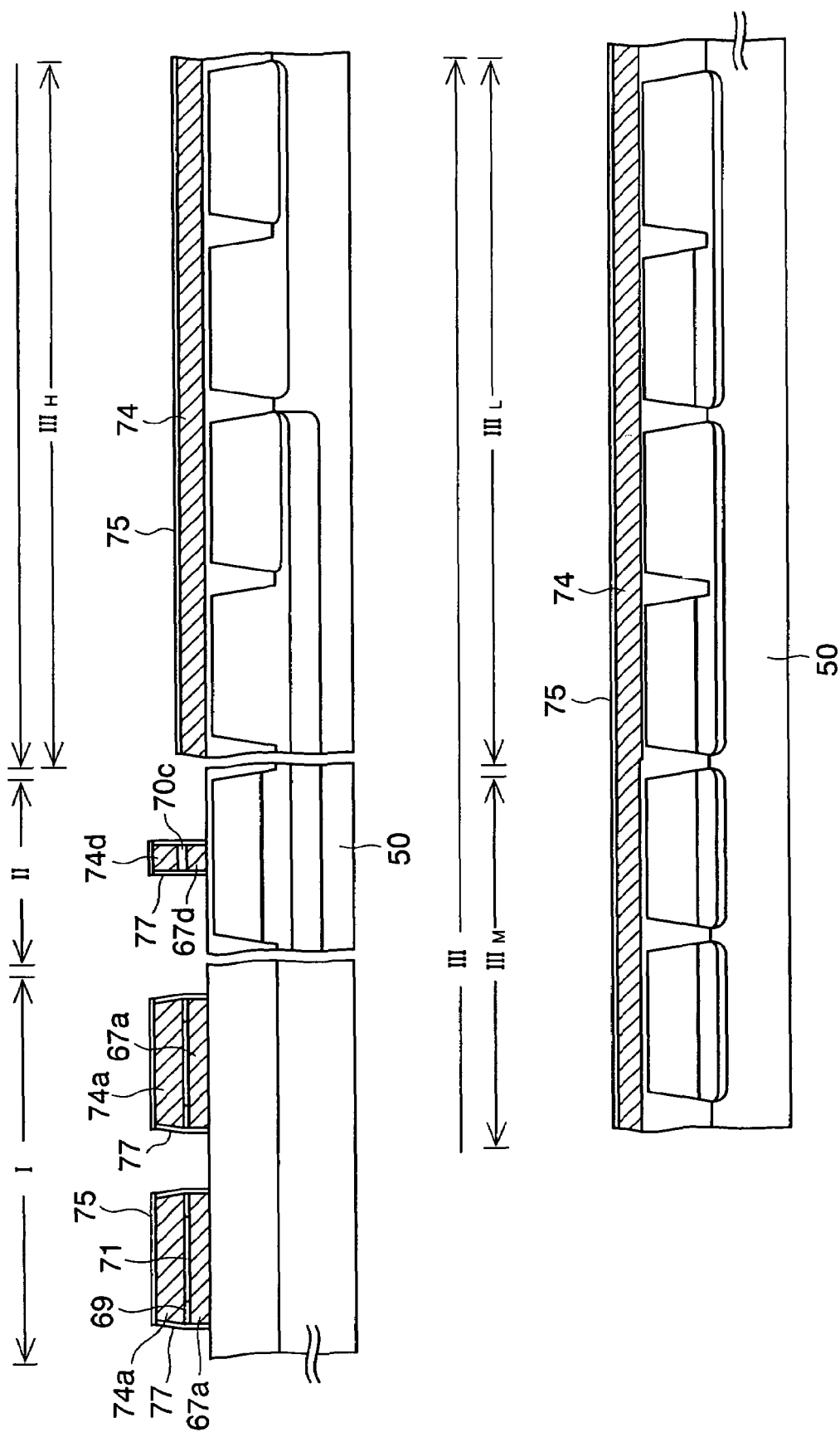
Figure 6N:
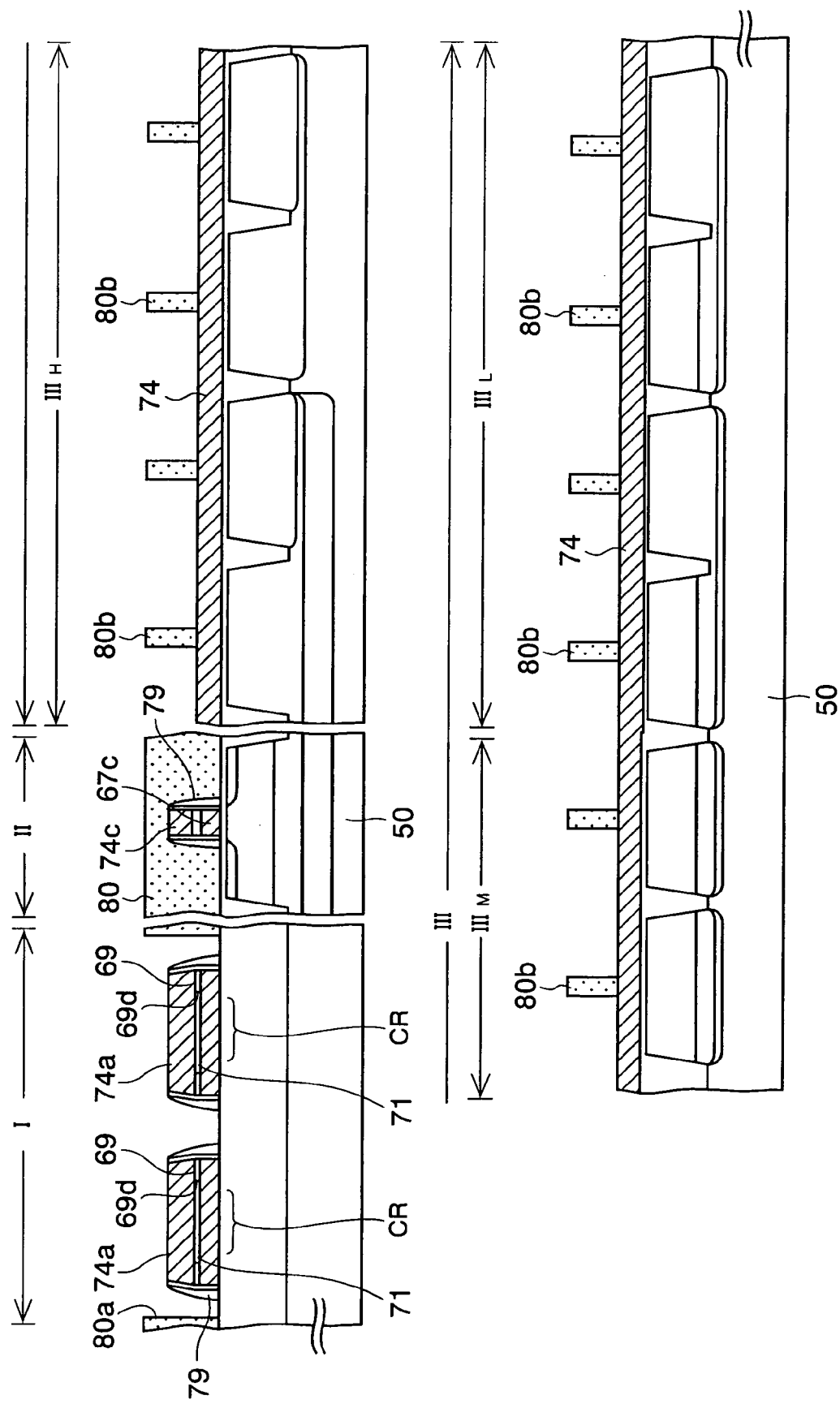
Figure 60:
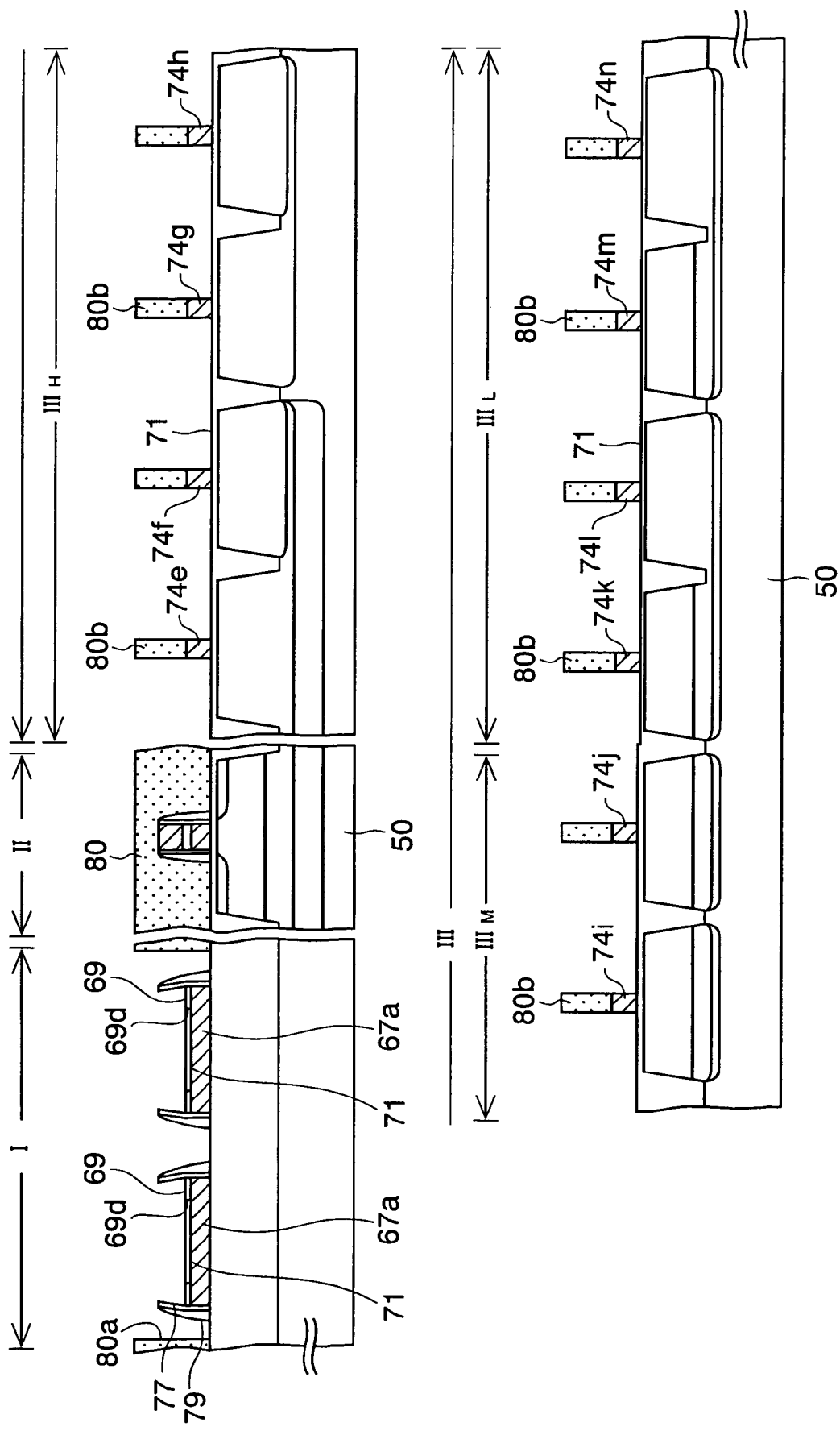
Figure 6P:
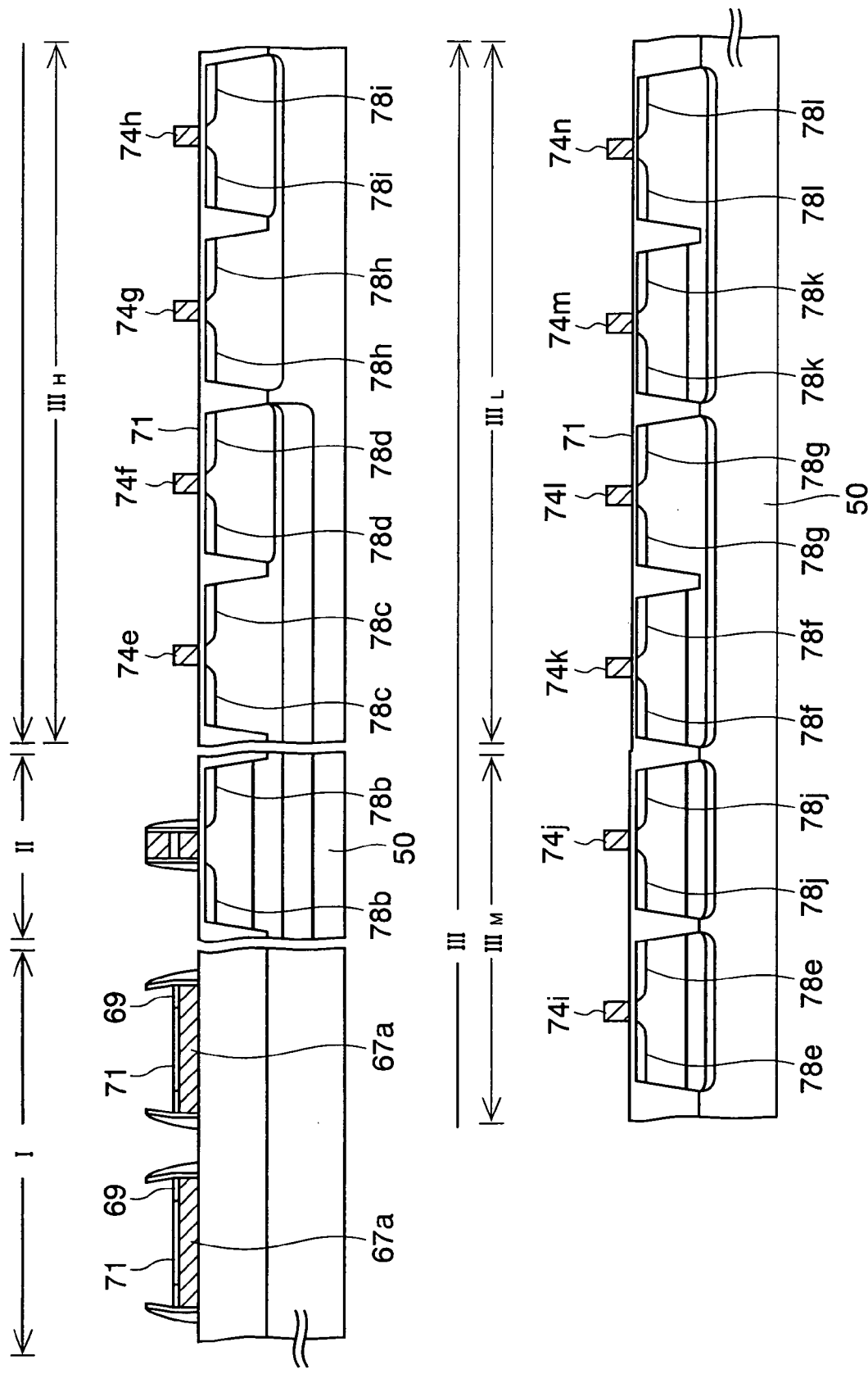
Figure 6Q:
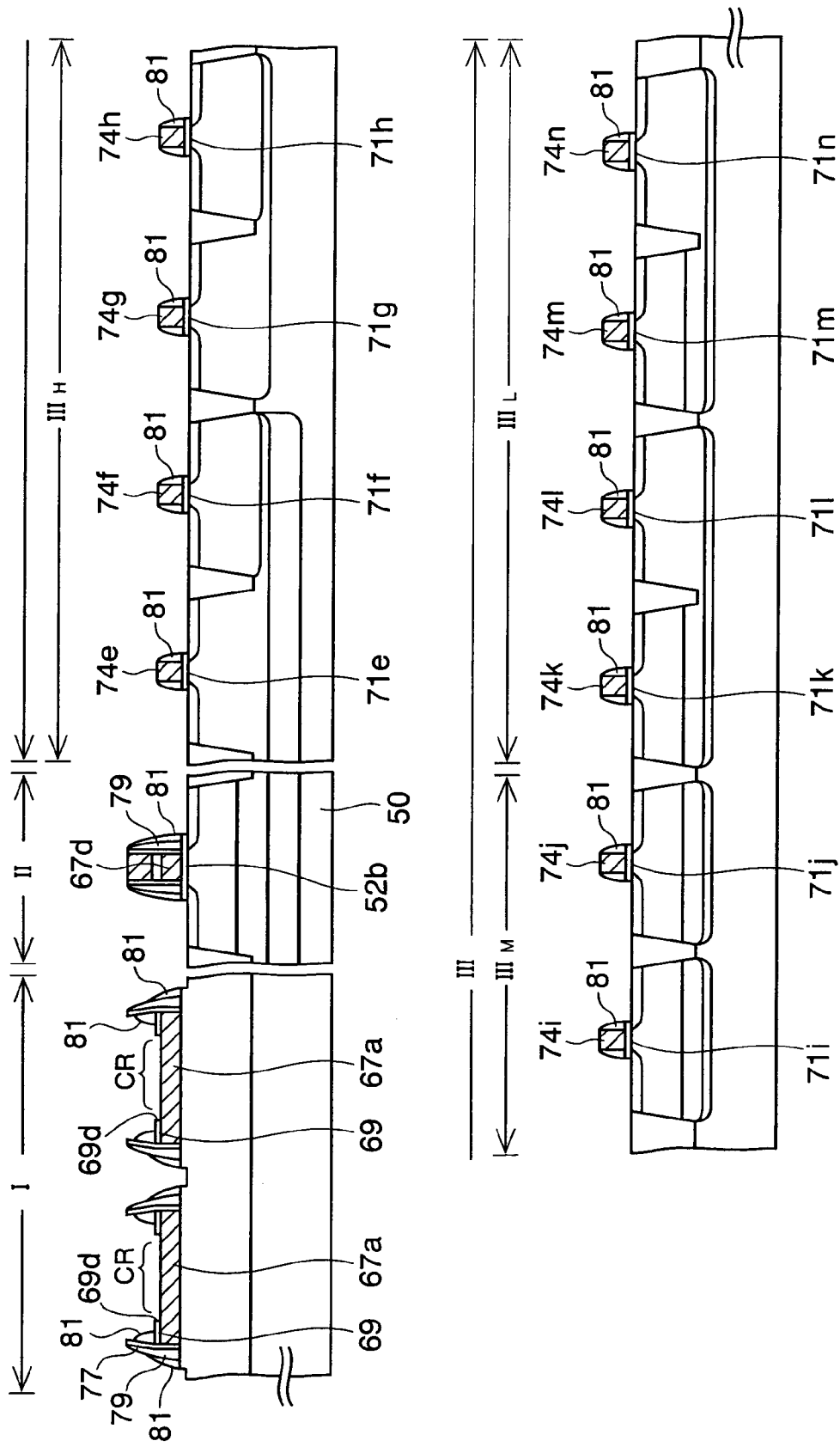
Figure 6R:
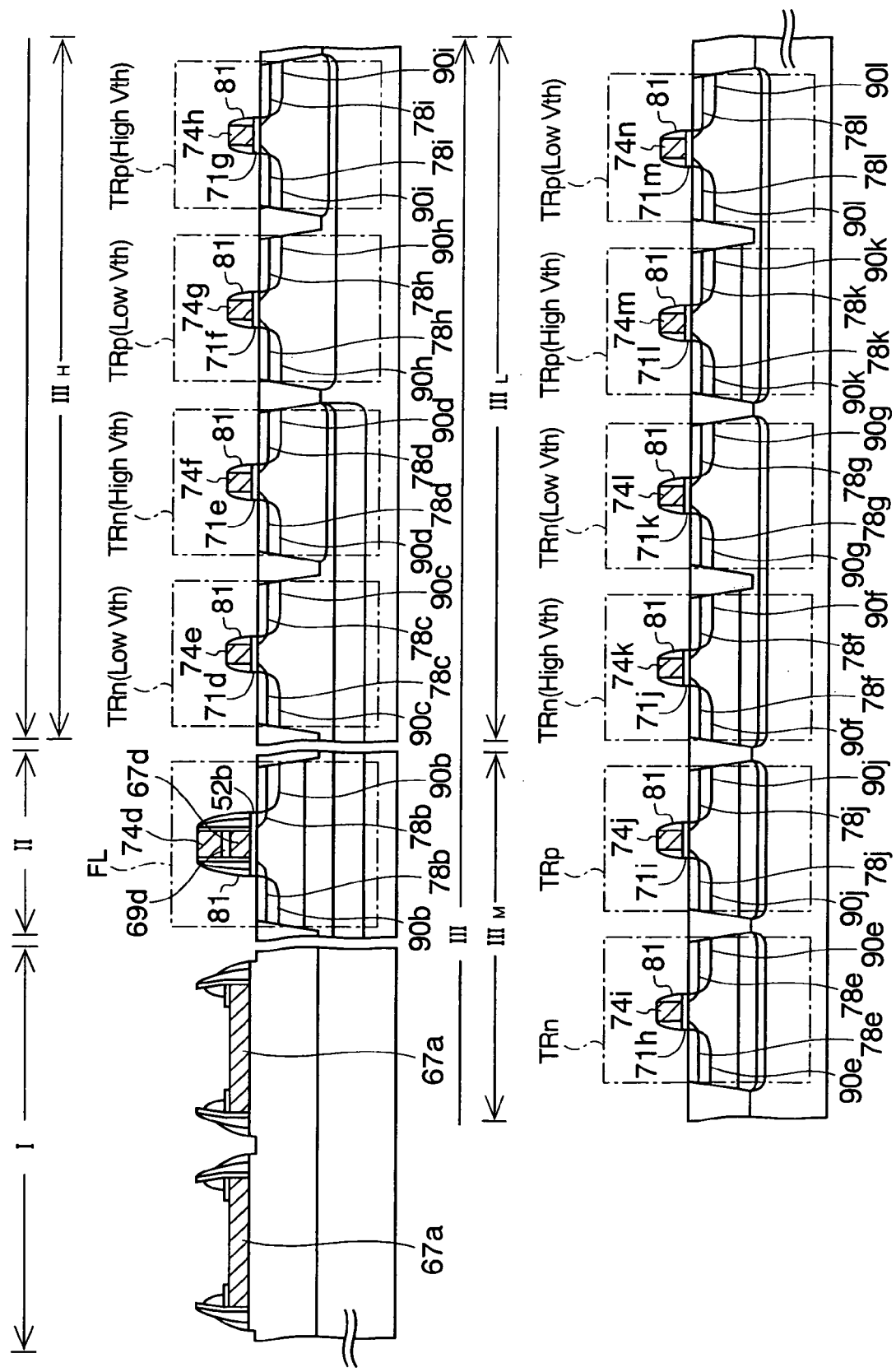
Figure 6S:
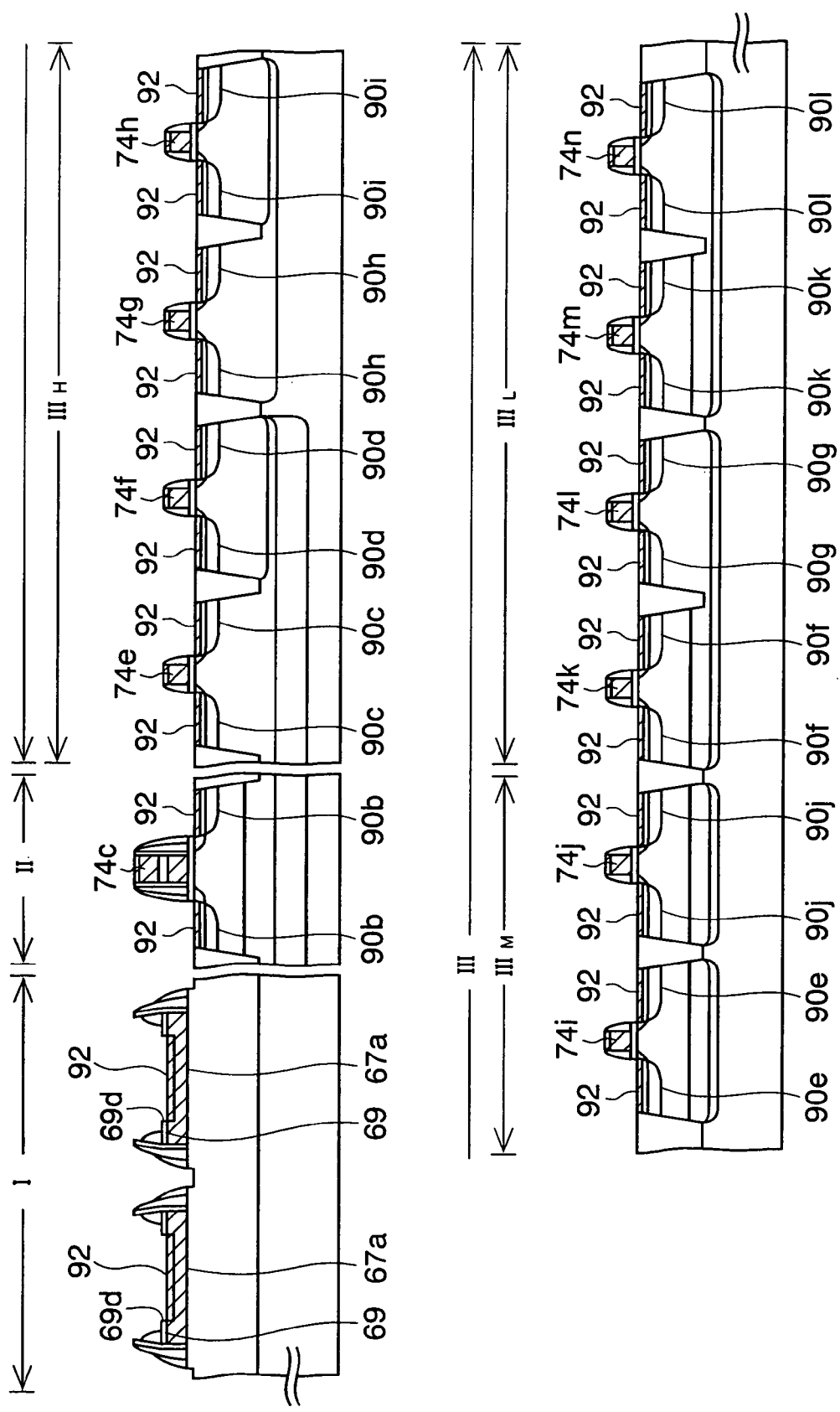
Figure 6U:
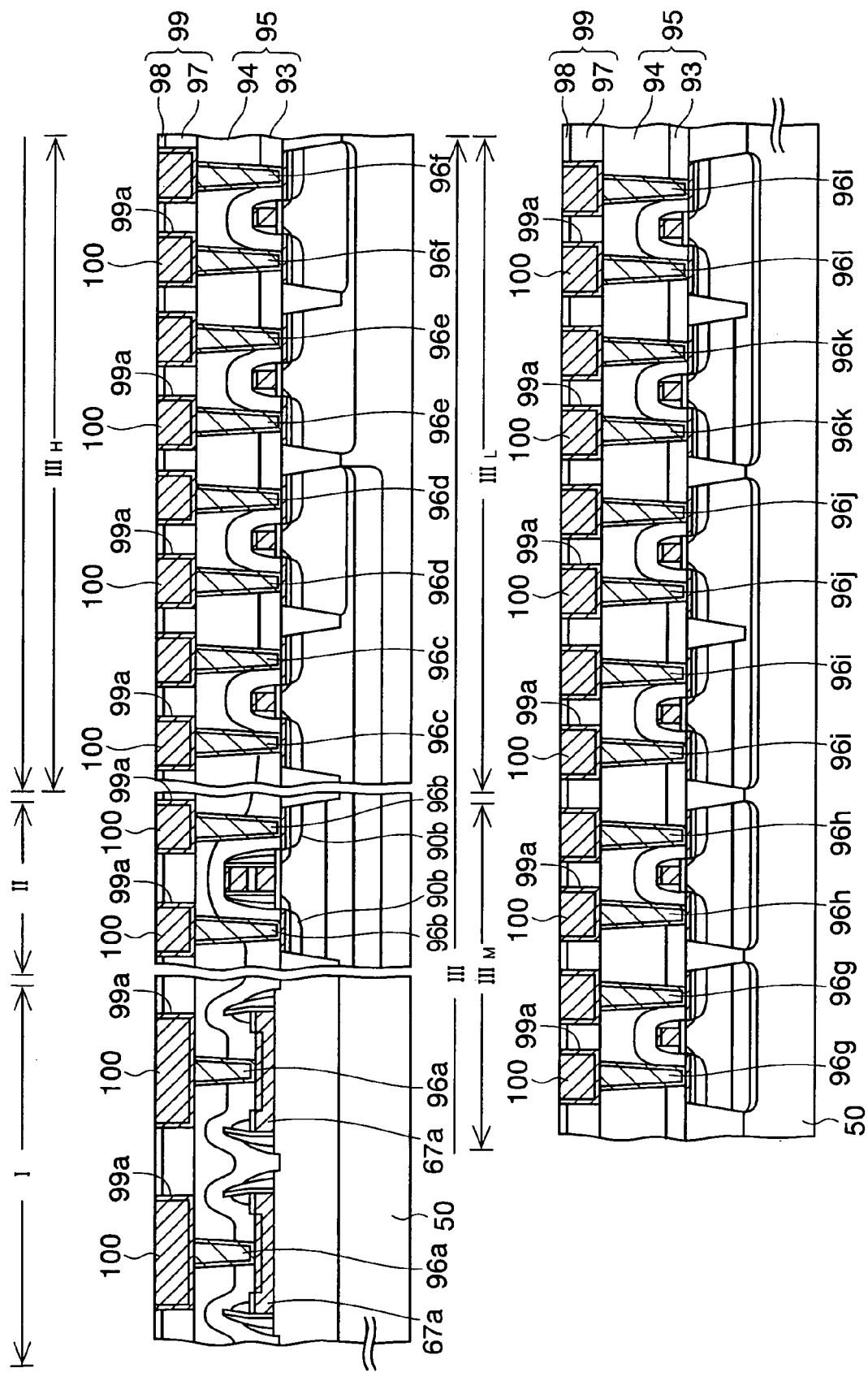

FIGS. 6A to 6U are cross-sectional views of a semiconductor device, according to a first embodiment of the present invention, during the manufacturing process, and FIGS. 10A to 10J are plan views thereof. In this embodiment, a logic mounted memory, such as an FPGA, is used.

First, as is shown in FIG. 6A, STI device isolation grooves 50a are formed in a silicon substrate 50, to define first and second peripheral circuit regions (a first and a third regions) I and III and a cell region (a second region) II, and an oxide silicon film is formed, as a device isolation insulating film 51, in each of the grooves 50a. Instead of the STI, a LOCOS (Local Oxidation of Silicon) method may be employed to form the device isolation insulating films 51. The second peripheral circuit region III of the silicon substrate 50 is further divided into a high voltage transistor region $III_H$, a middle voltage transistor region $III_M$ and a low voltage transistor region $III_L$.

Figure 10:
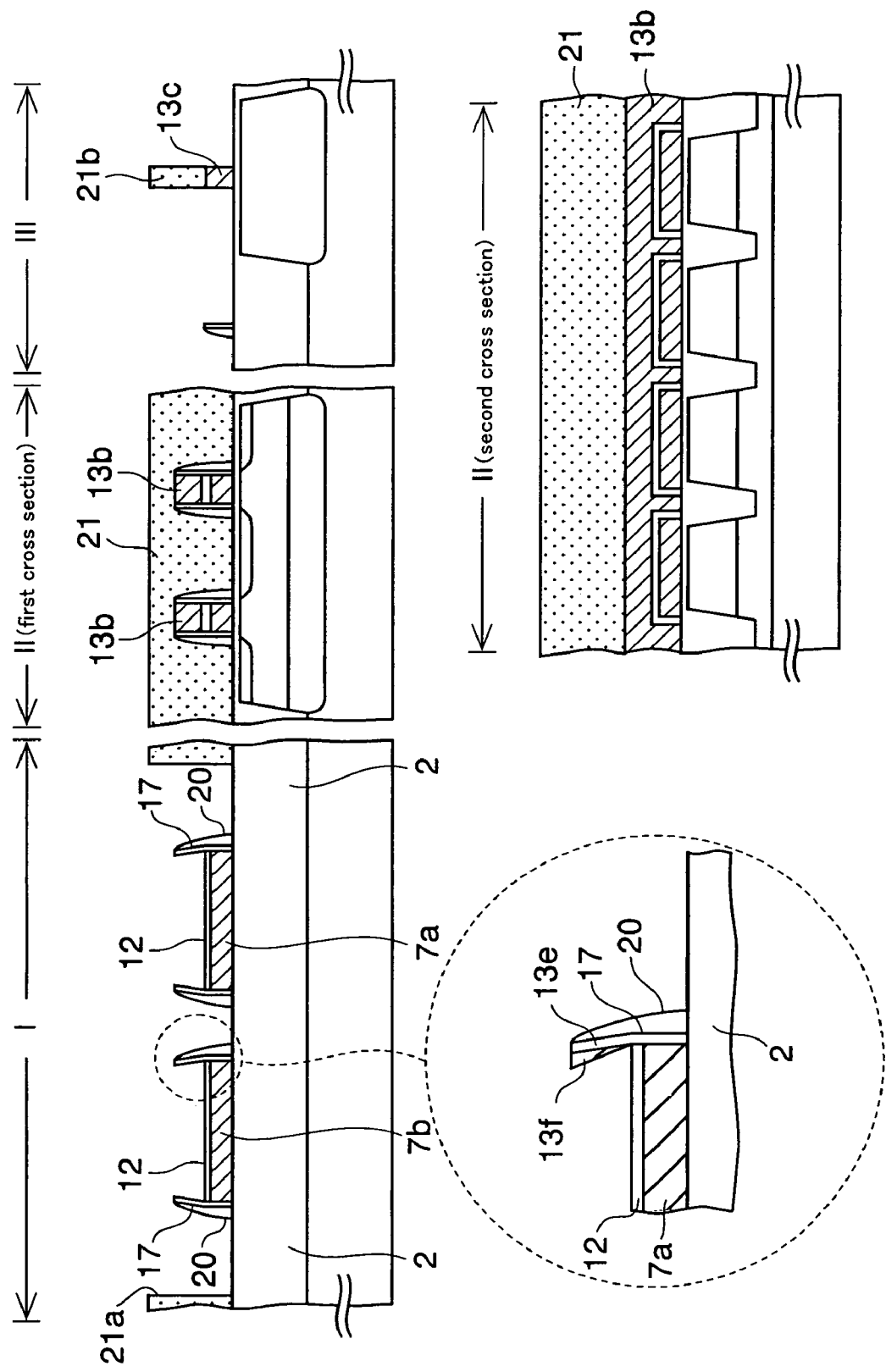
FIGS. 10A to 10J are plan views of the semiconductor device according to the first embodiment of the present invention.

FIG. 10A is a plan view of the structure after this process has been completed, and the cross section in FIG. 6A corresponds to a cross section taken along line L1—L1 in FIG. 10A. Finally, in the second peripheral circuit region III shown in FIG. 10A, ten MOS transistors are manufactured; however, to avoid complexity in the drawing of the second peripheral circuit region III, only a portion thereof, wherein a single MOS transistor is manufactured, is shown in FIG. 10A and in the following plan views.

The process performed until the structure shown in cross section in FIG. 6B is obtained will now be explained.

First, the entire surface of the silicon substrate 50 is thermally oxidized and a sacrificial insulating film (not shown) is formed.

Then, n-type impurity $p^+$ ions are implanted in the silicon substrate 50, so that a deep first n well 53 is formed in the silicon substrate 50. The ion implantation conditions are not especially limited, and in this embodiment, an acceleration energy of 2 MeV and a dose of $2 \times 10^{13}$ cm$^{-2}$ are employed.

Following this, at two ion implantation steps, p-type impurity $B^+$ ions are implanted in the silicon substrate 50 to obtain first to third p wells 54 to 56. As the ion implantation conditions, for example, the first step is performed by employing an acceleration energy of 420 KeV and a dose of $1.4 \times 10^{13}$ cm$^{-2}$, and the second step is performed by employing an acceleration energy of 100 KeV and a dose of $3.6 \times 10^{12}$ cm$^{-2}$.

An n-type MOS transistor having a high threshold voltage and an n-type MOS transistor having a low threshold voltage are formed in the high voltage transistor region $III_H$, and the threshold voltage of the latter transistor is controlled by the first p well 54.

Sequentially, by employing an acceleration energy of 100 KeV and a dose of $4.0 \times 10^{12}$ cm$^{-2}$, p-type impurity $B_+$ ions are implanted in the silicon substrate 50 to obtain fourth to sixth p wells 57 to 59.

Of the thus obtained wells, the fourth p well 57 is used to control the threshold voltage of an n-type MOS transistor having a high threshold voltage that is to be formed later in the high voltage transistor region $III_H$. The fifth and sixth p wells 58 and 59 function as channel stop layers for n-type MOS transistors that are to be formed later in the middle voltage transistor region $III_M$ and the low voltage transistor region $III_L$.

Thereafter, at two ion implantation steps, n-type impurity $P^+$ ions are implanted in the silicon substrate 50, and second to fourth n wells 60 to 62 are obtained. For the ion implantation, an acceleration energy of 600 KeV and a dose of $1.5 \times 10^{13}$ cm$^{-2}$ are employed at the first step, and an acceleration energy of 240 KeV and a dose of $9.0 \times 10^{11}$ cm$^{-2}$ are employed at the second step.

A p-type MOS transistor having a high threshold voltage and a p-type MOS transistor having a low threshold voltage are formed in the high voltage transistor region $III_H$, and the threshold voltage of the latter transistor is controlled by the second p well 60.

Then, by employing an acceleration energy of 240 KeV and a dose of $3.6 \times 10^{12}$ cm$^{-2}$, n-type impurity $P^+$ ions are implanted in the silicon substrate 50 and fifth to seventh n wells 63 to 65 are obtained.

Of these wells, the fifth n well 63 is used to control the threshold voltage of a p-type MOS transistor having a high threshold voltage that is to be formed later in the high voltage transistor region $III_H$. The sixth and seventh n wells 64 and 65 function as channel stop layers for p-type MOS transistors that are to be formed later in the middle voltage transistor region $III_M$ and the low voltage transistor region $III_L$.

Next, p-type impurity $B^+$ ions are implanted in the silicon substrate 50, and a first p-type impurity diffused region 66 is formed in order to control the threshold voltage of a flash memory cell that is to be formed later in the cell region II. As the ion implantation conditions, for example, an acceleration energy of 40 KeV and a dose of $6 \times 10^{13}$ cm$^{-2}$ are employed.

During the individual ion implantation processes, the sacrificial insulating film that is formed at first is employed as a through film, and the implanted impurity is divided by a resist pattern (not shown) laid on the sacrificial insulating film. Then, after the ion implantation processes have been completed, the resist pattern is removed.

Thereafter, the sacrificial insulating film is removed by wet etching using a hydrogen fluoride solution, and the surface of the silicon substrate 50 that has been so cleaned is exposed. Then, a thermal oxide film of about 10 nm thick is formed on the surface of the silicon substrate 50 under thermal process conditions of, for example, a substrate temperature of 900 to 1050° C. and a process time of thirty minutes. The thus obtained oxide film is used as a first insulating film 52.

Figure 9A:
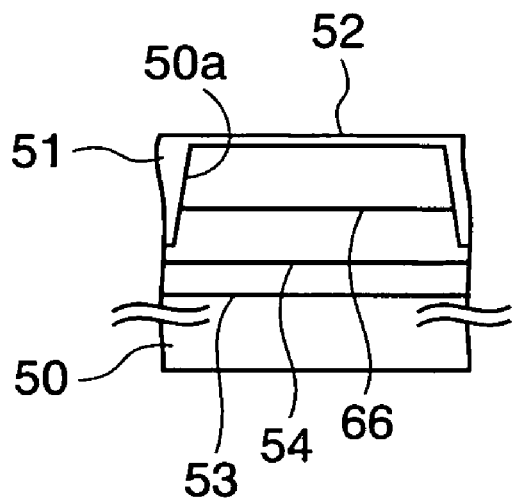
FIG. 9A is a cross-sectional view taken along line L2—L2 in FIG. 10A after a first insulating film has been formed.

FIG. 9A is a cross-sectional view of the structure taken along line L2—L2 in FIG. 10A after the first insulating film 52 has been formed in the above described manner. As is shown in FIG. 9A, the first insulating film 52 is also formed on the portion of the first peripheral circuit region I where a reference transistor is to be formed later.

The process performed to obtain the structure shown in cross section in FIG. 6C will now be described.

First, using the low pressure CVD method that employs $SiH_4$ and $PH_3$ as reactive gases, a polysilicon film of about 90 nm thick, wherein phosphorus has been doped using in-situ doping, is formed on the first insulating film 52 and is used as a first conductive film 67. Then, a first conductive film resist pattern 68 is formed on the first conductive film 67 and is used as a mask to etch the first conductive film 67. As a result, the first conductive film 67 is patterned, and removed from the second peripheral circuit region III.

Figure 10B:
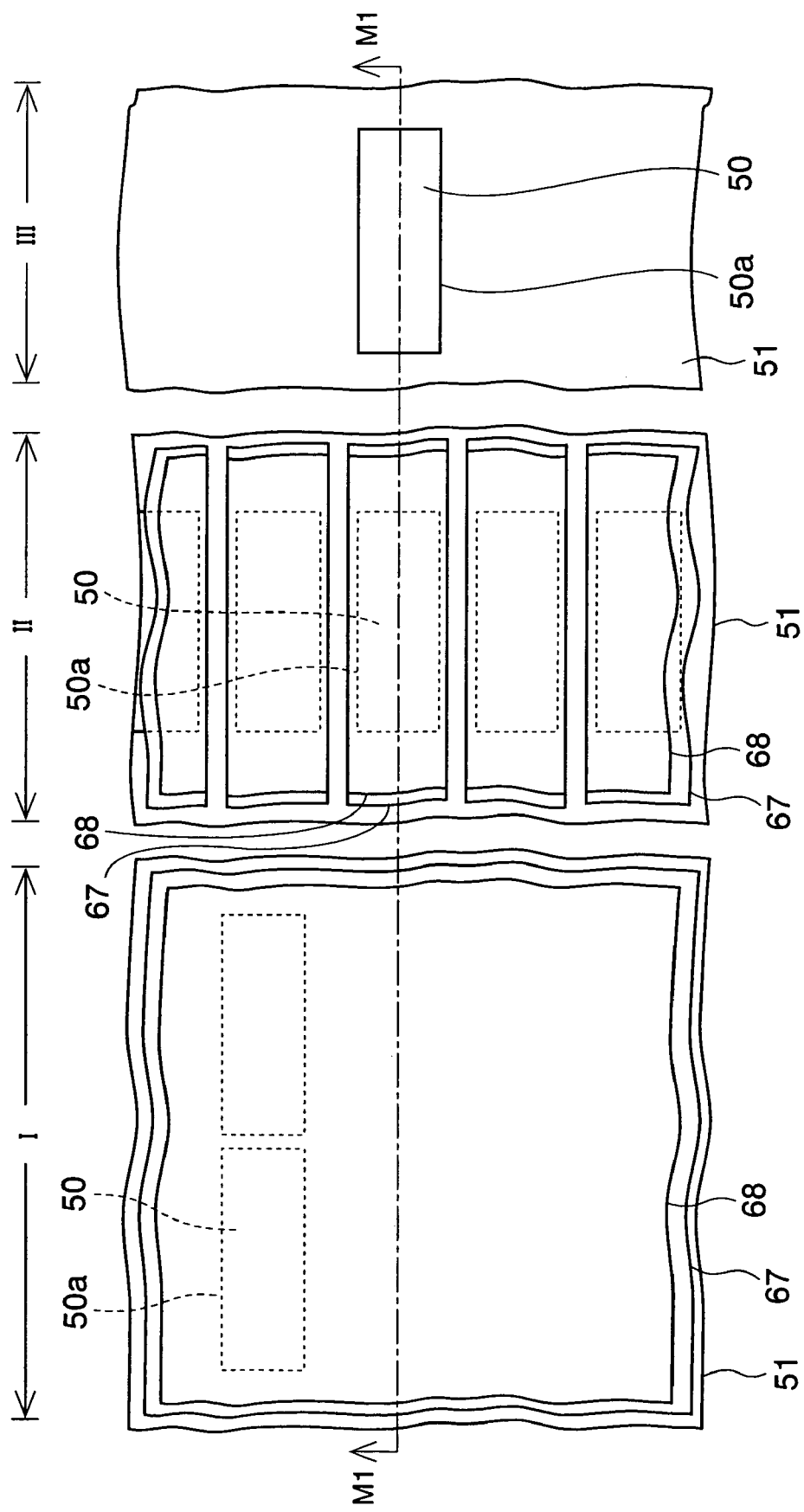

FIG. 10B is a plan view of the structure after this process has been completed. The cross section in FIG. 6C corresponds to a cross section taken along line M1—M1 in FIG. 10B. As is shown in FIG. 10B, through the patterning, the first conductive film 67 in the cell region II is shaped like a belt in the direction perpendicular to the word line.

Thereafter, the first conductive film resist pattern 68 is removed.

The process performed until the structure shown in cross section in FIG. 6D is obtained will now be explained.

First, using the low pressure CVD method, a silicon oxide film of 5 nm thick and a silicon nitride film of 8 nm thick are formed in this order on the first conductive film 67 and on the first insulating film 52 in the second peripheral circuit region III. Further, in a gas mixture atmosphere of Ar and $O_2$, the surface of the silicon nitride film is oxidized under thermal process conditions of a substrate temperature of about 950° C. and a heating time of about ninety minutes, and a silicon oxide film of about 6 nm thick is formed on the silicon nitride film. Thus, an ONO film, which is constructed by laminating a first silicon oxide film 69a, a silicon nitride film 69b and a second silicon oxide film 69c in this order is formed on the entire surface, as a second insulating film 69.

When the thermal processes are performed for oxidizing the silicon nitride film in the ONO film and for forming the first insulating film 52, which is explained while referring to FIG. 6B, the impurities in the wells formed in the silicon substrate 50 are diffused and broadly distributed.

Thereafter, p-type impurity $B^+$ ions are implanted in the silicon substrate 50 by using the first and second insulating films 52 and 69 as through films, and a second p-type impurity diffused region 82 is obtained in the middle voltage transistor region $III_M$ in order to adjust the threshold voltage of an n-type MOS transistor. The ion implantation conditions are not especially limited, and in this embodiment, an acceleration energy of 15 KeV and a dose of $7.0 \times 10^{12}$ cm$^{-2}$ are employed.

Sequentially, by employing an acceleration energy of 150 KeV and a dose of $6.0 \times 10^{12}$ cm$^{-2}$, n-type impurity $As^-$ ions are implanted in the silicon substrate 50 using the first and second insulating films 52 and 69 as through films, and a first n-type impurity diffused region 83 is obtained in the middle voltage transistor region $III_M$ in order to control the threshold voltage of a p-type MOS transistor.

Following this, by employing an acceleration energy of 35 KeV and a dose of $4.5 \times 10^{12}$ cm$^{-2}$, p-type impurity $B^+$ ions are implanted in the silicon substrate 50 to form a third p-type impurity diffused region 84. Two n-type MOS transistors having a high threshold voltage and a low threshold voltage and two p-type transistors having a high threshold voltage and a low threshold voltage are to be formed later in the low voltage transistor region $III_L$, and the threshold voltages of the n-type MOS transistors having a high threshold voltage are controlled by the third p-type impurity diffused region 84.

Thereafter, n-type impurity $As^-$ ions are implanted in the silicon substrate 50, and a second n-type impurity diffused region 85 is formed in the low voltage transistor region $III_L$ in order to control the threshold voltage of a p-MOS transistor having a high threshold voltage. The ion implantation conditions are, for example, an acceleration energy of 150 KeV and a dose of $2.0 \times 10^{12}$ cm$^{-2}$.

The above described respective diffused regions used for controlling threshold voltages are separately arranged by a resist pattern (not shown) formed on the second insulating film 69. The resist pattern is removed after the individual wells have been formed.

Through the above processes, the diffused regions 82 to 85, for controlling the threshold voltages of the transistors in the second peripheral circuit region III, have been formed. Therefore, the first and second insulating films 52 and 69 in the second peripheral circuit region III, which are employed as through films to obtain the diffused regions 82 to 85 by ion implantation, are not required for the succeeding processes.

Further, in the first peripheral circuit region I, since a conductive plug is to be connected to the contact region of the first conductive film 67 in order to control the potential of the film 67, the second insulating film 69 in the first peripheral circuit region I must be removed.

In the process shown in FIG. 6E, therefore, a first resist pattern 70 that covers the cell region II is formed on the second insulating film 69 in order to selectively remove the first and second insulating films 52 and 69 in the second peripheral circuit region III and to expose contact regions CR in the first peripheral circuit region I. The first resist pattern 70 has first windows 70a above the contact regions CR of the first conductive film 67, while the portion in the second peripheral circuit region III is exposed, and is not covered by the first resist pattern 70.

Figure 10C:
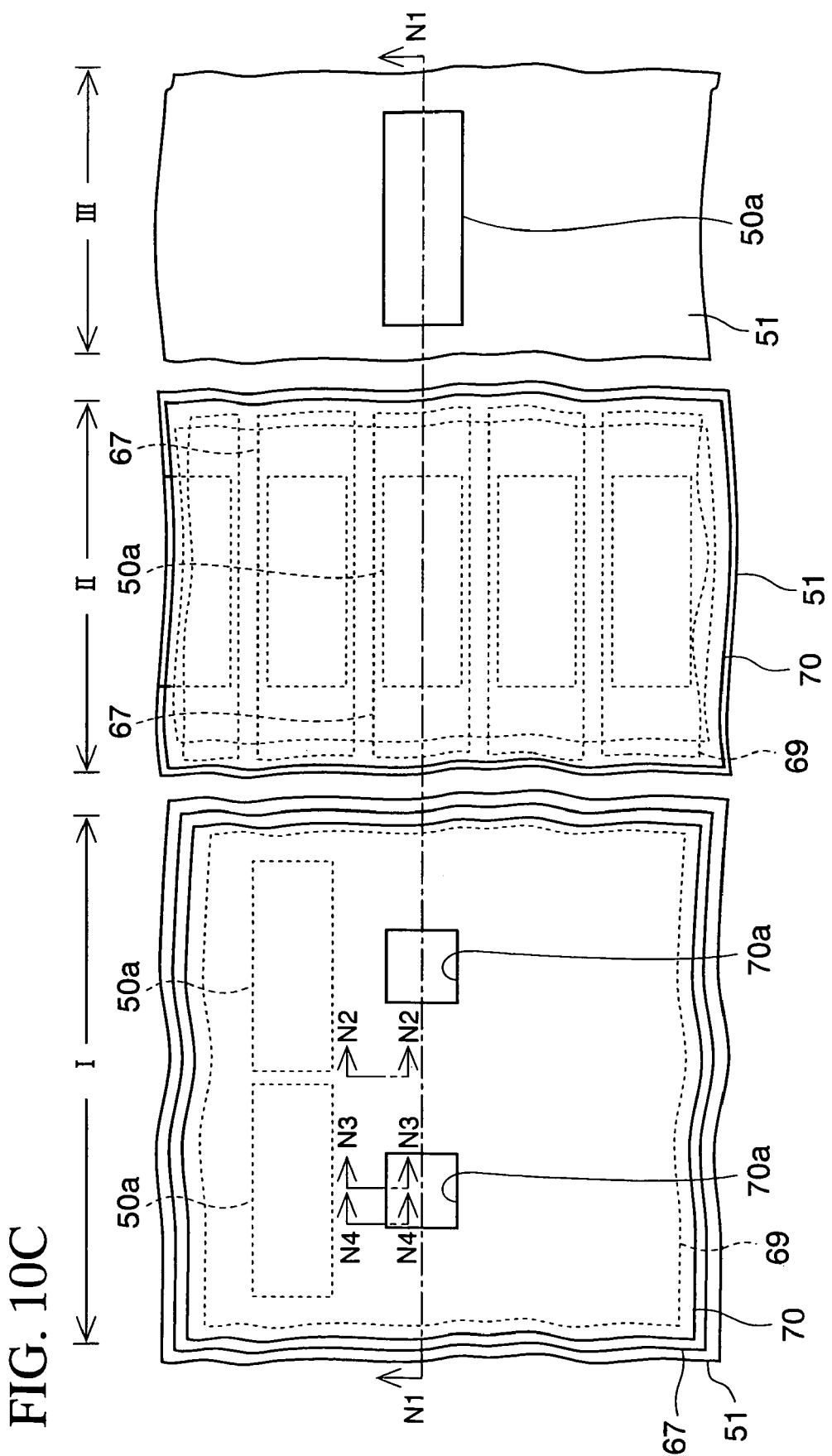

FIG. 10C is a plan view of the structure after this process has been is completed, and the cross section in FIG. 6E corresponds to a cross section taken along line N1—N1 in FIG. 10C.

Figure 7A:
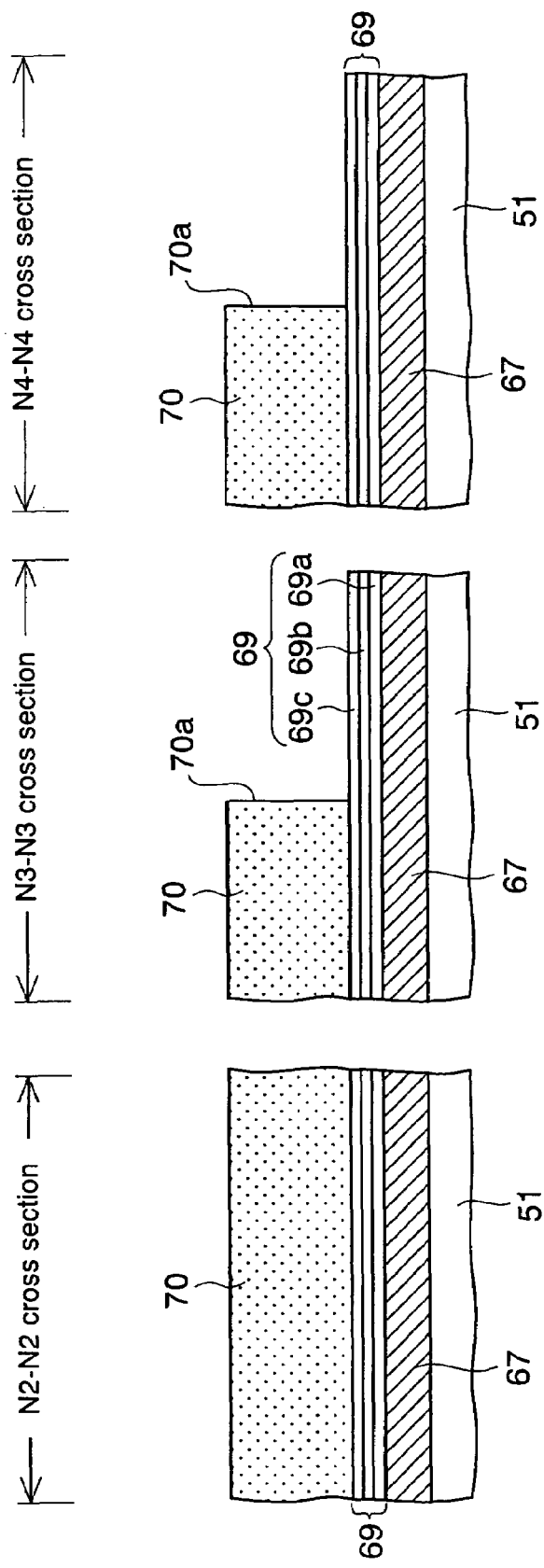
FIG. 7A presents cross-sectional views taken along lines N2—N2, N3—N3 and N4—N4 in FIG. 10C respectively.

The cross sections shown in FIG. 7A are those taken along lines N2—N2, N3—N3 and N4—N4 in FIG. 10C.

Next, as is shown in FIG. 6F, while a $CH_3$ and $O_2$ gas mixture is employed as an etching gas, plasma etching is performed using the first resist pattern 70 as a mask, and the second insulating film 69 at the first windows 70a and the first and second insulating films 52 and 69 in the second peripheral circuit region III are selectively etched and removed. As a result, first openings 69d are formed in the second insulating film 69 at the first windows 70a, and the contact regions CR are exposed. Further, the portion of the silicon substrate 50 in the second peripheral circuit region III is exposed.

Thereafter, oxygen ashing is used to remove the first resist pattern 70, and the wet cleaning process is used to clean the surface of the silicon substrate 50.

FIG. 10D is a plan view of the structure after this process has been completed. The cross section in FIG. 6F corresponds to a cross section taken along line P1—P1 in FIG. 10D.

Figure 7B:
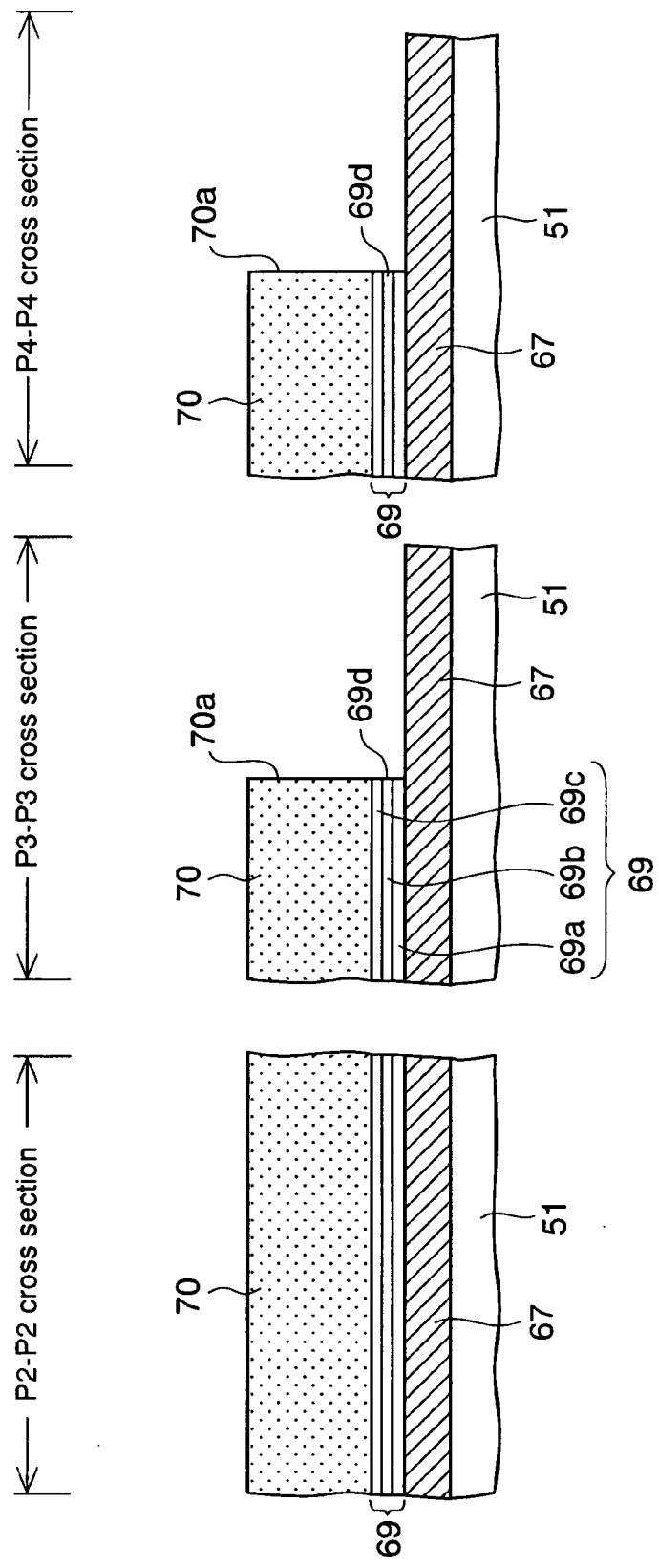
FIG. 7B presents cross-sectional views respectively taken along lines P2—P2, P3—P3 and P4—P4 in FIG. 10D.

The cross sections in FIG. 7B are those taken along lines P2—P2, P3—P3 and P4—P4 in FIG. 10D.

The process until the structure in cross section in FIG. 6G is obtained will now be described.

First, under oxidization conditions established by employing a substrate temperature of 850° C. and a process time of forty minutes, the surface of the silicon substrate 50 exposed in the second peripheral circuit region III is thermally oxidized, and a thermal oxide film of about 12 nm thick is obtained. During this thermal oxidization process, a thermal oxide film is also formed on the contact regions CR of the first conductive film 67 that are exposed through the first openings 69d in the second insulating film 69. Thereafter, a resist pattern (not shown) is formed in the cell region II and the high voltage transistor region $III_H$ and is used as a mask to etch the thermal oxide film that is formed in the first peripheral circuit region I, the middle voltage transistor region $III_M$ and the low voltage transistor region $III_L$. As a result, the thermal oxide film remains only in the cell region II and the high voltage transistor region $III_H$. During this etching process, the thermal oxide film is also removed from the first openings 69d.

Further, the surface of the silicon substrate 50 that is exposed in the middle voltage transistor region $III_M$ and the low voltage transistor region $III_L$ is thermally oxidized, and a thermal oxide film of about 7.0 nm thick is formed in these regions. The oxidization conditions are, for example, a substrate temperature of 800 to 900° C. and a process time of about ten minutes. This thermal oxide film is also formed on the contact regions CR of the first conductive film 67 that are exposed through the first openings 69d. Then, a resist pattern (not shown) is formed in the cell region II, the high voltage transistor region $III_H$ and the middle voltage transistor region $III_M$ and is used as a mask to etch the thermal oxide film. As a result, the thermal oxide film is removed from the low voltage transistor region $III_L$, and the surface of the silicon substrate 50 is exposed in this region. During this etching process, the thermal oxide film is also removed from the contact regions CR of the first conductive film 67, and only remains in the cell region II, the high voltage transistor region $III_H$ and the middle voltage transistor region $III_M$. Thereafter, the resist pattern used as a mask is removed.

Following this, in an oxygen atmosphere, a substrate temperature of about 700 to 800° C. and a process time of about five minutes are employed as oxidization conditions, and a thermal oxide film is formed on the portions of the first conductive film 67 exposed through the first openings 69d and the exposed surface of the silicon substrate 50 in the low voltage transistor region $III_L$. The thickness of the thermal oxide film is not especially limited, and in this embodiment, the film is about 2.2 nm thick.

Through the three thermal oxidization processes described above, third insulating films 71, which are thermal oxide films having final thicknesses of 16 nm, 7.5 nm and 2.2 nm, are formed in the high voltage transistor region $III_H$, the middle voltage transistor region $III_M$ and the low voltage transistor region $III_L$. When third insulating film 71 is also to be formed in the low voltage transistor region $III_L$ through the employment of the three thermal oxidization processes, a thermal oxide film is also formed on the portions of the first conductive film 67 exposed inside the first openings 69d, so that third insulating film 71, composed of this thermal oxide film, is obtained in the first openings 69d.

The cross sections in FIG. 7C are those taken along lines P2—P2, P3—P3 and P4—P4 in FIG. 10D after the third insulating film 71 has been formed in this manner. As is shown in FIG. 7C, the thickness of the portion of the first conductive film 67 that is not covered by the second insulating film 69 is reduced by thermal oxidization. Further, compared with other locations, much oxidization of the first conductive film 67 occurs under the side walls of the first openings 69d of the second insulating film 69, so that as shown in FIG. 7C, a thick portion 69f is formed for the first silicon oxide film 69a.

Thereafter, as is shown in FIG. 6H, by employing the low pressure CVD method using $SiH_4$ and $PH_3$ as reactive gases, a polysilicon film of about 180 nm thick, wherein phosphorus has been doped using in-situ doping, is formed on the second and third insulating films 69 and 71, and is used as a second conductive film 74. Then, the plasma CVD method is employed to form, on the second conductive film 74, a silicon nitride film of about 30 nm thick that is used as an anti-reflection film 75.

Then, as is shown in FIG. 6I, a photoresist is coated on the anti-reflection film 75, and is exposed/developed and made into a second resist pattern 76. The second resist pattern 76 has first resist portions 76a, which are large enough to cover the first openings 69d in the first peripheral circuit region I, and a second resist portion 76d having a word line shape in the cell region II.

Figure 10E:
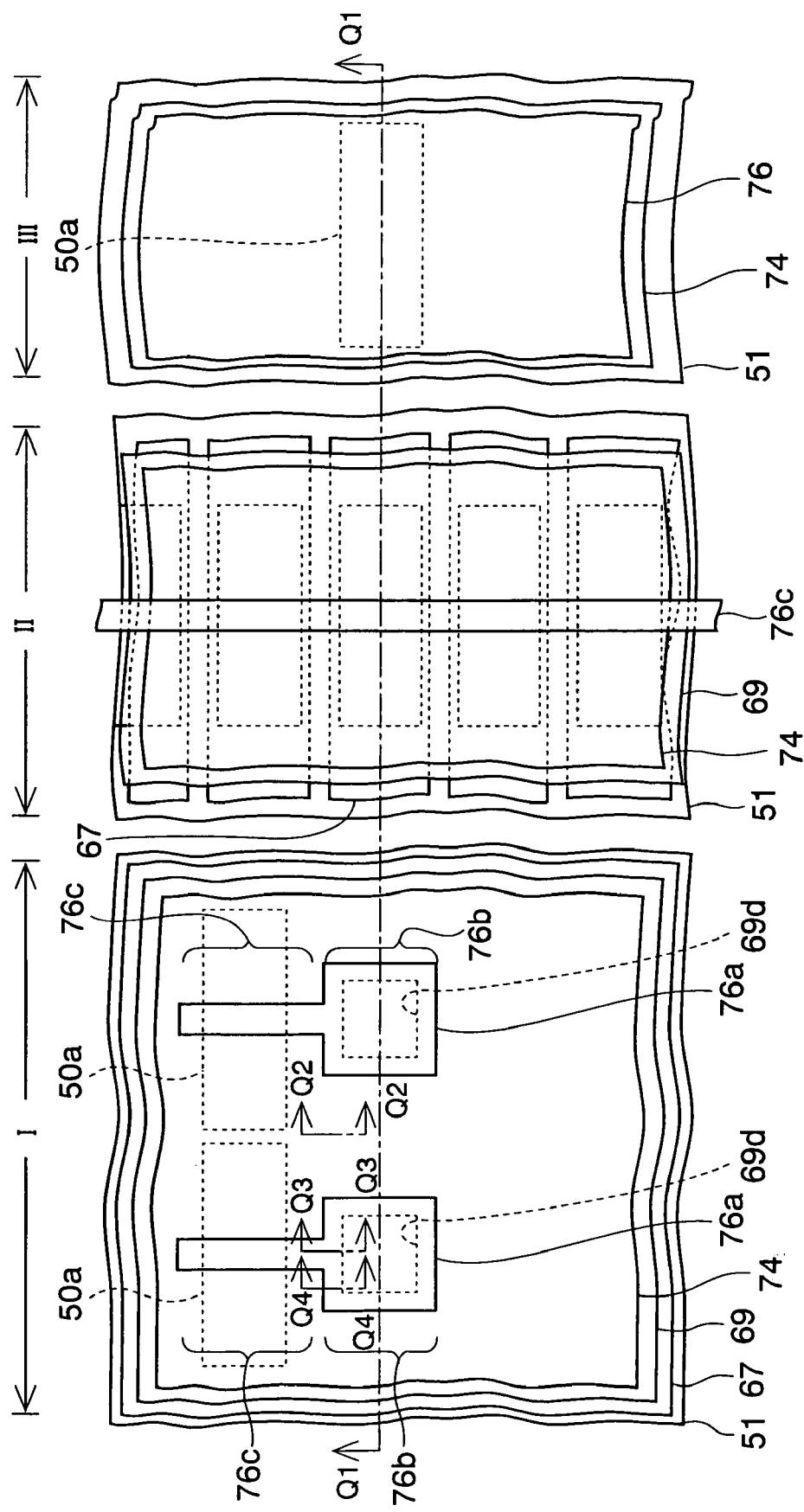

FIG. 10E is a plan view of the structure after this process has been completed, and the cross section in FIG. 6I corresponds to a cross section taken along line Q1—Q1 in FIG. 10E.

Figure 7D:
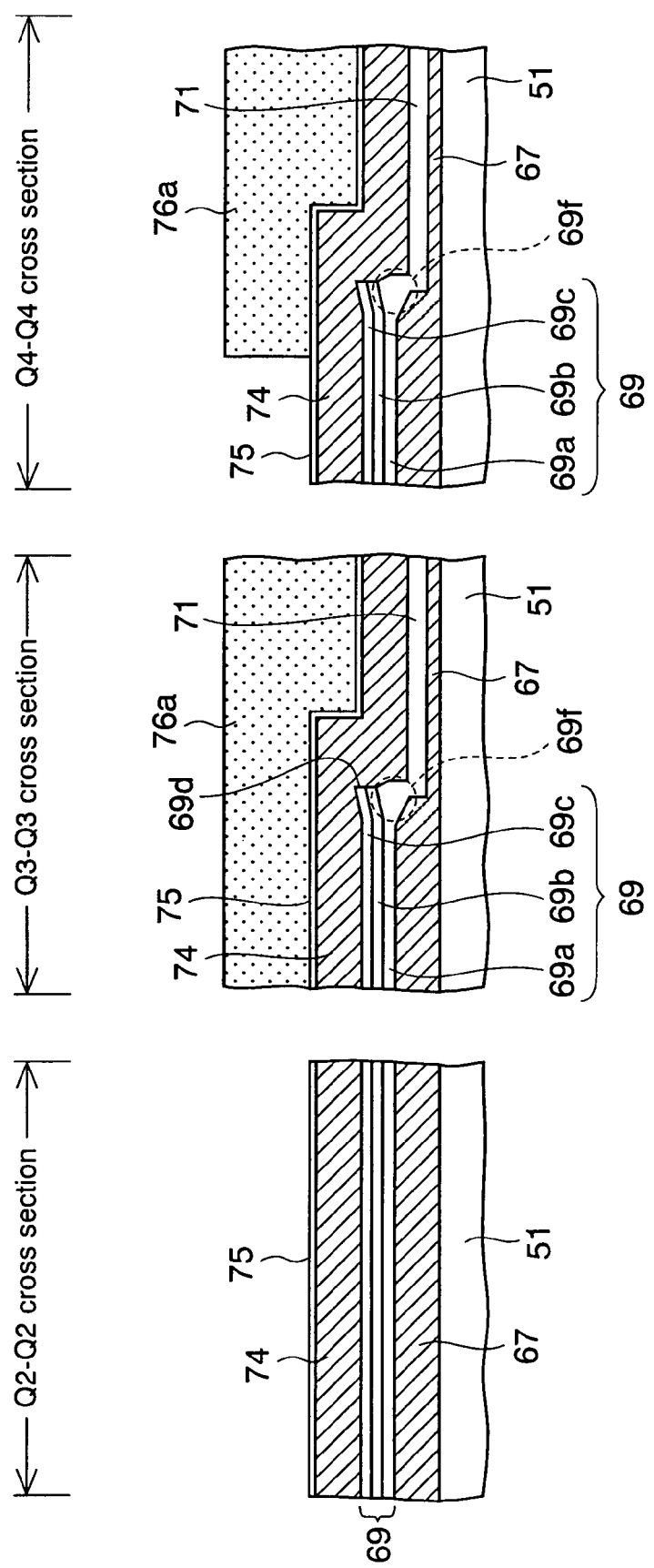
FIG. 7D presents cross-sectional views respectively taken along lines Q2—Q2, Q3—Q3 and Q4—Q4 in FIG. 10E.

The cross sections in FIG. 7D are those taken along lines Q2—Q2, Q3—Q3 and Q4—Q4 in FIG. 10E.

Sequentially, as is shown in FIG. 6J, the first and second conductive films 67 and 74, and the second insulating film 69 are patterned by using the second resist pattern 76 as an etching mask. This patterning process is performed in a plasma etching chamber, and a $Cl_2$ and $O_2$ gas mixture is employed as an etching gas for the first and second conductive films 67 and 74, while a $CH_3$ and $O_2$ gas mixture is employed as an etching gas for the second insulating film 69, which is an ONO film.

As a result of the patterning, the second conductive film 74 is left in the second peripheral circuit region III, and the first and second conductive films 67 and 74 under the first resist portions 76a are provided as first gate electrodes (first conductors) 67a and second conductors 74a for a reference transistor. In the cell region II, the first and second conductive films 67 and 74 under the second resist portion 76c and the second insulating film 69 are provided as a floating gate 67d, a control gate 74d and an intermediate insulating film 69e.

Furthermore, during this patterning process, as previously described in the preliminary explanation, outer side surface 74f of the second conductor 74a is inclined like taper-shape.

Figure 10F:
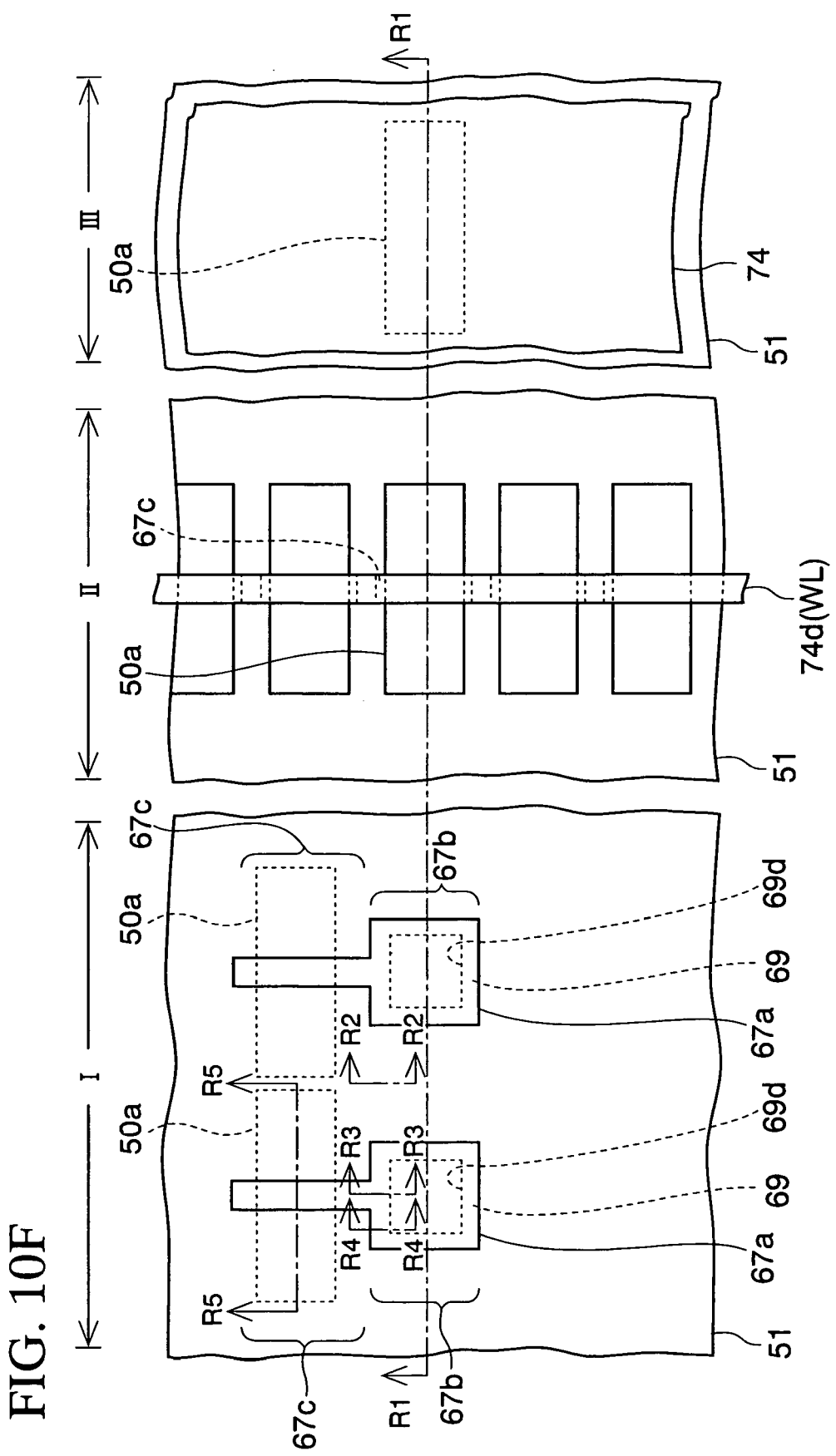

FIG. 10F is a plan view of the structure after this process has been completed, and the cross section in FIG. 6J corresponds to a cross section taken along line R1—R1 in FIG. 10F.

As is shown in FIG. 10F, for the first gate electrodes 67a, gates 67c are located on the portion of the silicon substrate 50 that is used as a source/drain region without the device isolation insulating film 51 being present, and pads 67b connected to the gates 67c are located on the device isolation insulating film 51.

In this embodiment, the two first gate electrodes 67a are arranged at an interval. However, the number of first gate electrodes 67a is not especially limited, and only one electrode, or three or more electrodes may be so arranged.

Figure 7E:
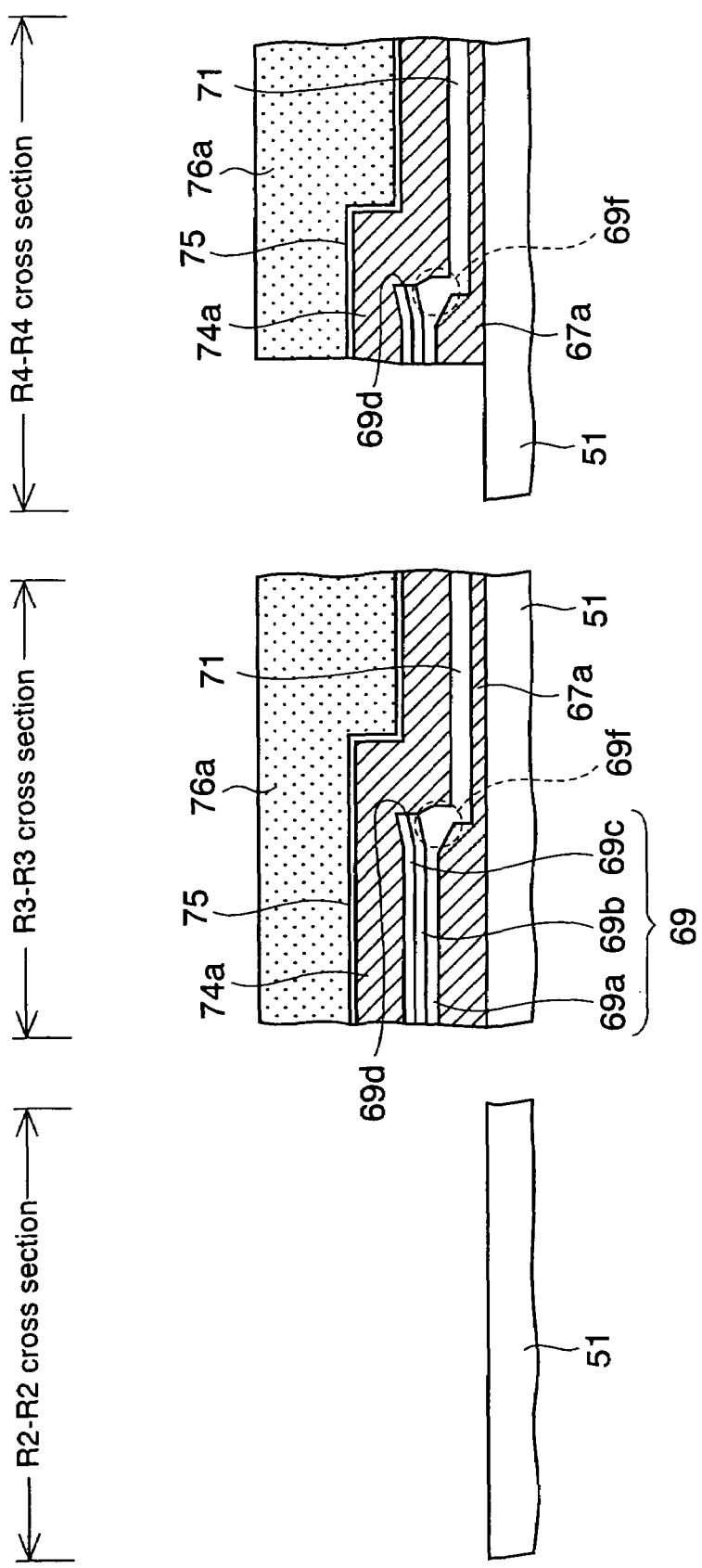
FIG. 7E presents cross-sectional views respectively taken along lines R2—R2, R3—R3 and R4—R4 in FIG. 10F.
Figure 9B:
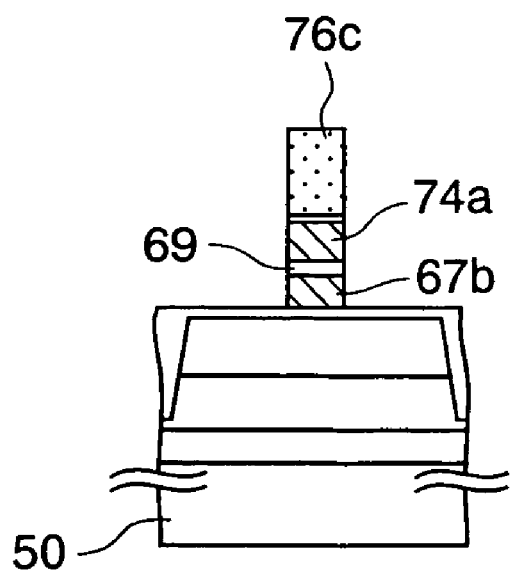
FIG. 9B is a cross-sectional view taken along line R5—R5 in FIG. 10F.

FIG. 9B is a cross-sectional view taken along line R5—R5 in FIG. 10F. The cross sections in FIG. 7E are those taken along lines R2—R2, R3—R3 and R4—R4 in FIG. 10F.

In this embodiment, as previously described, the plane shape of the first resist portion 76a is larger than the first opening 69d of the second insulating film 69. Therefore, as is shown in 7E, the thick portion 69f of the first silicon oxide film 69a is covered by the first resist portion 76a. Therefore, as is shown in a cross section taken along line R4—R4, when the first conductive film 67 is etched, the first resist portion 76a serves as a mask for the thick portion 69f, so that the thick portion 69f is outside the etching region. Therefore, the etching residue of the first conductive film 67 is not found under the thick portions 69f, and a device failure due to the etching residue can be prevented.

The second resist pattern 76 is thereafter removed.

Next, as is shown in FIG. 6K, the side surfaces of the floating gate 67d and the control gate 74 are thermally oxidized, and a thermal oxide film 77 of about 10 nm thick is formed on these side surfaces. The thermal oxide film 77 serves to improve the retention characteristic of a flash memory cell that is finally obtained. This thermal oxide film 77 is also formed on the side surfaces of the first gate electrodes 67a and the second conductors 74a.

FIG. 10F is a plan view of the structure after this process has been completed. The cross section in FIG. 6J corresponds to a cross section taken along line R1—R1 in FIG. 10F.

The cross sections in FIG. 7E are those taken along lines R2—R2, R3—R3 and R4—R4 in FIG. 10F.

Following this, as is shown in FIG. 6L, a resist pattern (not shown) is formed to cover the second conductors 74a, the control gate 74d and the second conductive film 74. While this pattern is used as a mask, an n-type impurity As is implanted in the silicon substrate 50. The ion implantation conditions are not especially limited, and in this embodiment, for example, an acceleration energy of 50 KeV and a dose of $6.0\times10^{14}$ $cm^{-2}$ are employed. As a result of the ion implantation, second n-type source/drain extensions 78b are formed on both sides of the floating gate 67d.

The resist pattern is thereafter removed.

Figure 9C:
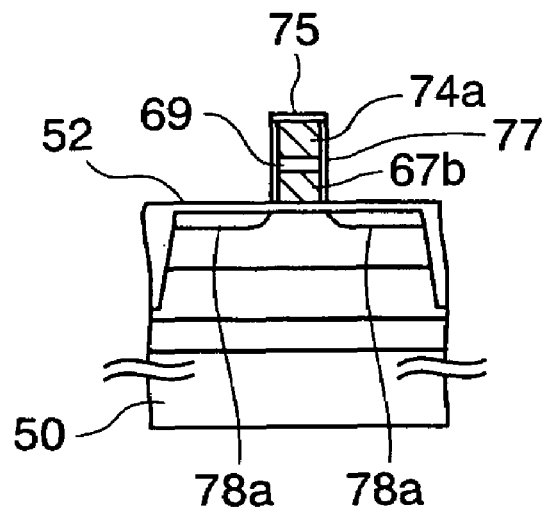
FIG. 9C is a cross-sectional view taken along line R5—R5 in FIG. 10F after a second n-type source/drain extension has been formed.

FIG. 9C is a cross-sectional view taken along line R5—R5 in FIG. 10F after the second n-type source/drain extensions 78b are formed in the above described manner. As is shown in FIG. 9C, during the process for forming the second n-type source/drain extensions 78b, first n-type source/drain extensions 78a are formed in the silicon substrate 50 on either side of the gates 67b of the first gate electrodes 67a in the first peripheral circuit region I.

The process performed to obtain the structure shown in cross section in FIG. 6M will now be described.

First, the side walls of the floating gate 67d and the control gate 74d are again thermally oxidized to increase the thickness of the thermal oxide film 77 by 9.5 nm. Then, a silicon nitride film is formed in the regions I to III by employing the plasma CVD method, so that the thickness of the silicon nitride film is about 115 nm on the flat surface of the silicon substrate 50. Then, the silicon nitride film is etched back by using RIE, and the portions of this film stay remained as first insulating side walls 79 at the sides of the first gate electrodes 67a and the floating gate 67d.

Then, as is shown in FIG. 6N, a third resist pattern 80 is formed on each regions I to III. The third resist pattern 80 has, in the first peripheral circuit region I, a second window 80a, which is formed to the size to encompass the contact region CR of the first gate electrode 67a The third resist pattern 80 has further a third resist portion 80b having a gate electrode shape in the second peripheral circuit region II.

Figure 10G:
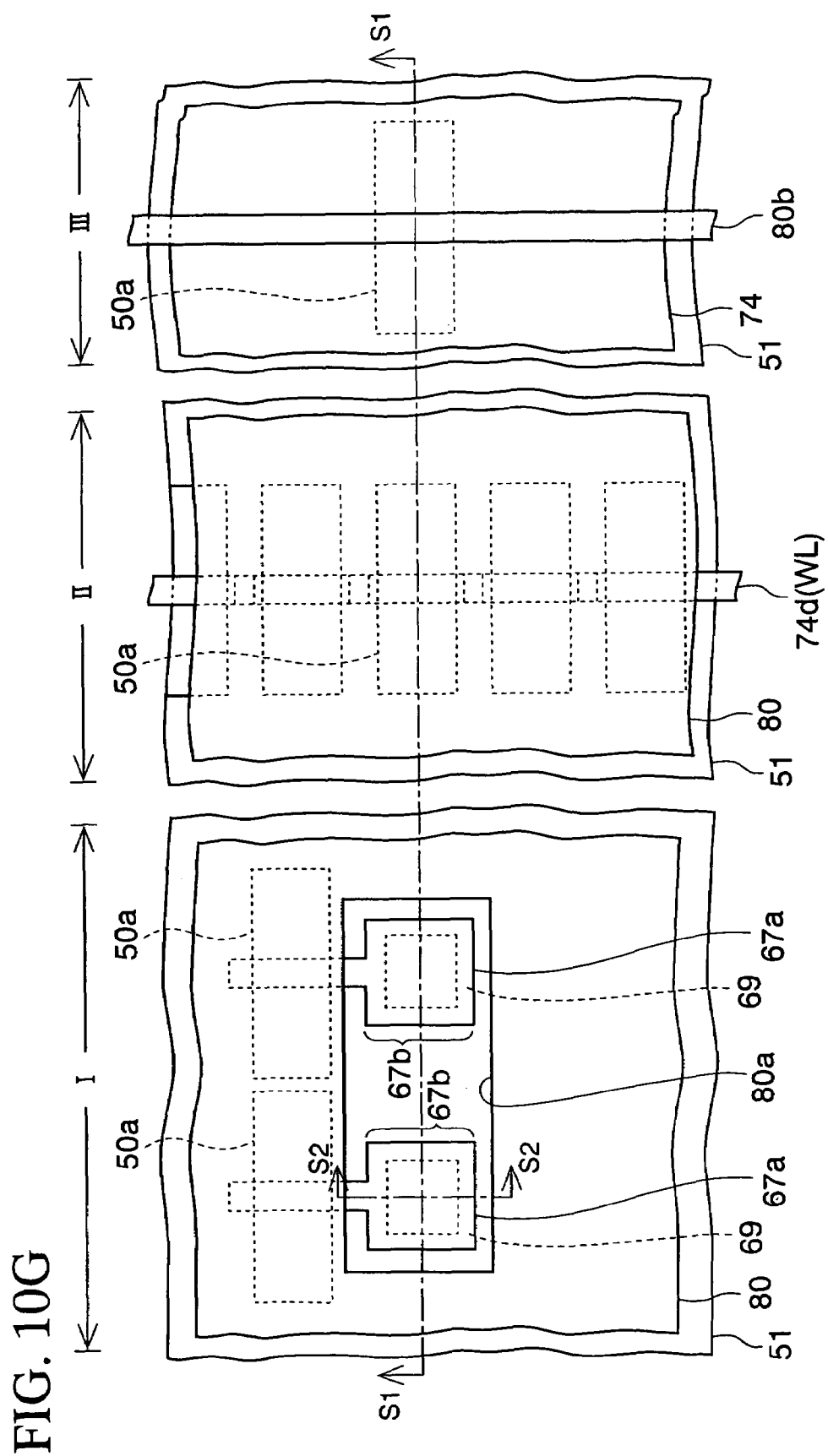

FIG. 10G is a plan view of the structure after this process has been completed. The cross section in FIG. 6N corresponds to a cross section taken along line S1—S1 in FIG. 10G.

As is shown in FIG. 10G, in this embodiment, the size provided for the second window 80a is such that it encloses the pads 67b.

Figure 8A:
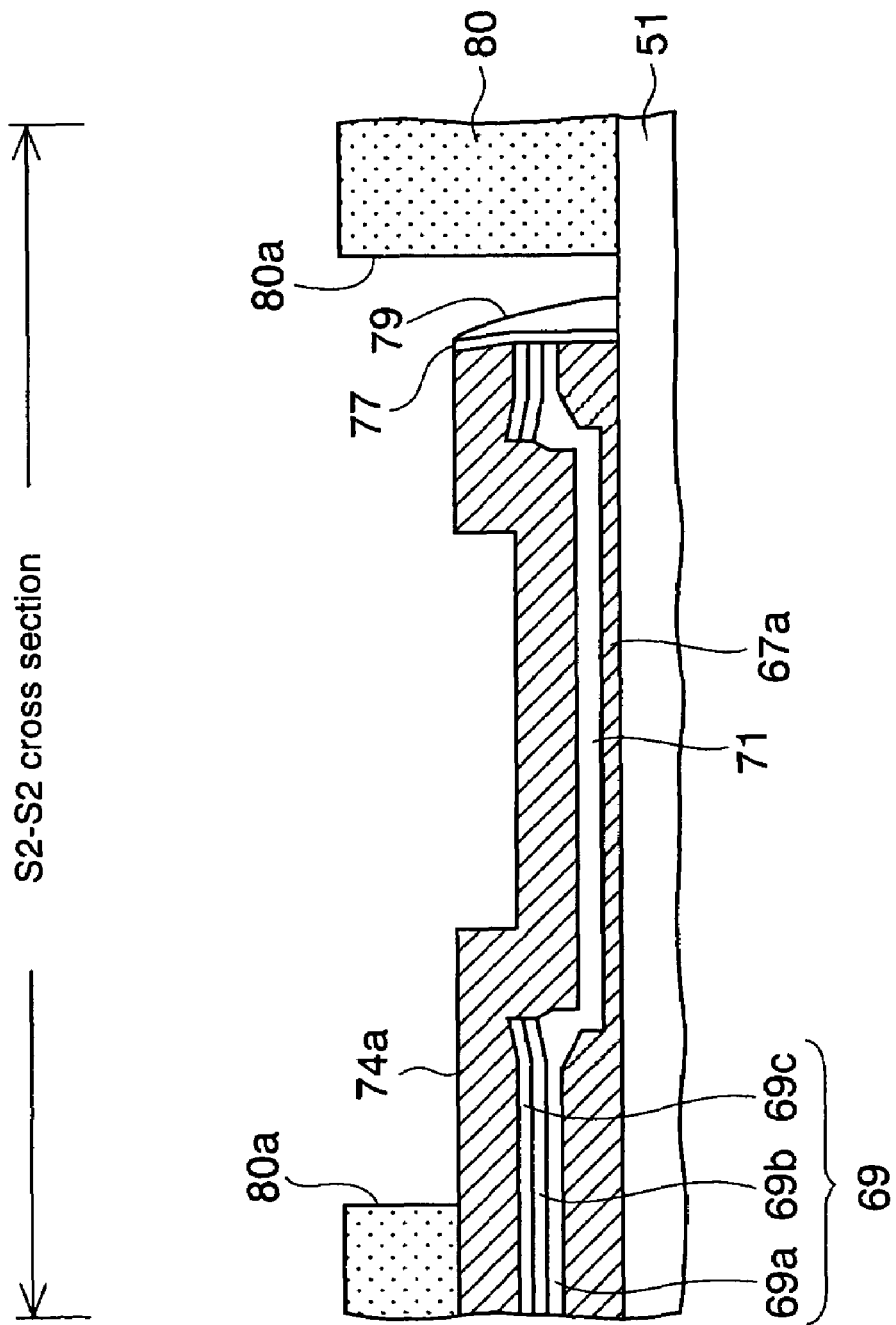
FIG. 8A is a cross-sectional view taken along line S2—S2 in FIG. 10G.

FIG. 8A is a cross-sectional view taken along line S2—S2 in FIG. 10G.

Next, as is shown in FIG. 6O, the second conductors 74a in the second window 80a are selectively removed by etching using the third resist pattern 80 as a mask. At the same time, the second conductive film 74 in the second peripheral circuit region III is etched to obtain second to eleventh gate electrodes 74e to 74n for peripheral transistors. This etching process is performed by using RIE, for example, that employs a $Cl_2$ and $O_2$ gas mixture as an etching gas.

As a result, in the first peripheral circuit region I, the first insulating side walls 79, which are taller than the upper surfaces of the first conductors 67*a*, are arranged alongside the first conductors 67*a*.

The third resist pattern 80 is thereafter removed.

Figure 10H:
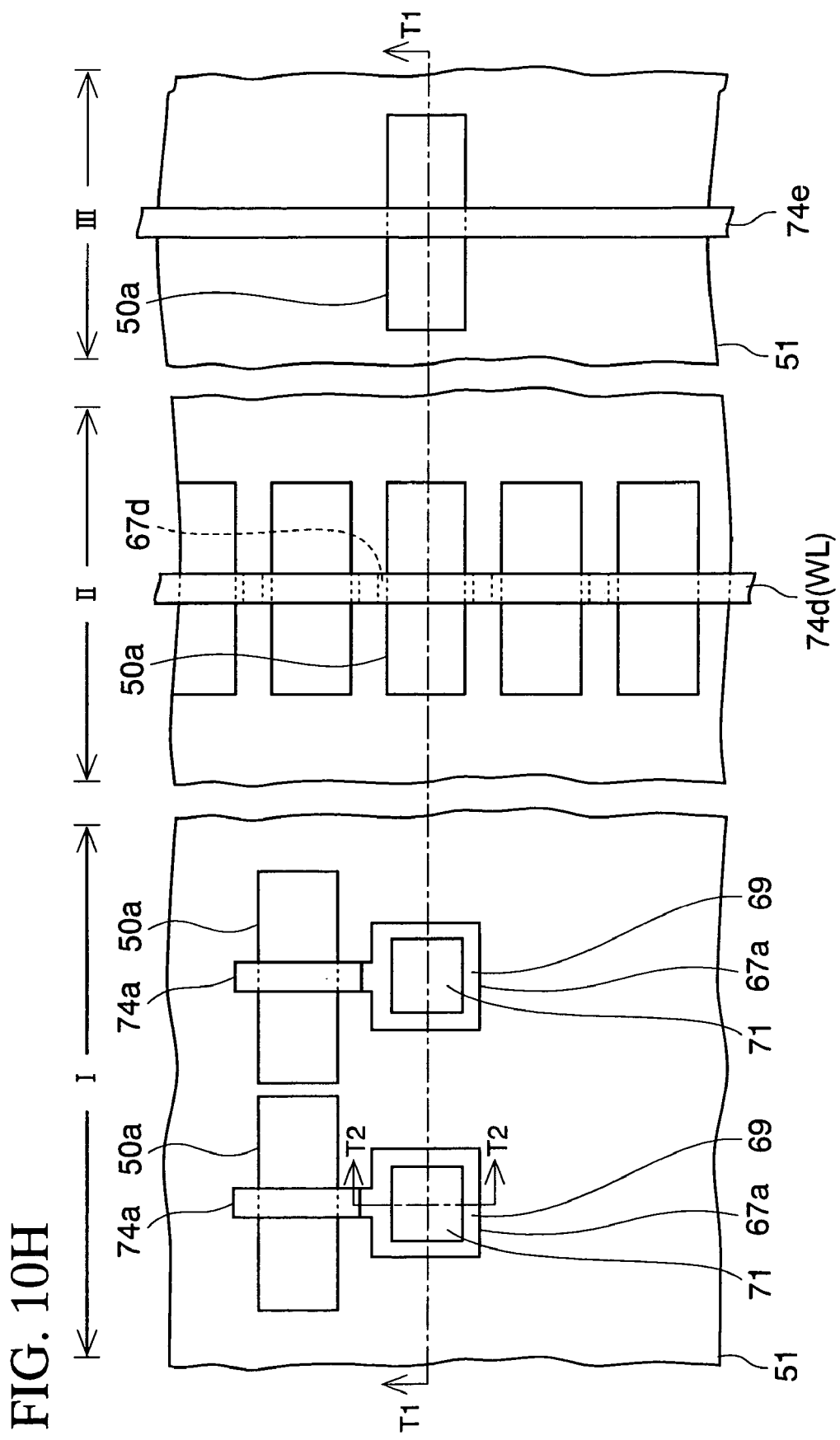

FIG. 10H is a plan view of the structure after this process has been completed. The cross section in FIG. 6O corresponds to a cross section taken along line T1—T1 in FIG. 10H before the third resist pattern 80 has been removed.

In this embodiment, since the size of the second window 80*a* is such that it encloses the pads 67*b*, all the second conductors 74*a* on the pads 67*b* are removed during the etching process.

FIG. 8B is a cross-sectional view taken along line T2—T2 in FIG. 10H before the third resist pattern 80 has been removed.

Sequentially, as is shown in FIG. 6P, an n-type impurity, such as As or P, is implanted in the silicon substrate 50 by using the second to eleventh gate electrodes 74*e* to 74*n* as masks, and third to seventh n-type source/drain extensions 78*c* to 78*g*, shown in FIG. 6P, are obtained. Likewise, a p-type impurity, such as $BF_2$, is implanted in the silicon substrate 50, and first to fifth p-type source/drain extensions 78*h* to 78*l*, shown in FIG. 6P, are obtained. A resist pattern (not shown) is employed for the separate implantation of an n-type impurity and a p-type impurity, and is removed after the ion implantation has been completed.

The process performed until the structure shown in cross section in FIG. 6Q is obtained will now be explained.

First, a silicon oxide film is formed on the entire surface, using the plasma CVD method and employing TEOS as a reactive gas, so that the thickness of the silicon oxide film is 100 nm on the flat surface of the silicon substrate 50. Then, the silicon oxide film is etched back to leave it as a second insulating side walls 81 on the first insulating side walls 79 and on the side surfaces of the second to eleventh gate electrodes 74*e* to 74*n*. The etch back is then further performed, and the third insulating film 71, composed of silicon oxide, is removed from the first openings 69*d*, thus exposing the contact regions CR of the first gate electrodes 67*a*.

In the etch back process, the first insulating film 52 is patterned by using the second insulating side wall 81 as mask and left under the floating gate 67*d* as a tunnel insulating film 52*b*.

Further, in the second peripheral circuit region III, the third insulating film 71 is patterned by using the second to eleventh gate electrodes 74*e* to 74*n* as masks, and the third insulating film 71 is made into gate insulating films 71*e* to 71*n* under the gate electrodes 74*e* to 74*n*.

Figure 10I:
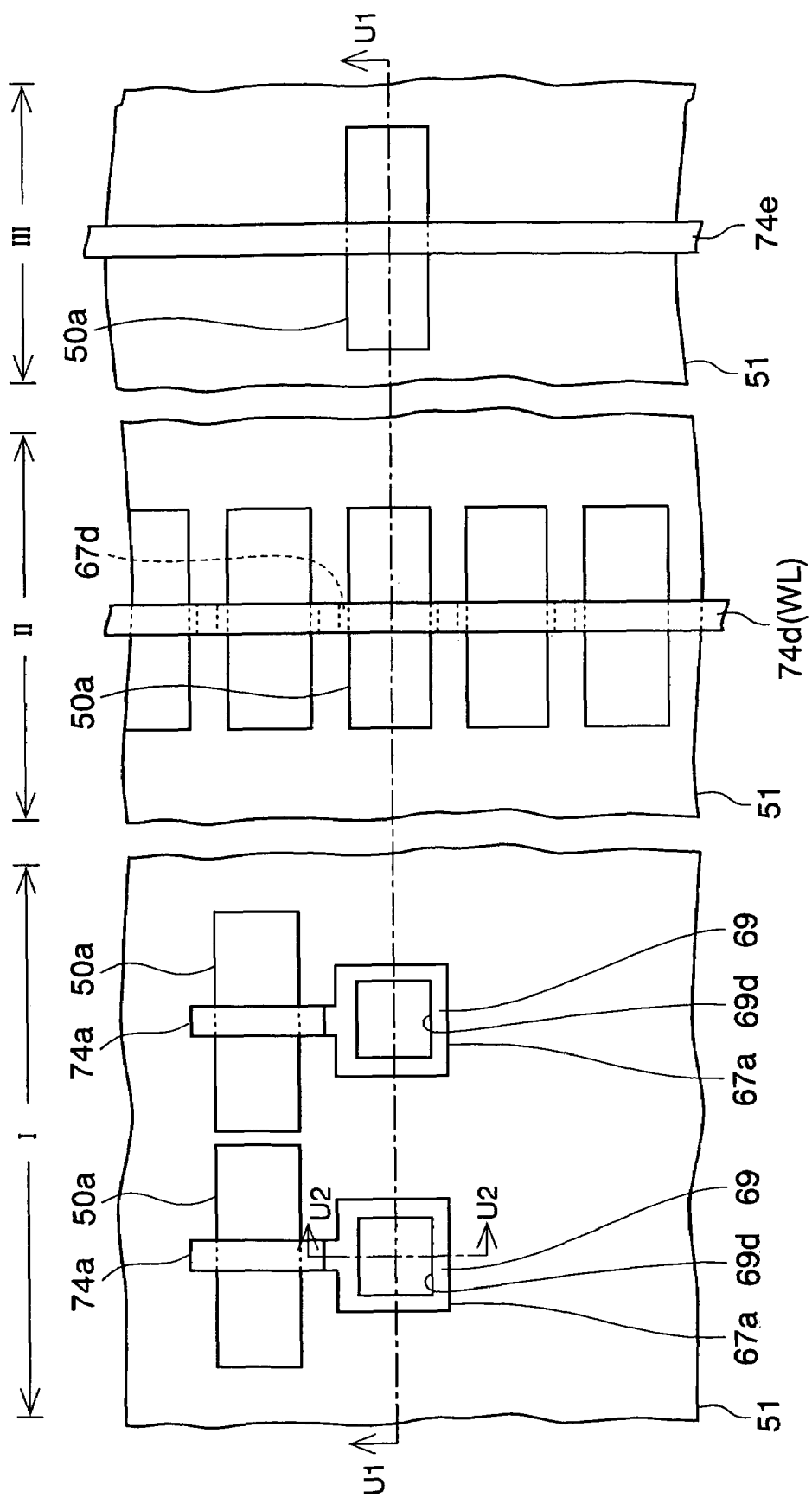

FIG. 10I is a plan view of the structure after this process has been completed. The cross section in FIG. 6Q corresponds to a cross section taken along line U1—U1 in FIG. 10I.

Figure 8C:
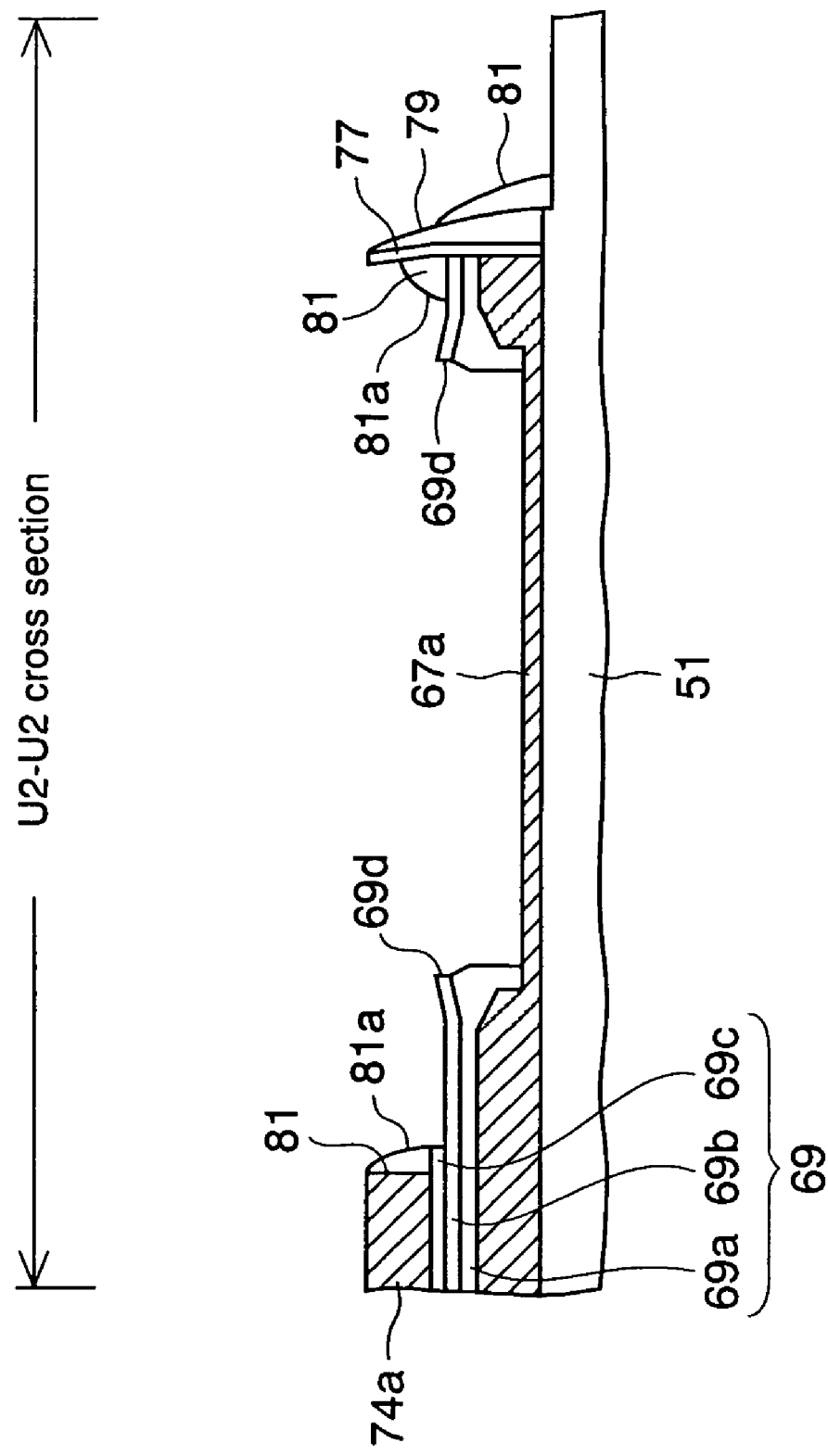
FIG. 8C is a cross-sectional view taken along line U2—U2 in FIG. 10I.

FIG. 8C is a cross-sectional view taken along line U2—U2 in FIG. 10I.

As is shown in FIG. 8C, as a result of the performance of the above etch back process, curved surfaces 81*a* of the second insulating side walls 81 are retracted from the first openings 69*d* of the second insulating film 69.

Then, as is shown in FIG. 6R, ion implantation is performed using, as masks, the second insulating side walls 81, the control gate 74*d* and the second to eleventh gate electrodes 74*e* to 74*n*, and as shown in FIG. 6R, second to seventh n-type source/drain regions 90*b* to 90*g* and first to fifth p-type source/drain regions 90*h* to 90*l* are obtained. Separate resist patterns (not shown) are employed for each of the separate implantations of an n-type impurity and a p-type impurity, and are removed after the ion implantations are completed. Although the ion implantation conditions are not especially limited, $P^+$ ions are employed as an n-type impurity, and are implanted using an acceleration energy of 10 KeV and a dose of $6.0 \times 10^{15}$ cm$^{-2}$ and in this embodiment. Further, $B^+$ ions are employed as a p-type impurity, and are implanted using an acceleration energy of 5 KeV and a dose of $4.0 \times 10^{15}$ cm$^{-2}$. Further, in this ion implantation, $B^+$ ions are also introduced into the gate electrodes (fourth, fifth, seventh, tenth and eleventh gate electrodes 74*g*, 74*h*, 74*j*, 74*m* and 74*n*) of the p-type MOS transistor, and the conductivity of these gate electrodes is changed to the p type.

Through the above described processes, n-type MOS transistors $TR_n$ (Low Vth) and $TR_n$ (High Vth) and p-type MOS transistors $TR_p$ (Low Vth) and $TR_p$ (High Vth), which constitute a logic circuit such as a sense amplifier, are formed in the high voltage transistor region $III_H$ and the low voltage transistor region $III_L$. The terms Low Vth and High Vth, provided for the individual transistors, indicate the levels of the threshold voltages of the transistors.

When high threshold voltage transistors and low threshold voltage transistors coexist in this manner, the circuit can be operated fast by using a transistor having a low threshold voltage. Further, in the standby state, a transistor having a low threshold voltage is rendered off and, alternatively, a transistor having a high threshold voltage is employed so as to limit a leak current that occurs in the standby state.

Furthermore, the transistors formed in the high voltage transistor region $III_H$ are high voltage transistors where a voltage of 5 V is to be applied to their gate electrodes, and the transistors in the low voltage transistor region $III_L$ are low voltage transistors where a voltage of 1.2 V is to be applied.

In addition, as is shown in FIG. 6R, an n-type MOS transistor $TR_n$ and a p-type MOS transistor $TR_p$, where a voltage applied to the gate electrodes is 3.3 V, are formed in the middle voltage transistor region $III_M$.

In the cell region II, a flash memory cell FL is formed that is constituted by the control gate 74*d*, the intermediate insulating film 69*d*, the floating gate 67*d*, the tunnel insulating film 52*b*, and the second n-type source/drain regions 90*b*. In FIG. 6R, only one control gate 74*d*, which functions as a word line (WL), is shown; however, actually, multiple control gates 74*d* are arranged at intervals.

Figure 9D:
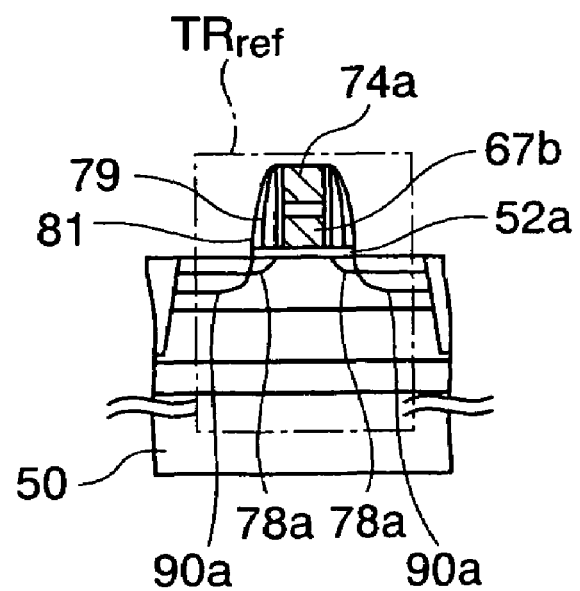
FIG. 9D is a cross-sectional view taken along line R5—R5 in FIG. 10F after a second n-type source/drain region for a flash memory has been formed.

FIG. 9D is a cross-sectional view taken along line R5—R5 in FIG. 10F after the second n-type source/drain regions 90*b* of the flash memory cell have been formed. As is shown in FIG. 9D, the first and second insulating side walls 79 and 81 are also formed along the gates 67*b* of the first gate electrodes 67*a*. Therefore, during the etch back process performed for the second insulating side walls 81, the first insulating film 52 is etched and the portions remaining under the gates 67*b* are used as the first gate insulating films 52*a*.

Further, during the ion implantation for the second n-type source/drain regions 90*b*, the first n-type source/drain regions 90*a* are formed in the silicon substrate 50 on the sides of the gates 67*b*. As a result, in the first peripheral circuit region I, reference transistors $TR_{ref}$ are arranged that are each constituted by the first n-type source/drain regions 90*a*, the first gate insulating film 52*a* and the gate 67*b*.

The process performed to obtain the structure shown in cross section in FIG. 6S will now be described.

First, a cobalt film of 8 nm thick and a titanium nitride (TiN) film of 10 nm thick are formed in this order on the entire surface, using the sputtering method. Then, using the RTA (Rapid Thermal Anneal) method, these films are annealed at a substrate temperature of about 550° C. for a process time of about 0.5 minutes so that they react with silicon. Thereafter, by employing a solution composed of mixture of an APM and SPM as an etching liquid, the portions of the cobalt film and the titanium nitride film that have not reacted with silicon are removed from the device isolation insulating film 51 by wet etching, leaving a cobalt silicide layer 92 on the surface of the silicon substrate 50. It should be noted that APM represents a mixture of a hydrogen peroxide solution and $NH_4OH$, and that SPM represents a mixture of sulfuric acid and a hydrogen peroxide solution.

The cobalt silicide layer 92 is also formed on the surfaces of the first gate electrodes 67a that are exposed through the first openings 69d. The cobalt silicide layer 92 is also formed on the upper surfaces of the second to eleventh gate electrodes 74e and 74n to provide the salicide structure for the gate electrodes 74e to 74n.

Thereafter, the cobalt silicide layers 92 are again annealed using RTA and the resistance of the cobalt silicide layers 92 is reduced. The RTA conditions are not especially limited, and in this embodiment, a substrate temperature is 800° C. and a process time is 0.5 minutes.

Instead of the cobalt silicide layer 92, another metal silicide layer having a high melting point, e.g., a nickel silicide layer, may be employed.

FIG. 8D is a cross-sectional view taken along line U2—U2 in FIG. 10I after the cobalt silicide layers 92 have been formed in this manner.

The process performed until the structure shown in cross section in FIG. 6T is obtained will now be explained.

First, a silicon nitride film of about 70 nm thick is formed, using the CVD method, that is to be used as an etching stopper film 93. Then, using the CVD method, a silicon oxide film is formed as a fourth insulating film 94 on the etching stopper film 93, so that the etching stopper film 93 and the fourth insulating film 94 are used as a first inter-layer insulating film 95.

Sequentially, the upper surface of the first inter-layer insulating film 95 is polished and flattened using the CMP (Chemical Mechanical Polishing) method. As the result, on the flat surface of the silicon substrate 50, the first inter-layer insulating film 95 is about 600 nm thick. Thereafter, the first inter-layer insulating film 95 is patterned, using photolithography, to form first to twelfth holes 95a to 95l. During the photolithography process, the first etching step is performed, using the etching stopper film 93 as a mask, to selectively etch the fourth insulating film 94, and the second etching step is performed, using the cobalt silicide layer 92 as an etching stopper and using a different etching gas, to selectively etch the etching stopper film 93.

Of the holes 95a to 95l, the first holes 95a are formed in the first openings 69a and are located on the contact regions CR of the first gate electrodes 67a. The other, second to twelfth holes 95b to 95l are formed on the respective source/drain regions 90b to 90l.

Following this, using the sputtering method, a Ti film and a TiN film are formed in this order, in the first to twelfth holes 95a to 95l and on the first inter-layer insulating film 95, and are used as glue films. Then, using the CVD method and employing tungsten hexafluoride as a reactive gas, a W (tungsten) film is formed on the glue films to completely bury the first to twelfth holes 95a to 95l. Thereafter, using the CMP method, the W film and the glue films are removed from the upper surface of the first inter-layer insulating film 95, and remain only in the first to twelfth holes 95a to 95l as first to twelfth conductive plugs 96a to 96l.

Of these conductive plugs, the first conductive plugs 96a are electrically connected to the contact regions CR of the first gate electrodes 67a.

Figure 8E:
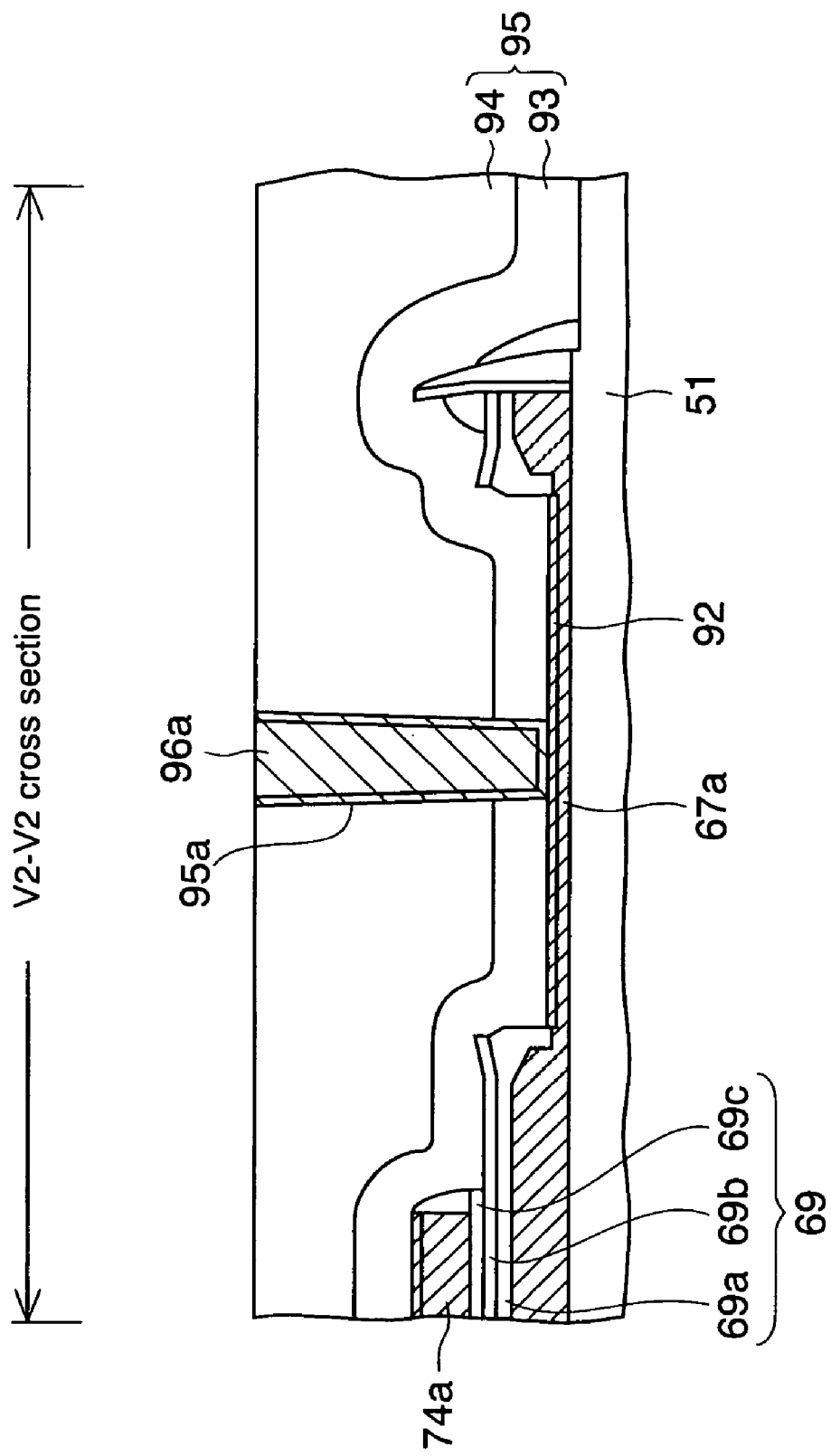
FIG. 8E is a cross-sectional view taken along line V2—V2 in FIG. 10I.

FIG. 10J is a plan view of the structure after this process has been completed. The cross section in FIG. 6T corresponds to a cross section taken along line V1—V1 in FIG. 10J. FIG. 8E is a cross-sectional view taken along line V2—V2 in FIG. 10J.

Figure 9E:
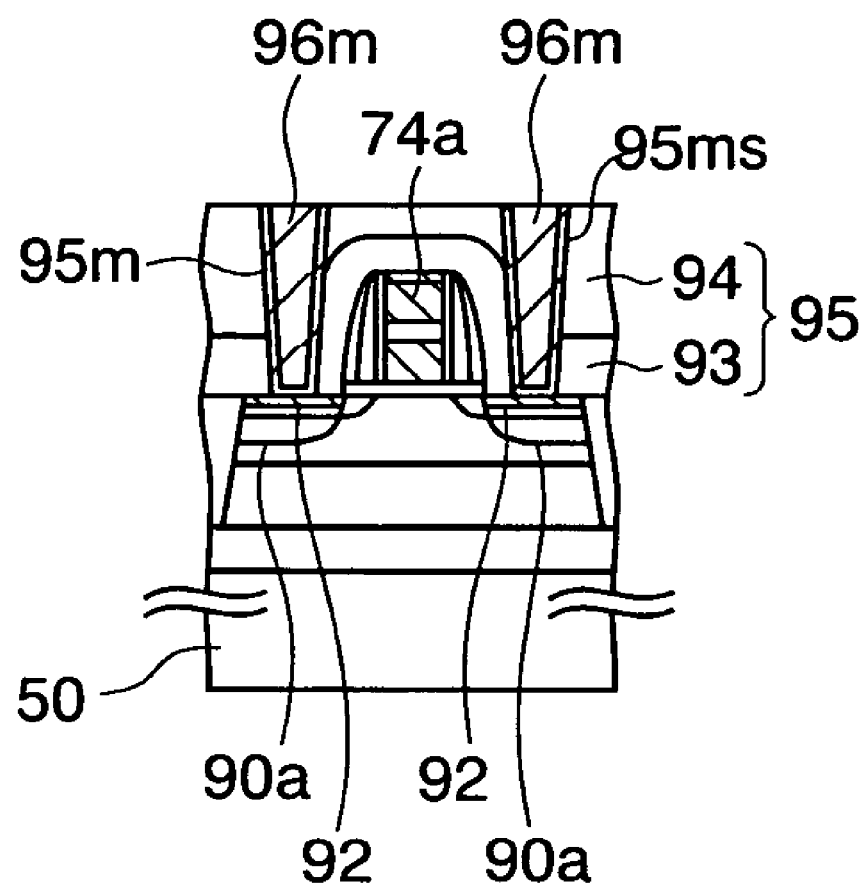
FIG. 9E is a cross-sectional view taken along line V3—V3 in FIG. 10J.

FIG. 9E is a cross-sectional view taken along line V3—V3 in FIG. 10J. As is shown in FIG. 9E, during the process for forming the first to twelfth holes 95a to 95l and the first to the twelfth conductive plugs 96a to 96l, thirteenth holes 95m and thirteenth conductive plugs 96m are formed in the first peripheral circuit region I, and the thirteenth conductive plugs 96m are electrically connected to the first n-type source/drain regions 90a.

The process performed until the structure shown in cross section in FIG. 6U is obtained will now be described.

First, a low-permittivity insulating film 97, such as SiLK (by The Dow Chemical Company), is coated on the entire surface, and a silicon oxide film is overlaid as a cover insulating film 98, so that the low-permittivity insulating film 97 and the cover insulating film 98 can be employed as a second inter-layer insulating film 99.

Sequentially, the second inter-layer insulating film 99 is patterned using photolithography to form wiring grooves 99a.

Following this, a Cu film is formed as a seed layer on the entire surface, and by supplying electricity to the seed layer, an electrolytic copper plating film is formed thereon to completely bury the wiring grooves 99a. Thereafter, using the CMP method, the seed layer and the copper plating film are removed from the upper surface of the second inter-layer insulating film 99 by polishing, while remaining, as copper wires 100, in the wiring grooves 99a.

The function of the copper wires 100 is not especially limited, and two copper wires 100 electrically connected to two second n-type source/drain regions of the flash memory cell FL function, for example, as the bit line (BL) and the source line (SL) of a NAND flash memory.

The basic structure of the semiconductor device according to this embodiment is thus completed.

Although this semiconductor device has the reference transistors $TR_{ref}$ as explained in FIG. 9D, the function of the the reference transistors $TR_{ref}$ is not particularly limited. The reference transistor $TR_{ref}$ may be used, for example, to monitor the breakdown voltage of the tunnel insulating film 52b (see FIG. 6R) of the flash memory cell FL, as explained in the preliminary explanation. In this case, a predetermined voltage is applied to the two first n-type source/drain regions 90a through the thirteenth conductive plugs 96m in FIG. 9E, and in this state, the potential at the first gates 67a is increased through the first conductive plugs 96a (see FIG. 6T). When the voltage is increased, a breakdown occurs at the first gate insulating films 52a in FIG. 9E and thus electrons are injected into the gates 67c, and a current flow through the first conductive plug 96a. By detecting this current, breakdown voltage of the tunnel insulating film 52b, which is formed in the process as that of the first gate insulating film 52b, can be monitored.

According to the above described method of manufacturing a semiconductor device, in the step shown in FIG. 6I for forming the second resist pattern 76, the planar shape of the first resist portions 76a is made larger than that of the first windows 70a of the first resist pattern 70 (see FIG. 6F), so that the first openings 69d of the second insulating film 69 are covered by the first resist portions 76a.

According to this, as is shown in FIG. 7E, thick portion 69*f* of the first silicon oxide film 69*a*, which generates at the time when forming the third insulating film 71 by oxidation of silicon, is covered with the first resist portion 76*a*. Therefore, when the first conductive film 67 is patterned into the first gate electrode 67*a* in the step of FIG. 7E, the thick portion 69*a* is left outside the etching region, and hence the etching residue of the first conductive film 67, which commonly generates when the thick portion 69*f* function as etching mask, is not left under the thick portion 69*f*. As a result, a device failure or a short circuit due to the etching residue can be prevented, and a highly reliable logic embedded nonvolatile memory can be provided.

(2) Second Embodiment

A second embodiment of the present invention will now be described.

Figure 13A:
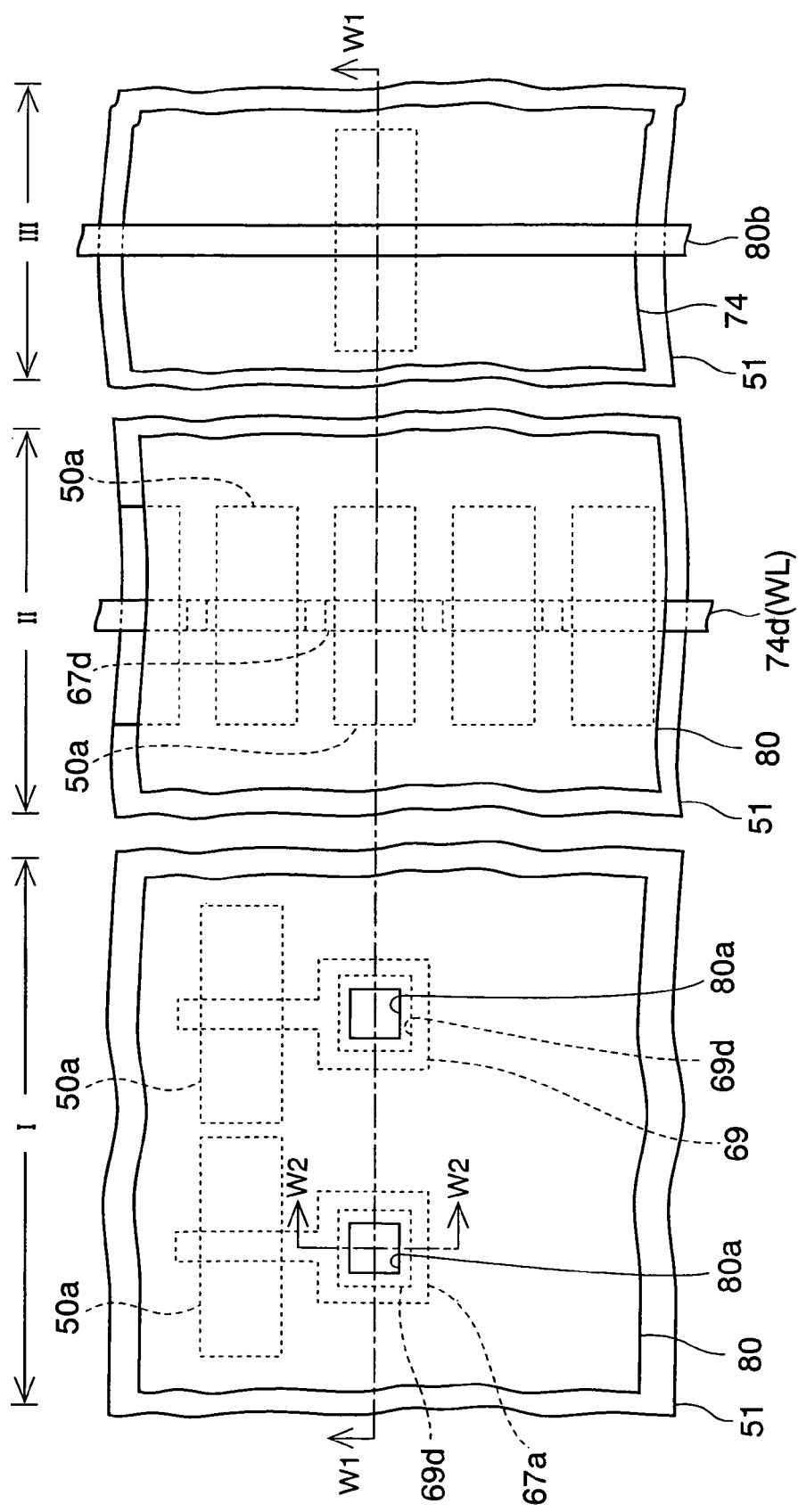
Figure 13B:
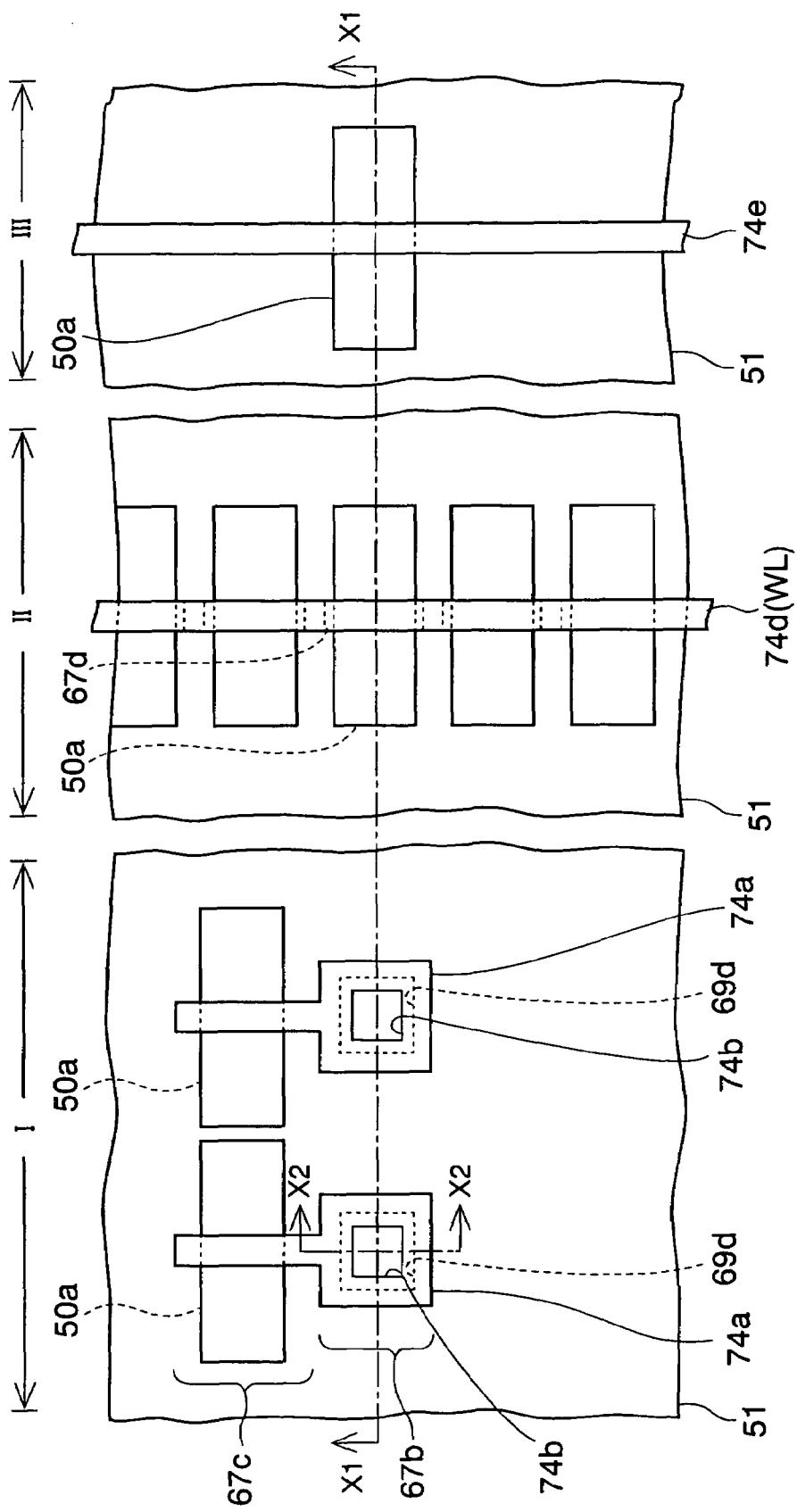

FIGS. 11A to 11G are cross-sectional views of the process performed to manufacture a semiconductor device according to the second embodiment of the present invention. FIGS. 13A to 13C are plan views. The same reference numerals as used in the first embodiment are also employed to denote corresponding components, and no further explanation for them will be given.

First, the process shown in FIG. 6N and explained in the first embodiment is performed, and as shown in FIG. 11A, third resist patterns 80 having second windows 80*a* are formed in each regions I to III.

In the first embodiment, the second window 80*a* is made larger than the first opening 69*d* of second insulating film 69. Alternatively, in this embodiment, the second window 80*a* is made into a size to be encompassed in the first opening 69*a*.

FIG. 13A is a plan view of the structure after this process has been completed. The cross section shown in FIG. 11A corresponds to a cross section taken along line W1—W1 in FIG. 13A.

FIG. 12A is a cross-sectional view taken along line W2—W2 in FIG. 13A. As is shown in FIG. 12A, when third thermal oxide films 71 are formed by thermal oxidation, more oxidization of first thermal oxide films 69*a*, which are constituents of the second insulating films 69, occurs at the first openings 69*d* than at the other locations. As a result, thick portions 69*f* are generated, as is explained in the first embodiment.

Following this, as is shown in FIG. 11B, using RIE and employing gas mixture of Cl$_2$ and O$_2$ as an etching gas, second conductor 74*a* and a second conductive film 74 are etched while using the third resist pattern 80 as a mask. In this process, a second opening 74*b* is formed in the second conductor 74*a* under the second window 80*a* of the third resist pattern 80, and the second conductive film 74 in the second peripheral circuit region III is patterned into second to eleventh gate electrodes 74*e* to 74*n* for peripheral transistors.

The third resist pattern 80 is thereafter removed.

FIG. 13B is a plan view of the structure after this process has been completed. The cross section in FIG. 11B corresponds to a cross section taken along line X1—X1 in FIG. 13B.

Figure 12B:
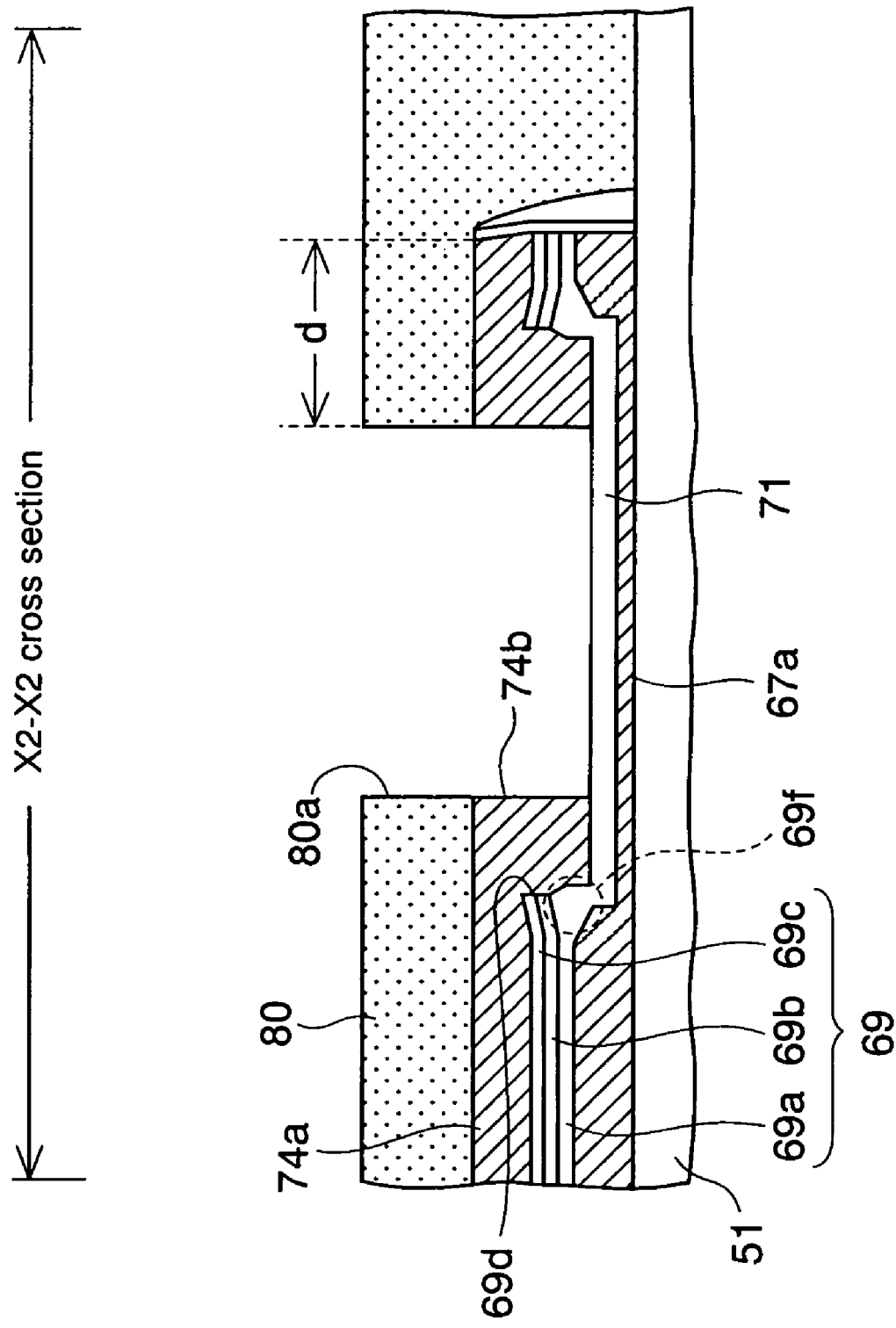
FIG. 12B is a cross-sectional view taken along line X2—X2 in FIG. 13B before a third resist pattern is removed.

FIG. 12B is a cross-sectional view taken along line X2—X2 in FIG. 13B before the third resist pattern 80 has been removed.

As described above, in this embodiment, the second window 80*a* of the third resist pattern 80 is formed smaller than the first opening 69*d* so that the second window 80*a* is encompassed in the first opening 69*d*. Therefore, as is shown in FIG. 12B, when the second conductor 74*a* is etched to form the second opening 74*b*, the thick portion 69*f* of the first thermal oxide films 69*a* are not included in the etching region inside the second windows 80*a*. As a result, the first gate electrodes 67*a* located under the thick portion 69*f* is not etched. Therefore, unlike the case where the thick portion 69*f* is located in the etching region, the etching residue caused by etching the first gate electrode 67*a* does not generate under the thick portion 69*f*, and the occurrence of a device failure or a reduction in the yield due to the etching residue can be prevented.

Following this, as is shown in FIG. 11C, an n-type impurity, such as As or P, is implanted in the silicon substrate 50 using the second to eleventh gate electrodes 74*e* to 74*n* as masks, and third to seventh n-type source/drain extensions 78*c* to 78*g*, shown in FIG. 1C, are formed. Likewise, a p-type impurity, such as BF$_2$, is implanted in the silicon substrate 50, and first to fifth p-type source/drain extensions 78*h* to 78*l*, shown in FIG. 11C, are formed. A resist pattern (not shown) is employed to perform separate implantation of the n-type impurity and the p-type impurity, and is removed after the ion implantation has been completed.

Figure 11D:
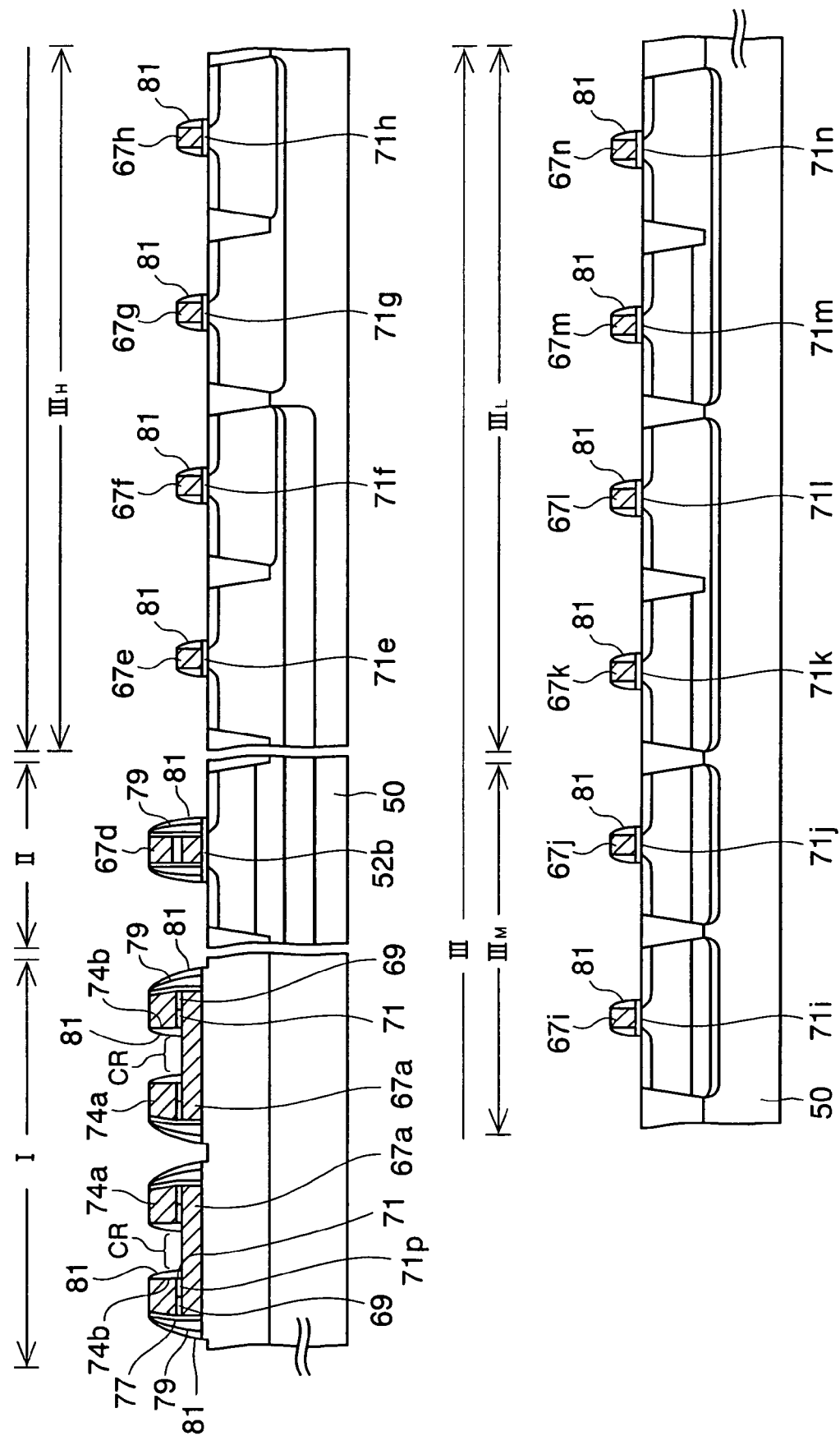
Figure 11E:
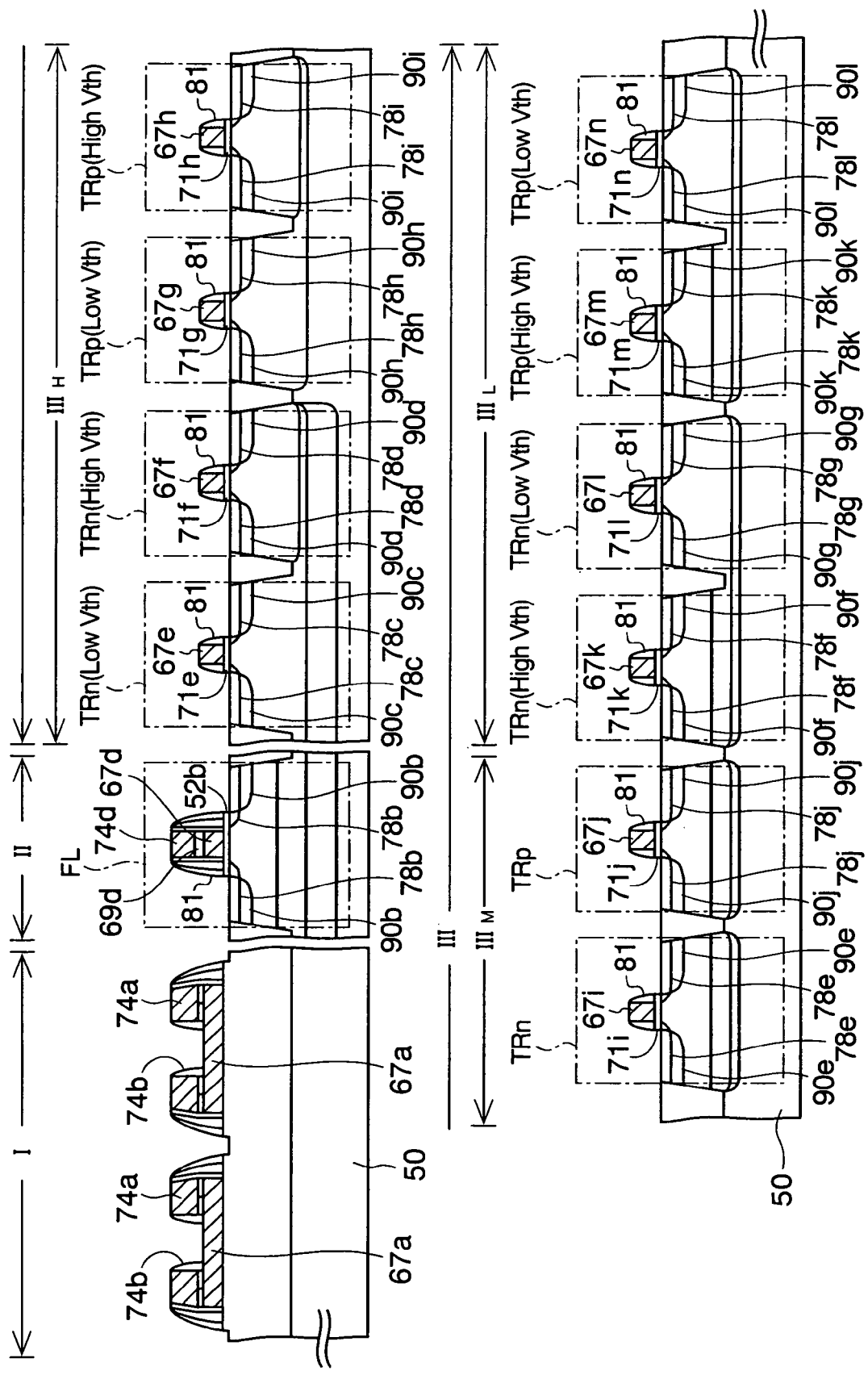

The process performed until the structure shown in cross section in FIG. 11D is obtained will now be explained.

First, a silicon oxide film of about 100 nm thick is formed on the entire surface using the CVD method, and is etched back to form second insulating side walls 81 along first insulating side walls 79 and the side surfaces of second to eleventh gate electrodes 74*d* to 74*m*. The second insulating side walls are also formed along the side surfaces of the second openings 74*b* in the second conductors 74*a*.

As the etch back process is performed continuously, the third insulating films 71 composed of silicon oxide which is beneath the second openings 74*b* are removed to form third openings 71*p*, and contact regions CR on the first gate electrodes 67*a* are exposed to the third openings 71*p*.

Also during the etch back process, a first insulating film 52 is patterned by using the second insulating side walls 81 as masks, and the first insulating film 52 portions remains under floating gates 67*d* as tunnel insulating films 52*b*.

Furthermore, in the second peripheral circuit region III, the third insulating film 71 is patterned by using the second to eleventh gate electrodes 74*e* to 74*n* as masks, and the portions of the insulating film remain as gate insulating films 71*e* to 71*n*.

Figure 12C:
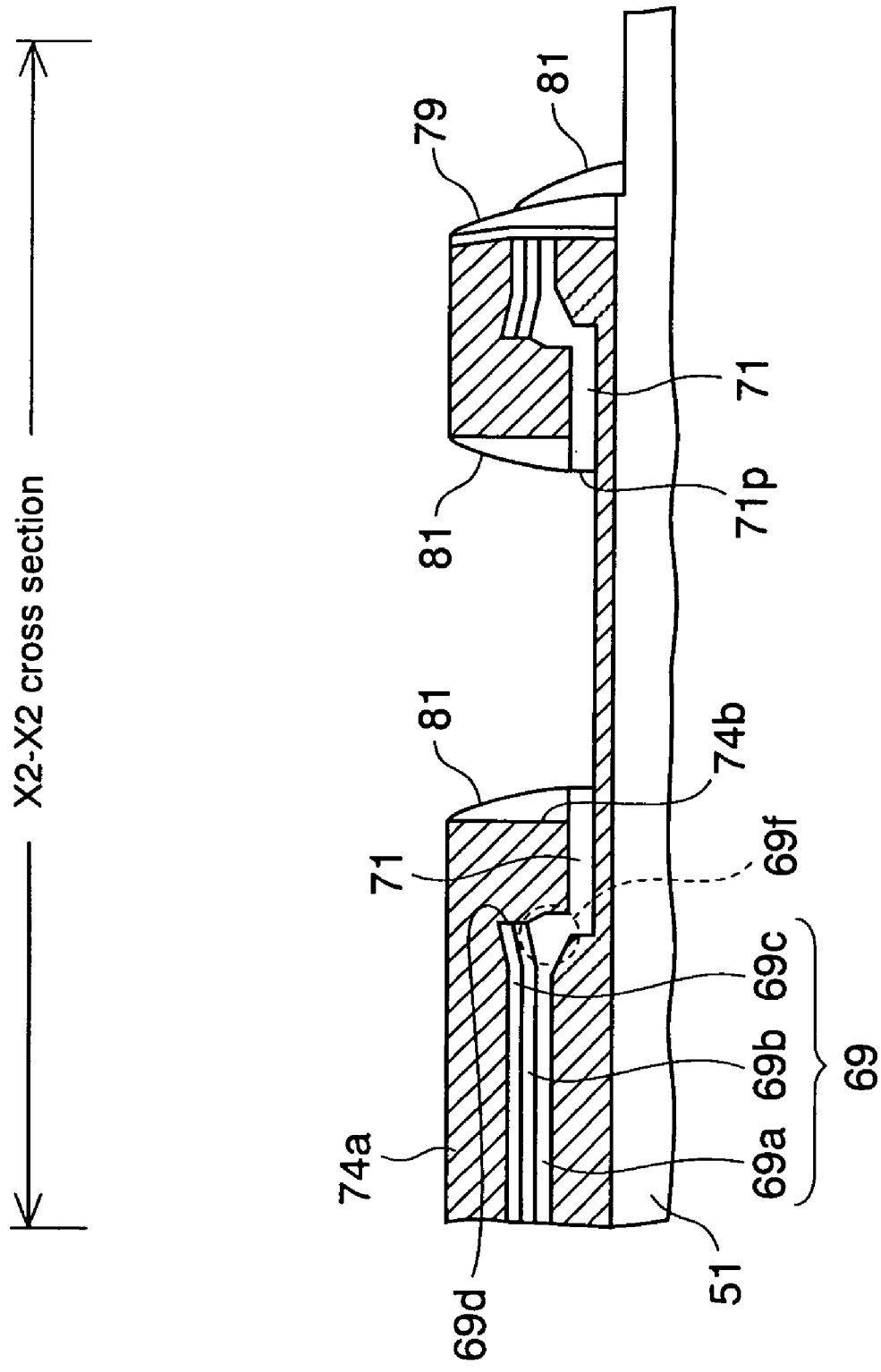
FIG. 12C is a cross-sectional view taken along line X2—X2 in FIG. 13B after a second insulating side wall is formed.

FIG. 12C is a cross-sectional view taken along line X2—X2 in FIG. 13B after the second insulating side walls 81 have been formed in this manner.

Next, as is shown in FIG. 1E, the same method as is used for the process in FIG. 6R in the first embodiment is employed to form third to seventh n-type source/drain regions 90*c* to 90*g* and first to fifth p-type source/drain regions 90*h* to 90*l*. As a result, n-type MOS transistors TR$_n$ (Low Vth) and TR$_n$ (High Vth) and p-type MOS transistors TR$_p$ (Low Vth) and TR$_p$ (High Vth) are obtained.

Figure 11F:
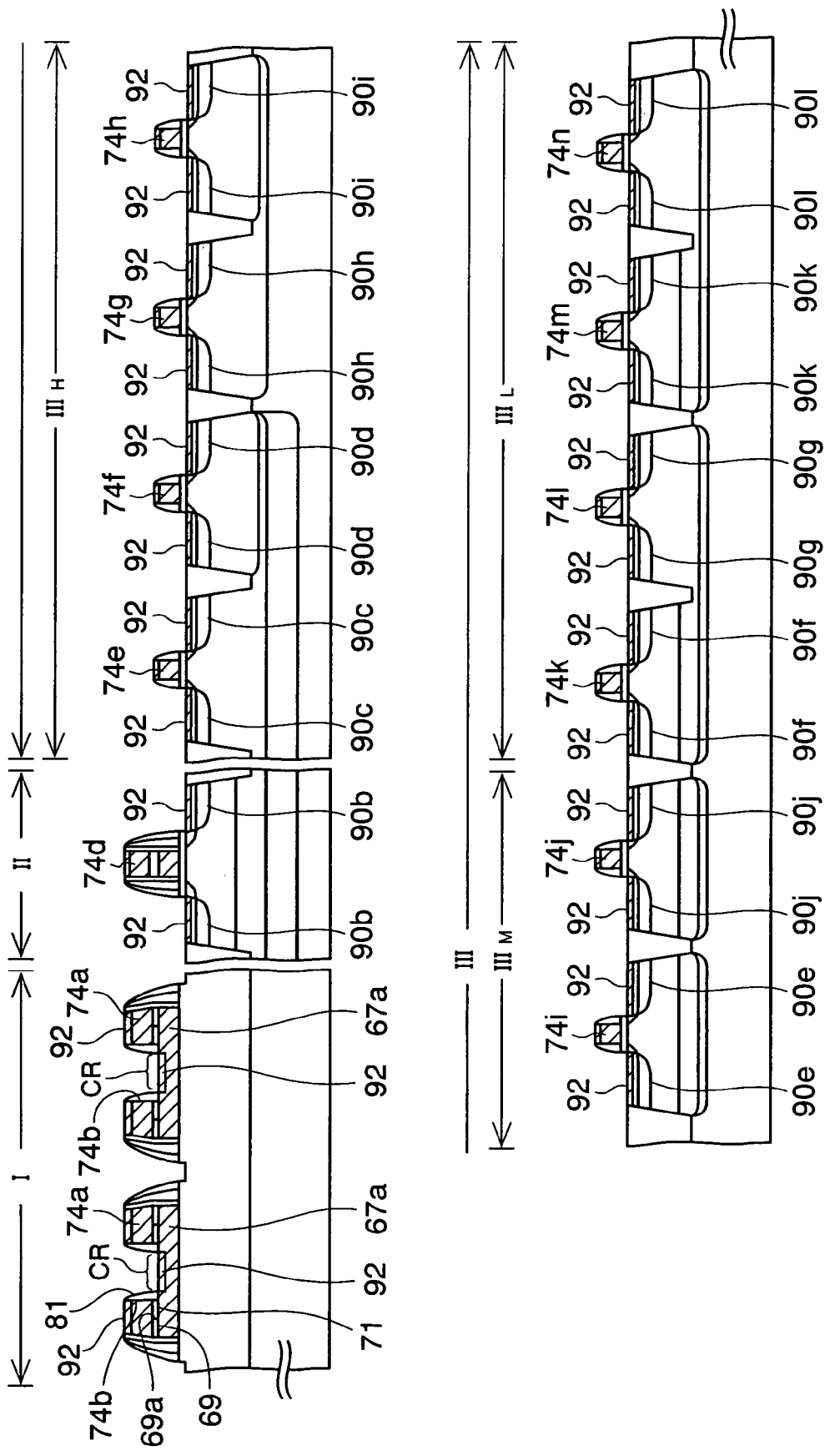

Following this, as is shown in FIG. 11F, a cobalt silicide layer 92 is formed on the surface layer of the silicon substrate 50 in the same manner as in the process shown in FIG. 6S for the first embodiment. The cobalt silicide layer 92 also covers the upper surfaces of the first conductors 74*a* in the first peripheral circuit region I and the contact regions CR of the first gate electrodes 67*a*. The cobalt silicide layer 92 is also formed on the surface layers of the second to eleventh gate electrodes 74*e* to 74*n*, and thus these electrodes are made into the salicide structure. It should be noted that, as in the first embodiment, a nickel silicide layer may be formed instead of the cobalt silicide layer 92.

Figure 12D:
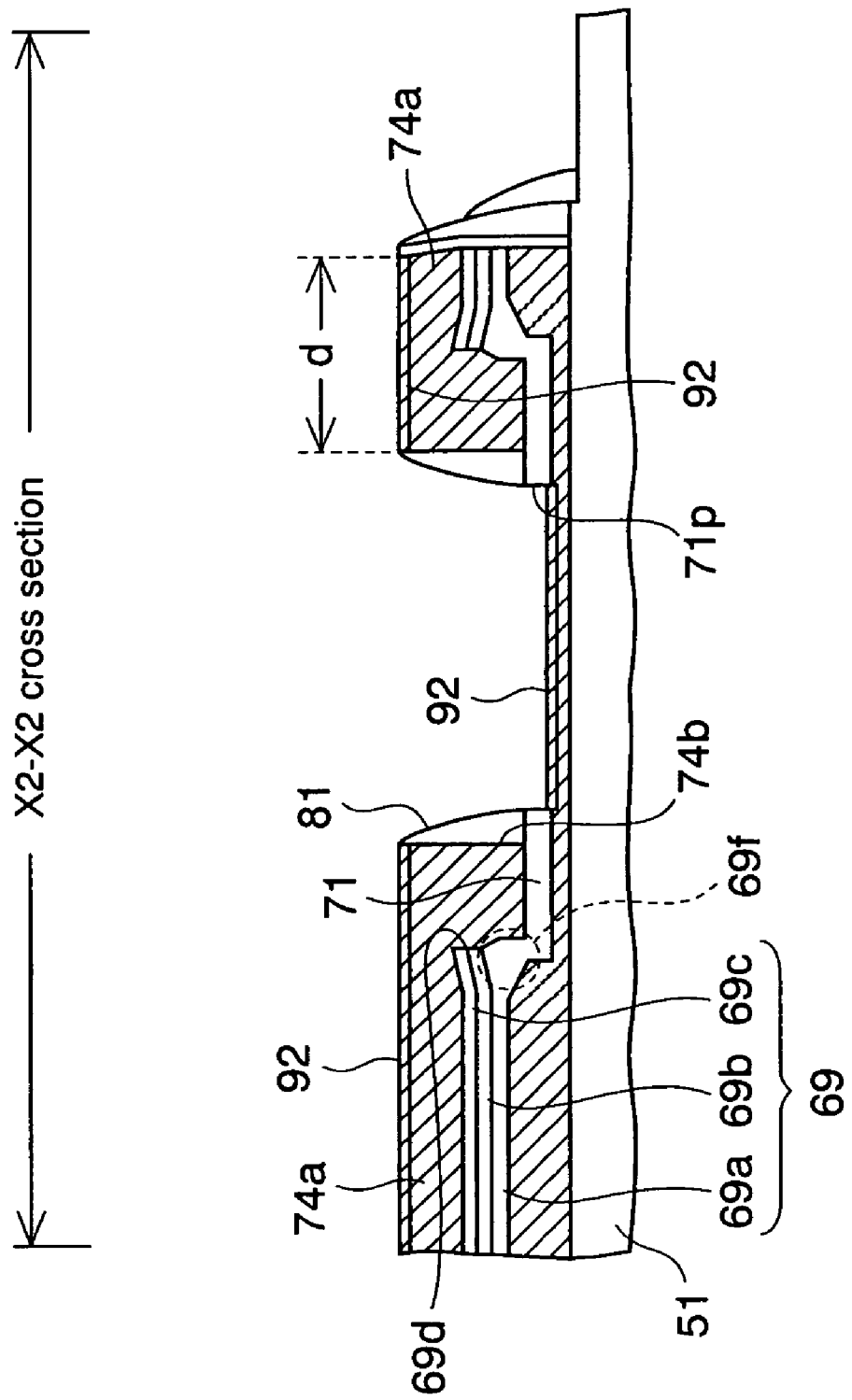
FIG. 12D is a cross-sectional view taken along line X2—X2 in FIG. 13B after a cobalt silicide layer is formed.

FIG. 12D is a cross-sectional view taken along line X2—X2 in FIG. 13B after the cobalt silicide layer 92 has been formed in this manner.

In this embodiment, as explained in FIG. 12B, the second windows 80a are included in the first openings 69d. Therefore, even when outer side surface 74f of the second conductor 74a is inclined like taper-shape, the second opening 74b can be formed at sufficiently large distance d from the side surface 74f, and hence the area of the upper surface of the second conductor 74a is ensured large enough. Thus, the cobalt silicide layer 92 is formed widely on the upper surfaces of the second conductors 74a, and the cobalt silicide layer 92 is not stripped from the second conductors 74a during a wet process, such as wet cleaning. As a result, a device failure due to the stripping of the cobalt silicide layer 92 can be prevented and the yield for the manufacturing process can be improved, and furthermore, the reliability of the logic embedded nonvolatile memory can be increased.

Figure 11G:
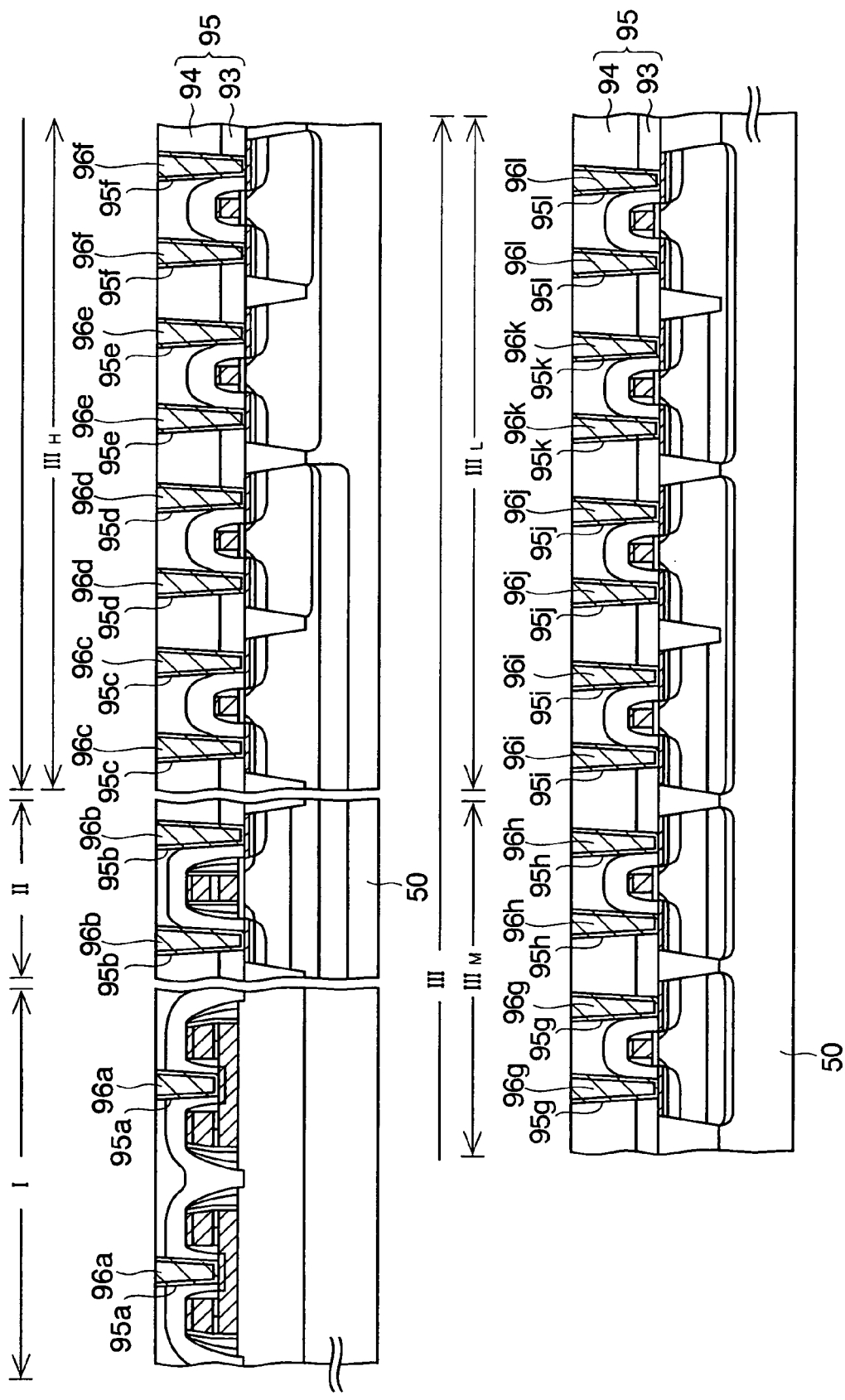

Thereafter, as is shown in FIG. 11G, using the same method as is used for the process in FIG. 6T for the first embodiment, a first inter-layer insulating film 95 which can be formed of an etching stopper film 93 and a fourth insulating film 94 is formed. Then, second to twelfth holes 95b to 95l are formed in the first inter-layer insulating film 95, and first to twelfth conductive plugs 96a to 96l are embedded in these holes.

FIG. 13C is a plan view of the structure after this process has been completed. The cross section in FIG. 11G corresponds to a cross section taken along line Y1—Y1 in FIG. 13C.

Figure 12E:
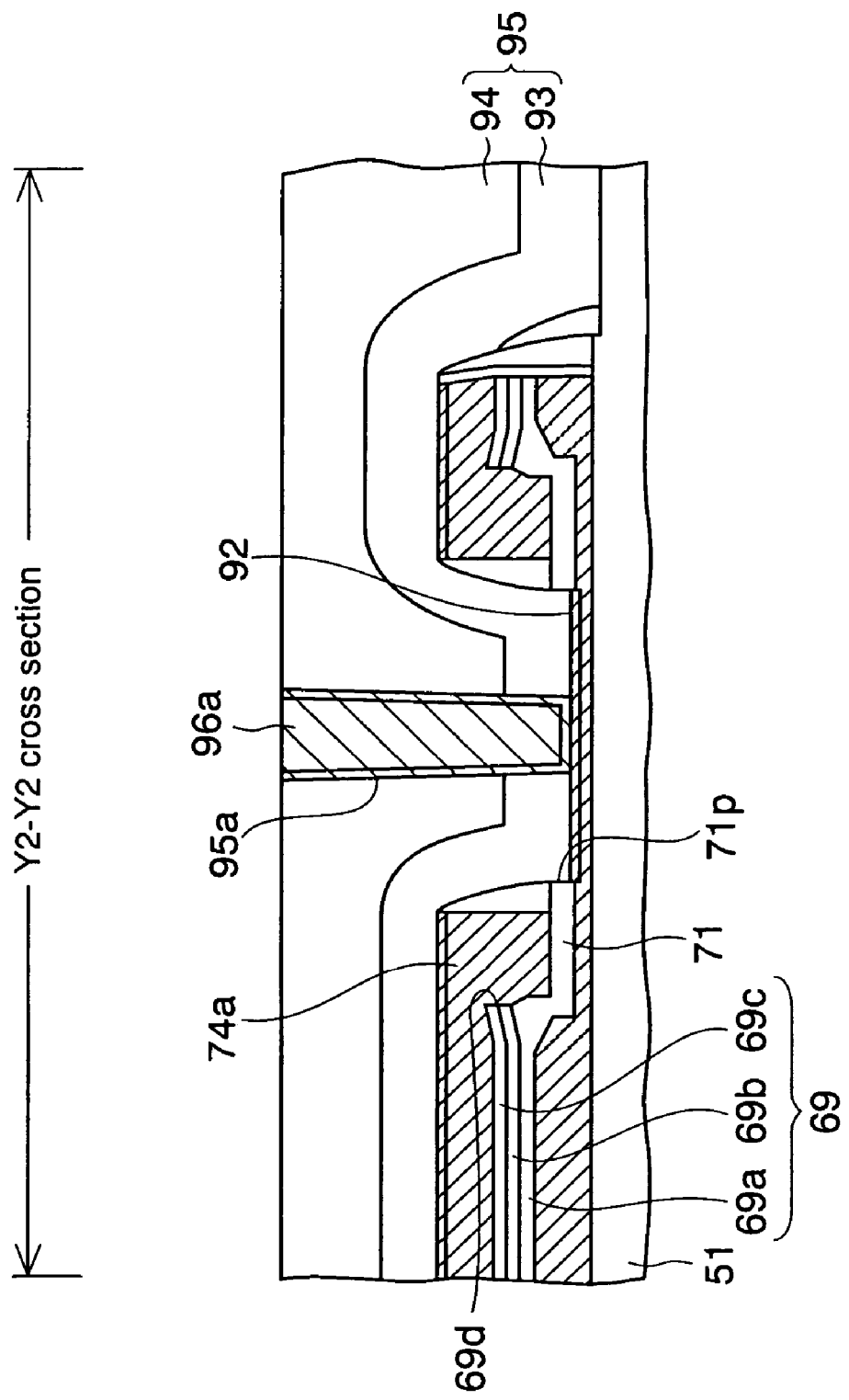
FIG. 12E is a cross-sectional view taken along line Y2—Y2 in FIG. 13C.

FIG. 12E is a cross-sectional view taken along line Y2—Y2 in FIG. 13C.

The process is shifted to the process for forming a second inter-layer insulating film and copper wires; however, this process is the same as in the first embodiment, and no further explanation for it will be given.

Through the above described processes, the basic structure of the semiconductor device according to this embodiment has been completed. In the semiconductor device in this embodiment, unlike in the first embodiment, the second conductors 74a are present on the first conductors 67a in the first peripheral circuit region I. However, since the second conductors 74a are enclosed by an insulating member, they are floating electrically.

According to the second embodiment described above, as explained while referring to FIG. 12B, the second window 80a of the third resist pattern 80 is formed to the size to be encompassed in the first opening 69d. Therefore, when the second opening 74b is formed by etching the second conductor 74a, the thick portion 69f of the first thermal oxide film 69a is left outside the etching region, and etching residue of the first gate electrodes 67a is not left under the thick portions 69f.

Furthermore, since the second window 80a is made to be enclosed in the first opening 69d, distance d between the edge of the second opening 74b and the outside surface of the second conductor 74a is ensured to be sufficiently large, as shown in FIG. 12D. Accordingly, the cobalt silicide layer 92 can be broadly formed on the upper surface of the second conductor 74a, which make it difficult for the cobalt silicide layer 92 to be stripped from the second conductor 74a when wet process such as wet cleaning.

According to these features, a device failure, such as a short circuit due to the etching residue of the first gate electrode 67a and stripped pieces of the cobalt silicide layer 92, can be prevented in the present embodiment. Therefore, the reliability of the logic embedded nonvolatile memory can be increased, while improving the yield of the semiconductor device manufacturing process.

According to the present invention, the first resist portions of the second resist pattern that are formed are sized so they are large enough to cover the first openings of the second insulating film. Therefore, when the first conductors are to be formed through etching, using the first resist portions as masks, the etching residue of the first conductive film is not present under the thick portions of the second insulating film. As a result, a highly reliable semiconductor device can be manufactured, wherein device failures seldom occur.

Furthermore, the second windows of the third resist pattern that are formed are sized so they are large enough to be enclosed in the first openings, and the second openings are formed in the second conductors under the second windows. Therefore, the distance from the outer walls of the second conductors to the second openings is increased, and it is difficult for the silicide layer to be stripped from the upper surfaces of the second conductors. As a result, device failures due to the stripping of the silicide layer can be prevented.

What is claimed is:

1. A method of manufacturing a semiconductor device comprising the steps of:

forming a first insulating film on first and second regions of a semiconductor substrate;

forming a first conductive film on the first insulating film;

forming a second insulating film on the first conductive film;

forming on the second insulating film a first resist pattern having a first window in a contact region on the first conductive film of the first region;

forming a first opening, through which the contact region exposes, in the second insulating film under the first window, by etching the second insulating film while using the first resist pattern as a mask;

removing the first resist pattern;

forming a third insulating film on the first conductive film exposed from the first opening;

forming a second conductive film on the second and third insulating films;

forming a second resist pattern having a first resist portion in the first region and a second resist portion in the second region, the first resist portion having a size to cover the first opening;

etching the first and second conductive films and the second insulating film while using the second resist pattern as a mask, thus making the first and second conductive film under the first resist portion into a first and second conductor respectively, making the first and second conductive film under the second resist portion into a floating gate and a control gate respectively, and making the second insulating film into an intermediate insulating film;

removing the second resist pattern;

forming a third resist pattern in the first and second regions, where the third resist pattern having, in the first region, a second window that has a size to encompass the contact region of the first conductor;

selectively removing the second conductor under the second window by etching the second conductor while using the third resist pattern as a mask;

removing the third resist pattern;

exposing the contact region by removing the third insulating film on the contact region of the first conductor;

forming an inter-layer insulating film to cover the first conductor;

forming a hole in the inter-layer insulating film on the contact region of the first conductor; and forming a conductive plug in the hole, the conductive plug being electrically connected to the contact region of the first conductor.

2. The method according to claim 1, wherein an ONO film is employed as the second insulating film; and in the step of forming the third insulating film, an oxide film is formed by thermally oxidizing a surface of the first conductive film exposed through the first opening, and the oxide film is used as the third insulating film.

3. The method according to claim 2, wherein a polysilicon film is employed as the first conductive film.

4. The method according to claim 1, wherein the first conductor is made into a first gate electrode in the step of forming the first and second conductors.

5. The method according to claim 4, further comprising the step of:

forming a device isolation insulating film in the first region of the semiconductor substrate, wherein, in the step of forming the first and second conductors, the first gate electrode is constructed from a gate and a pad, where the pad being extended on the device isolation insulating film.

6. The method according to claim 5, wherein, in the step of forming the third resist pattern, the second window is formed in a size to encompass the pad, and in the step of selectively removing the second conductor under the second window, all of the second conductor is removed on the pad.

7. The method according to claim 1, wherein, in the step of forming the first insulating film, the first insulating film is also formed in a third region of the semiconductor substrate;

in the step of forming the second insulating film, the second insulating film is also formed on the first insulating film in the third region;

in the step of forming the first opening in the second insulating film, the first and second insulating films are removed from the third region;

in the step of forming the third insulating film, the third insulating film is also formed in the third region of the semiconductor substrate;

in the step of forming the third resist pattern, a third resist portion of the third resist pattern is formed on the third region; and in the step of etching the second conductor by using the third resist pattern as a mask, the second conductive film under the third resist portion is made into a first gate electrode.

8. The method according to claim 7, wherein an ONO film is employed as the second insulating film; and in the step of forming the third insulating film, an oxide film is formed by thermally oxidizing each surface of the semiconductor substrate in the third region and the first conductive film, and the oxide film is used as the third insulating film.

9. The method according to claim 1, wherein, in the step of forming the third resist pattern, the second window is formed in a size to be encompassed in the first opening; and in the step of selectively removing the second conductor under the second window, a second opening is formed in the second conductor under the second window.

10. The method according to claim 9, further comprising the step of:

forming a silicide layer on an upper surface of the second conductor.

11. The method according to claim 10, wherein, in the step of forming the silicide layer, the silicide layer is also formed on an upper surface of the first gate electrode and on a surface layer of the semiconductor substrate beside the first gate electrode.

12. The method according to claim 10, wherein a cobalt silicide layer or a nickel silicide layer is formed as the silicide layer.

* * * * *